United States Patent
Ooki

(10) Patent No.: US 7,846,799 B2
(45) Date of Patent: Dec. 7, 2010

(54) POWER SEMICONDUCTOR DEVICE AND MANUFACTURING METHOD THEREFOR

(75) Inventor: Hirofumi Ooki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/826,457

(22) Filed: Jun. 29, 2010

(65) Prior Publication Data

US 2010/0267209 A1    Oct. 21, 2010

Related U.S. Application Data

(62) Division of application No. 11/770,282, filed on Jun. 28, 2007.

(30) Foreign Application Priority Data

Aug. 29, 2006    (JP) .............................. 2006-232130

(51) Int. Cl.
    *H01L 21/336*    (2006.01)
(52) U.S. Cl. ............... 438/270; 438/272; 257/E21.629; 257/E21.643
(58) Field of Classification Search .................. 438/206, 438/212, 270, 272; 257/E21.629, E21.643
    See application file for complete search history.

(56) References Cited

U.S. PATENT DOCUMENTS

| 6,117,734 | A | 9/2000 | Nakamura |
|---|---|---|---|
| 6,521,538 | B2 | 2/2003 | Soga et al. |
| 7,485,911 | B2 | 2/2009 | Kim et al. |
| 2006/0113590 | A1 | 6/2006 | Kim et al. |
| 2007/0228455 | A1 | 10/2007 | Sasago et al. |
| 2008/0012067 | A1 | 1/2008 | Wu |
| 2008/0128799 | A1 | 6/2008 | Park et al. |

FOREIGN PATENT DOCUMENTS

| JP | 9-92828 | 4/1997 |
|---|---|---|
| JP | 2005-210047 | 8/2005 |
| WO | WO 2005/062385 A1 | 7/2005 |

OTHER PUBLICATIONS

"Transistor Technology Special", CQ Publishing Co., Ltd., Jan. 1, 2004, No. 85, pp. 43-48, With English Abstract.

*Primary Examiner*—Lex Malsawma
(74) *Attorney, Agent, or Firm*—Oblon, Spivak, McClelland, Maier & Neustadt, L.L.P.

(57) ABSTRACT

A manufacturing method is provided for a power semiconductor device that enables reducing its on-state voltage and power loss. The semiconductor device includes a set of L-shaped trench gates 3 each formed, from the top-side surface of a p base layer 2, perpendicularly with respect to a first main surface of an $n^-$ layer 1, to reach into a location of the $n^-$ layer 1. At the lower ends of each of the trench gates 3, bottom portions 3*d* are provided to unilaterally extend a predetermined length in one direction parallel to the first main surface of the $n^-$ layer 1. In addition, the extending end of one of the bottom portions 3*d* opposes that of the other bottom portion, on the extending side of the bottom portions 3*d*, and the interspace between each pair of adjacent bottom portions 3*d* is set narrower than any other interspace between the trench-gate parts that are perpendicularly formed with respect to the first main surface of the $n^-$ layer 1.

1 Claim, 73 Drawing Sheets

POWER SEMICONDUCTOR DEVICE AND MANUFACTURING METHOD THEREFOR

CROSS REFERENCE TO RELATED APPLICATIONS

This application is a divisional application of U.S. Ser. No. 11/770,282, filed Jun. 28, 2007, the entire contents of which is incorporated herein by reference. U.S. Ser. No. 11/770,282 claims the benefit of priority under 35 U.S.C. §119 from Japanese application 2006-232130 filed Aug. 29, 2006.

BACKGROUND OF THE INVENTION

1. Field of the Invention

The present invention relates to power semiconductor devices and methods of manufacturing the same, in particular, to a power semiconductor device having a metal-oxide semiconductor gate or "MOS-gate" structure, and a manufacturing method therefor.

2. Description of the Related Art

In recent years, as power semiconductor devices used for electric-power conversion and controls by inverters or the like, insulated gate bipolar transistors (IGBTs) are utilized that enable fast (high-speed) operations and high withstand (blocking) voltage. And then, among these IGBTs, recently, in place of an IGBT of a planar type (planar IGBT), an IGBT of a trench-gate type that has high electron-supplying capacity is widely utilized.

A typical structure for an IGBT of a trench-gate type, such as the trench-gate IGBT (TIGBT) described above, is shown, for example, in Non-Patent Publication "Transistor Technology SPECIAL," No. 85, Jan. 1, 2004, p. 45 (FIGS. 3-11), CQ Publishing Co., Ltd., Tokyo, Japan.

A vertically cross-sectional view outlining a structure of the trench-gate IGBT is shown in FIG. 73. As shown in FIG. 73, in the trench-gate IGBT, an $n^+$ buffer layer 102 is provided upon a first main surface (namely, the top-side surface in the figure) of a $p^+$ substrate 101; an $n^-$ layer 103 is provided upon the $n^+$ buffer layer 102; a p base layer 104 is provided upon the $n^-$ layer 103; and $n^+$ emitter regions 105 are provided in the top side of the p base layer 104.

And then, trench gates 106 are provided; each having a trench 106a that adjoins to the $n^+$ emitter regions 105, passes through the p base layer 104 and reaches into the $n^-$ layer 103; a gate insulation film 106b is provided to cover the inner surface of the trench 106a; and an gate electrode 106c is provided with which the space inside surrounded by the gate insulation film 106b is filled.

Moreover, interlayer insulation films 107 are provided to cover a large part of each top-side of the $n^+$ emitter regions 105, and each top side of the trench gates 106; in addition, an emitter electrode 108 is provided to cover the remaining part of the top-side surface of the $+n^+$ emitter regions 105 (not covered by the interlayer insulation films 107), the entire surface of the interlayer insulation films 107, and the remaining top side of the p base layer 104. Furthermore, a collector electrode 109 is provided on a second main surface (namely, the bottom-side surface in the figure) of the $p^+$ substrate 101.

Problems to be Solved by the Invention

As described above, an IGBT as a power semiconductor device has increased its performance, owing to the transfer from a planar IGBT to a trench-gate IGBT, by reducing an on-state voltage and a power loss that are IGBT's essential characteristics. However, according to enhanced performance in recent years of motor vehicles, electric trains, and various types of industrial apparatus, for the sake of those IGBTs utilized for these applications, further improvements are demanded on the on-state voltage and the power loss (lower on-state voltages with reduced power losses).

The present invention has been directed at solving these problems described above, and an object of the invention is to provide, in order to reduce an on-state voltage and a power loss that are IGBT's essential characteristics, a power semiconductor device with an IGBT structure that enables enhancing IGBT's electron-supplying capacity in comparison to conventional one, and a method of manufacturing the semiconductor device.

SUMMARY OF THE INVENTION

Means for Solving the Problems

In one aspect of the present invention, a power semiconductor device comprises: a first semiconductor layer of a first conductivity type, having a first main surface and a second main surface; a second semiconductor layer of a second conductivity type, provided upon the first semiconductor layer of the first conductivity type; a set of trench gates each having a trench provided extending from the top side of the second semiconductor layer of the second conductivity type, with the trench bottom portion reaching into the first semiconductor layer of the first conductivity type, a gate insulation film provided lining the inner surface of the trench, and a gate electrode filling the gate-insulation-film-lined trench; a set of first semiconductor regions, of the first conductivity type, each selectively provided in the top side of the second semiconductor layer of the second conductivity type and contiguously bordering on the trench gates; a first main electrode provided upon the second semiconductor layer of the second conductivity type, and electrically connected to the first semiconductor regions of the first conductivity type; a third semiconductor layer of the second conductivity type provided on the second main surface; and a second main electrode provided on the third semiconductor layer of the second conductivity type; furthermore, the trench gates are provided in such a way that interspaces, located in the first-conductivity-type first semiconductor layer, between respective bottom portions of predetermined adjacent trench gates are narrower than any other bottom-portion interspace.

EFFECTS OF THE INVENTION

According to the present invention, because the semiconductor device is constituted by the trench gates provided with the interspace between a predetermined set of adjacent bottom portions of the trench gates, located in the first semiconductor layer of the first conductivity type, being defined to be narrower than any other interspace, positive holes accumulate in the interspace between the adjacent bottom portions and in their proximity. Because of the positive holes having been accumulated, the amount of supplied electrons correspondingly increases, so that the impedance in-between and near the bottom portions decreases; thus, it is possible to obtain an effect of providing a semiconductor device that can always possess an ability to reduce an on-state voltage and a power loss of the semiconductor device.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

The IGBT structure of the present invention, implemented in order to reduce an on-state voltage and a power loss that are essential characteristics of IGBT's as the power semiconductor device described above, features in common that, in comparison to an interspace between a set or a pair of adjacent trench gates, the bottom-portion interspace between the trench gates is defined to be narrower than that between any other portions thereof. Hereunder, preferred embodiments according to the present invention will be described in detail with reference to the accompanying drawings.

Embodiment 1

Figure 1:
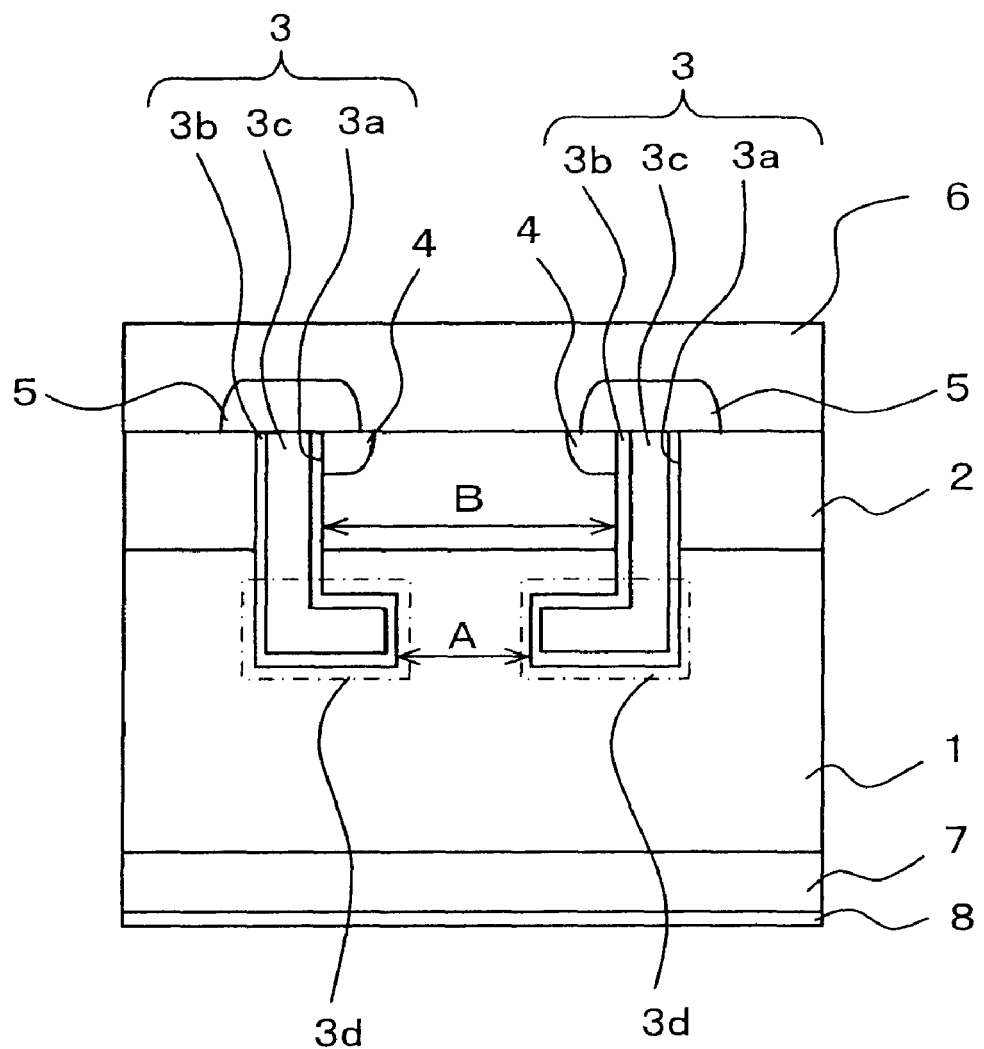
FIG. 1 is a vertically cross-sectional view outlining a structure of a trench-gate IGBT that is a power semiconductor device in Embodiment 1 of the present invention.

Hereafter, Embodiment 1 of the present invention will be explained based on the drawings. FIG. 1 is a vertically cross-sectional view outlining a structure of a trench-gate IGBT that is a power semiconductor device in Embodiment 1 of the present invention. In FIG. 1, a p base layer 2 that is a second semiconductor layer of a second conductivity type is provided upon a first main surface (namely, the "top-side" surface in the figure) of an $n^-$ layer 1 that is a first semiconductor layer of a first conductivity type.

And then, a set or a pair of L-shaped trench gates 3 are provided, each having trenches 3a that pass from the top side of the p base layer 2 through into the $n^-$ layer 1; gate insulation films 3b that are made of an oxide film and provided to cover the inner surface of the trenches 3a; and in addition, gate electrodes 3c that are provided with which each space inside surrounded by the gate insulation films 3b is filled. Each of the L-shaped trench gates 3 is provided, from the top-side surface of the p base layer 2, perpendicularly with respect to the first main surface of the $n^-$ layer 1, to reach into a location of the $n^-$ layer 1; at the lower ends of each of the trench gates 3, bottom portions 3d are provided to unilaterally extend a predetermined length in one direction parallel to the first main surface of the $n^-$ layer 1. In addition, an arrangement is made so that the extending end of one of the bottom portions 3d of the pair of L-shaped trench gates 3 opposes that of the other bottom portion of the pair of the L-shaped trench gates 3, on the extending side of the bottom portions 3d. Because of the arrangement, the interspace between a pair of predetermined adjacent bottom portions 3d of L-shaped trench gates 3 (the width indicated by the symbol "A" in the figure) is set narrower than any other interspace between the trench-gate parts (sections) that are perpendicularly formed with respect to the first main surface of the n⁻ layer 1 (the width indicated by the symbol "B" in the figure).

In addition, in the top side of the p base layer 2, on each side of the L-shaped trench gates 3 from which bottom portions 3d extend, and contiguously bordering on the each side of the L-shaped trench gates 3, a set or a pair of n⁺ emitter regions 4 that are first semiconductor regions of the first conductivity type are selectively provided. Moreover, interlayer insulation films 5 each are provided to cover a large part of the top side of each of the n⁺ emitter regions 4, each top side of the L-shaped trench gates 3, and a part of the top-side surface of the p base layer 2; in addition, an emitter electrode 6 that is a first main electrode is provided to cover the remaining top-side surface of the n⁺ emitter regions 4, i.e., the parts not covered by the interlayer insulation films 5, the entire surface of the interlayer insulation films 5, and the remaining top-side surface of the p base layer 2.

On the other hand, a p⁺ collector layer 7 that is a third semiconductor layer of the second conductivity type is provided on a second main surface of the n⁻ layer 1 (namely, on the "bottom-side" surface in the figure); in addition, a collector electrode 8 that is a second main electrode is provided on the bottom-side surface of the p⁺ collector layer 7.

Next, a method of manufacturing the trench-gate IGBT shown in FIG. 1 will be explained by referring to FIG. 2 through FIG. 17.

Figure 2:
FIG. 2 is a vertical structure diagram for explaining a method of manufacturing the trench-gate IGBT in Embodiment 1 of the present invention.
Figure 3:
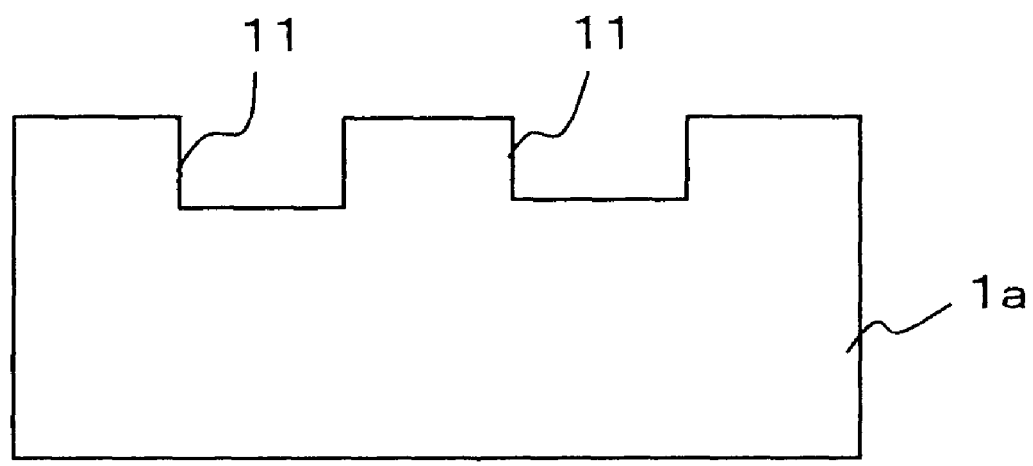
FIG. 3 is a structure diagram for explaining the method of manufacturing the trench-gate IGBT in Embodiment 1 of the present invention.

In the first place, as shown in FIG. 2, after having undergone guard-ring formation for semiconductor-element or unit-cell isolation upon one surface (the "top-side" surface in the figure) of the first n⁻ layer 1a that is to be part of a first semiconductor layer of the first conductivity type and is made of a silicon substrate, as shown in FIG. 3, first trenches 11 are selectively formed in the order of 1000 nm in depth. The first trenches 11 are formed by using dry etching. And then, the first trenches 11 form the bottom portions 3d of the L-shaped trench gates 3, which will constitute each part of the trenches 3a.

Figure 4:
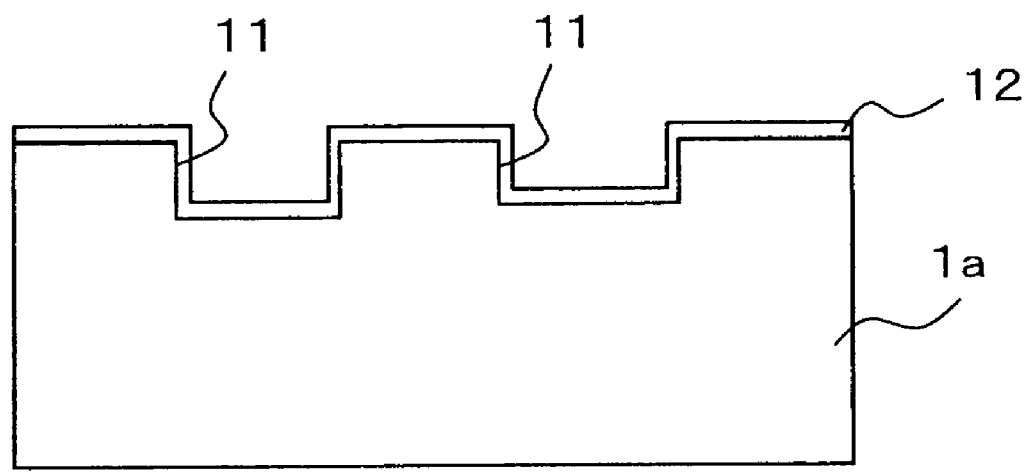
FIG. 4 is a structure diagram for explaining the method of manufacturing the trench-gate IGBT in Embodiment 1 of the present invention.

Next, as shown in FIG. 4, upon the inner surface of the first trenches 11 and one of the surfaces of the first n⁻ layer 1a (hereinafter referred to as "top-side" surface), a first insulation film 12 is formed with and made of an oxide film in the order of 100 nm in thickness. The first insulation film 12 in the figure is formed by using thermal oxidation or chemical vapor deposition (CVD).

Figure 5:
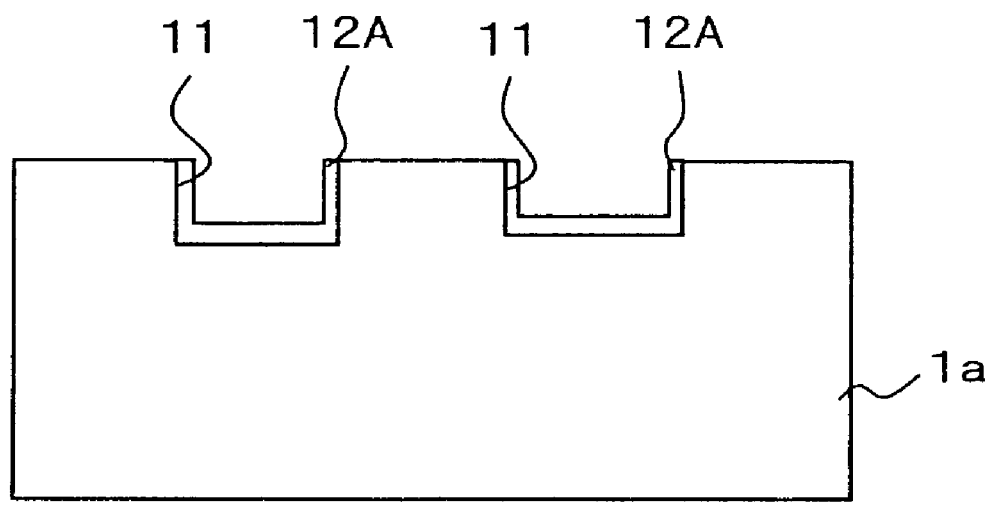
FIG. 5 is a structure diagram for explaining the method of manufacturing the trench-gate IGBT in Embodiment 1 of the present invention.

Next, as shown in FIG. 5, part of the first insulation film 12, having been formed upon the top-side surface of the first n⁻ layer 1a, is removed. Removal of the parts of first insulation film 12 is performed by using dry etching or planarization chemical-mechanical polishing (CMP).

Figure 6:
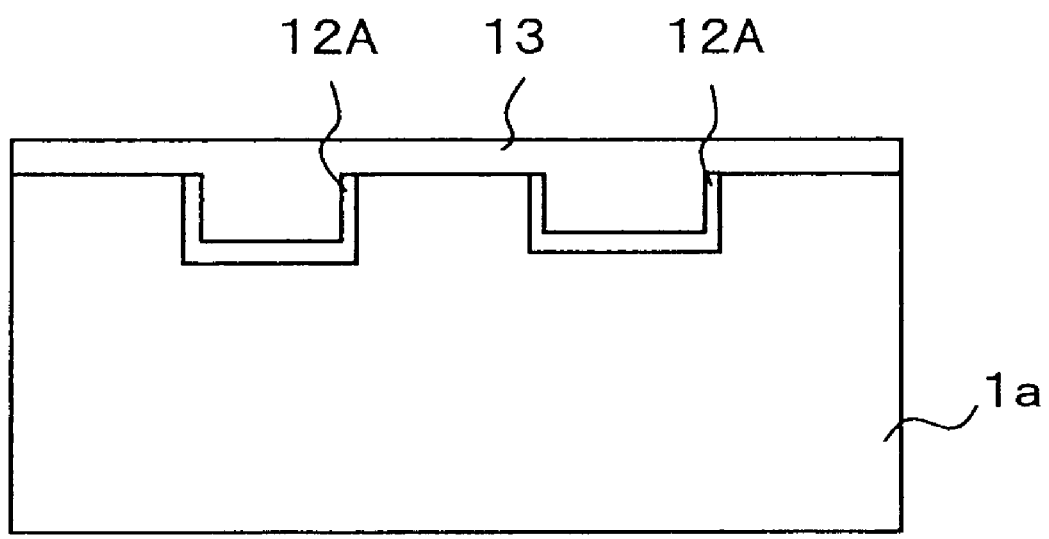
FIG. 6 is a structure diagram for explaining the method of manufacturing the trench-gate IGBT in Embodiment 1 of the present invention.

Next, as shown in FIG. 6, in each space inside surrounded by remaining part of the first insulation films 12A and upon the top-side surface of the first n⁻ layer 1a, a first conductor 13 is formed with and made of a conductive material such as polycrystalline silicon (polysilicon). The first conductor 13 in the figure is formed by using CVD.

Figure 7:
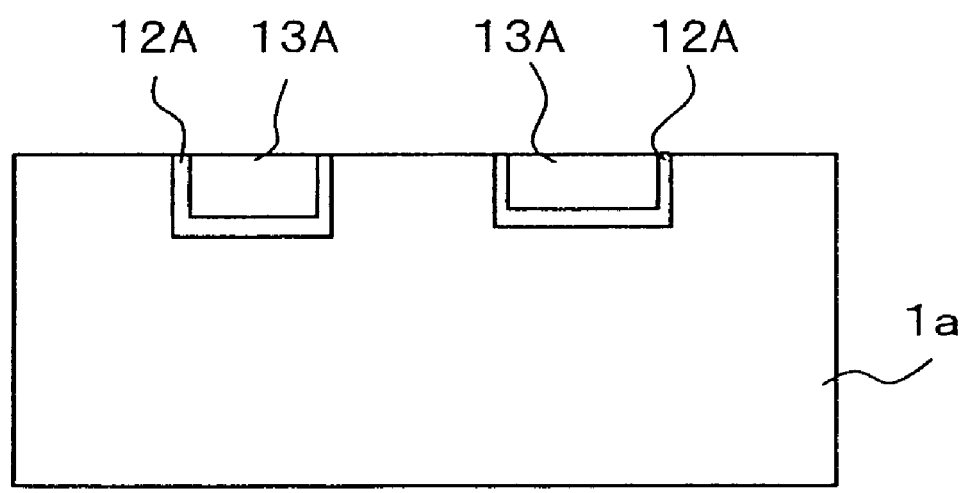
FIG. 7 is a structure diagram for explaining the method of manufacturing the trench-gate IGBT in Embodiment 1 of the present invention.

Next, as shown in FIG. 7, part of the first conductor 13, having been formed upon each space inside surrounded by remaining part of the first insulation films 12A and upon the top-side surface of the first n⁻ layer 1a, is removed. Removal of the part of the first conductor 13 is performed by using dry etching or planarization CMP.

Figure 8:
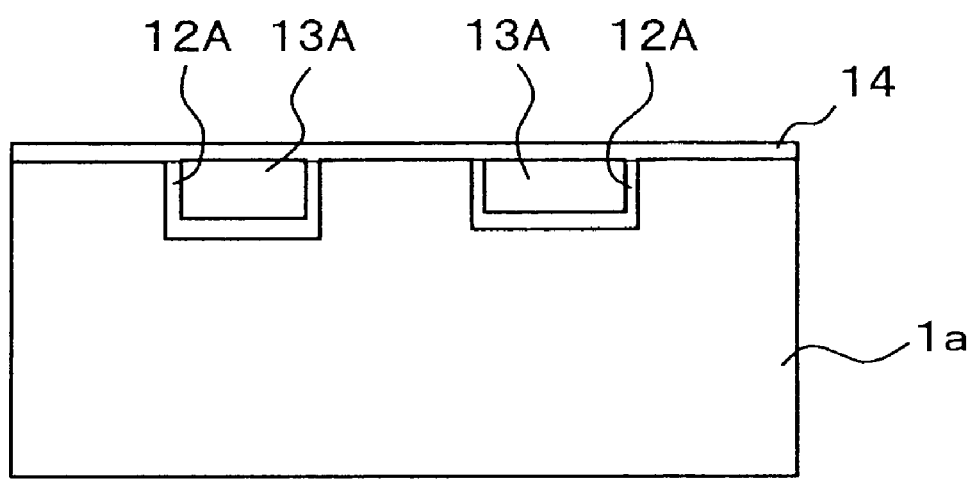
FIG. 8 is a structure diagram for explaining the method of manufacturing the trench-gate IGBT in Embodiment 1 of the present invention.

Next, as shown in FIG. 8, upon the top-side surface of the first n⁻ layer 1a, and upon the remaining parts of the first insulation films 12A and remaining parts of first conductors 13A on this top-side surface, a second insulation film 14 is formed with and made of an oxide film in the order of 100 nm in thickness. The second insulation film 14 in the figure is formed by using thermal oxidation or CVD.

Figure 9:
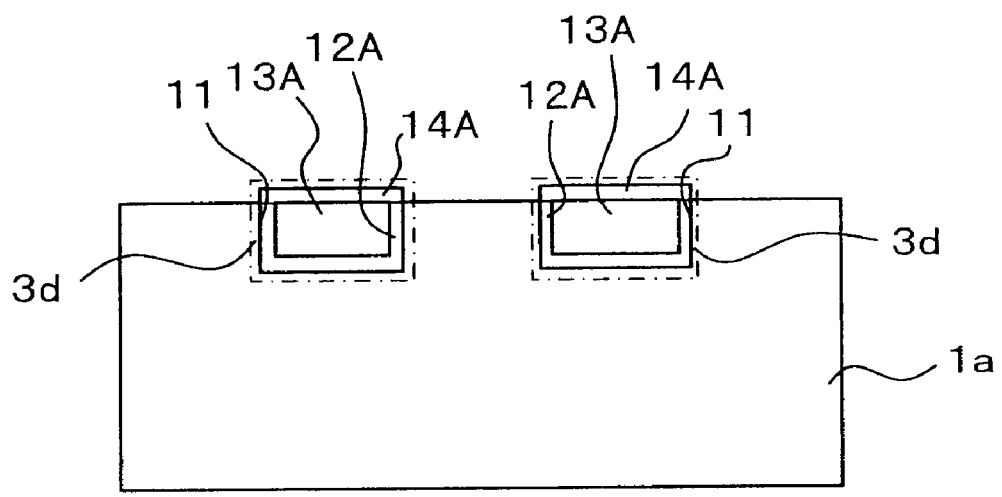
FIG. 9 is a structure diagram for explaining the method of manufacturing the trench-gate IGBT in Embodiment 1 of the present invention.

Next, as shown in FIG. 9, part of the second insulation film 14, having been formed upon the top-side surface of the first n⁻ layer 1a, is selectively removed. Removal of the selected parts of second insulation film 14 is performed by using dry etching or planarization CMP. Note that, each of the bottom portions 3d of the L-shaped trench gates 3 is constructed of each of the first trenches 11, the remaining first conductors 13A, the remaining first insulation films 12A, and the remaining second insulation films 14A.

Figure 10:
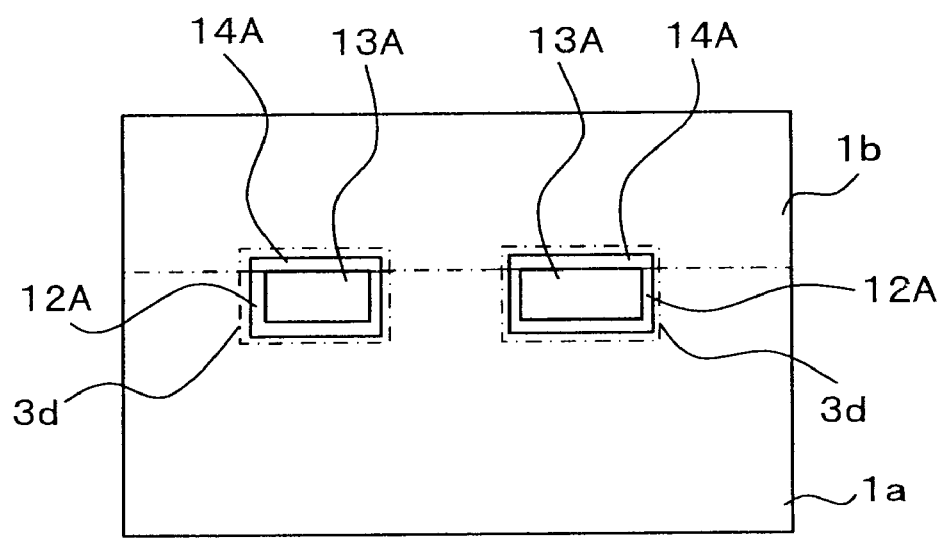
FIG. 10 is a structure diagram for explaining the method of manufacturing the trench-gate IGBT in Embodiment 1 of the present invention.

Next, as shown in FIG. 10, upon the top-side surface of the first n⁻ layer 1a and the remaining second insulation films 14A, a second n⁻ layer 1b that is to be part of the first semiconductor layer of the first conductivity type is formed in the order of 5000 nm in thickness. The second n⁻ layer 1b is an amorphous silicon layer that is formed by CVD, or an epitaxial layer that is formed by an epitaxial growth method. In a case of the amorphous silicon layer, its mono-crystalline layer is obtained by a heat treatment. And then, the n⁻ layer 1 that is the first semiconductor layer of the first conductivity type is constructed by adding the second n⁻ layer 1b to the first n⁻ layer 1a, both having the same impurity concentration. Hereinafter, the n⁻ layer 1 will be taken into consideration for explanatory purposes.

Figure 11:
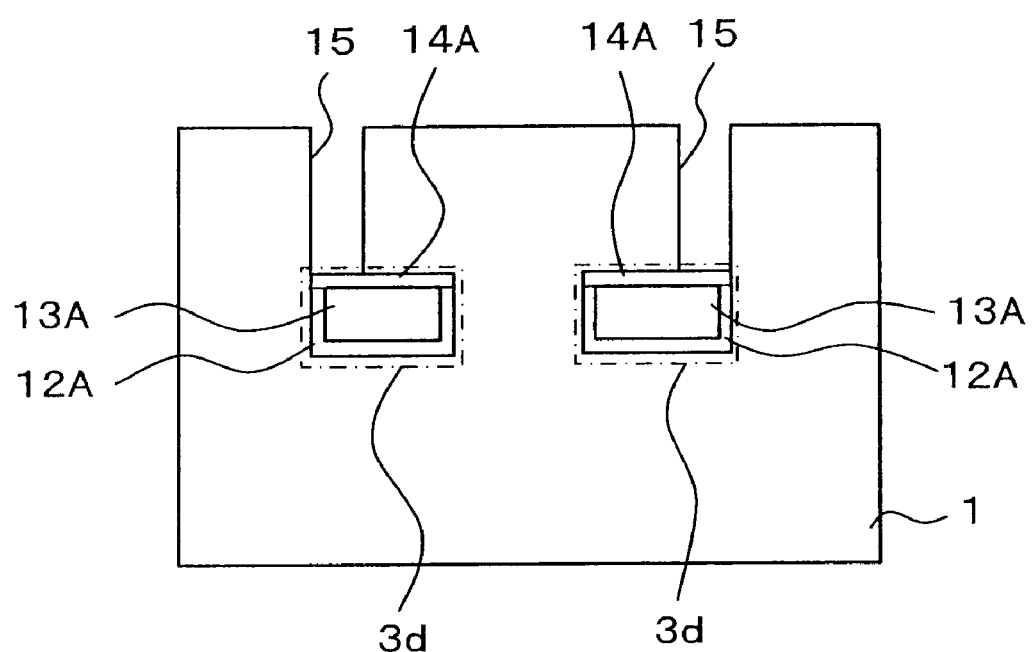
FIG. 11 is a structure diagram for explaining the method of manufacturing the trench-gate IGBT in Embodiment 1 of the present invention.

Next, as shown in FIG. 11, second trenches 15 are formed from the top side of the n⁻ layer 1, perpendicularly with respect to the top-side (or first main) surface of the n⁻ layer 1, to reach each top side of the remaining second insulation films 14A. These second trenches 15 are formed so that each of the outer lateral surfaces of a predetermined adjacent pair of the first trenches 11 is approximately coincident with its corresponding outer lateral surface of the pair of second trenches 15. The second trenches 15 are formed by using dry etching.

Figure 12:
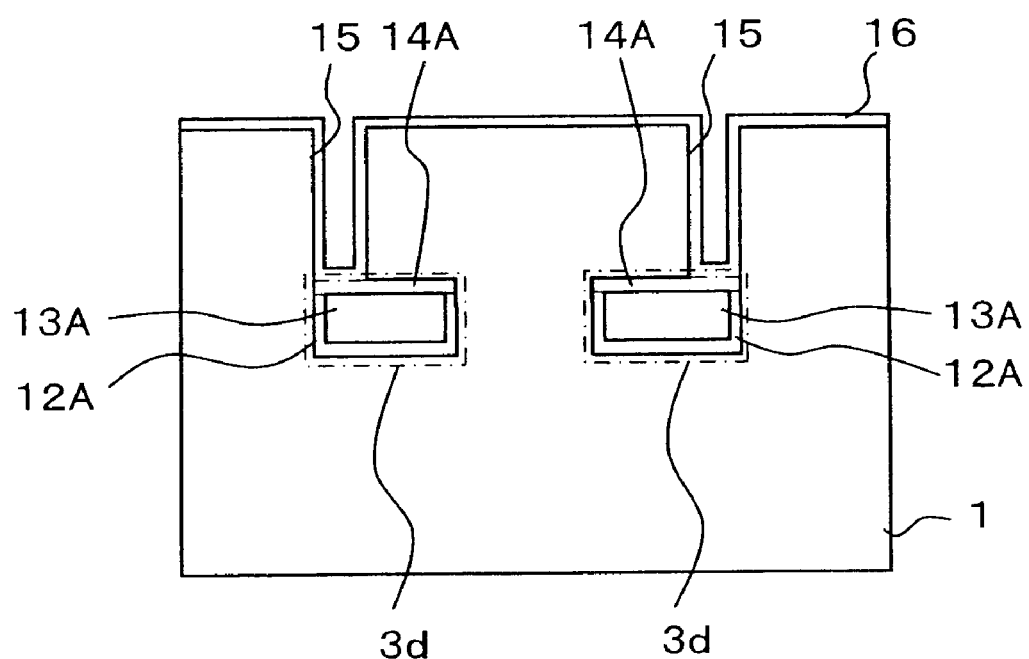
FIG. 12 is a structure diagram for explaining the method of manufacturing the trench-gate IGBT in Embodiment 1 of the present invention.

Next, as shown in FIG. 12, upon each inner surface of the second trenches 15 and the top-side surface of the n⁻ layer 1, a third insulation film 16 is formed of an oxide film in the order of 100 nm in thickness. The third insulation film 16 in the figure is formed by using thermal oxidation or CVD.

Figure 13:
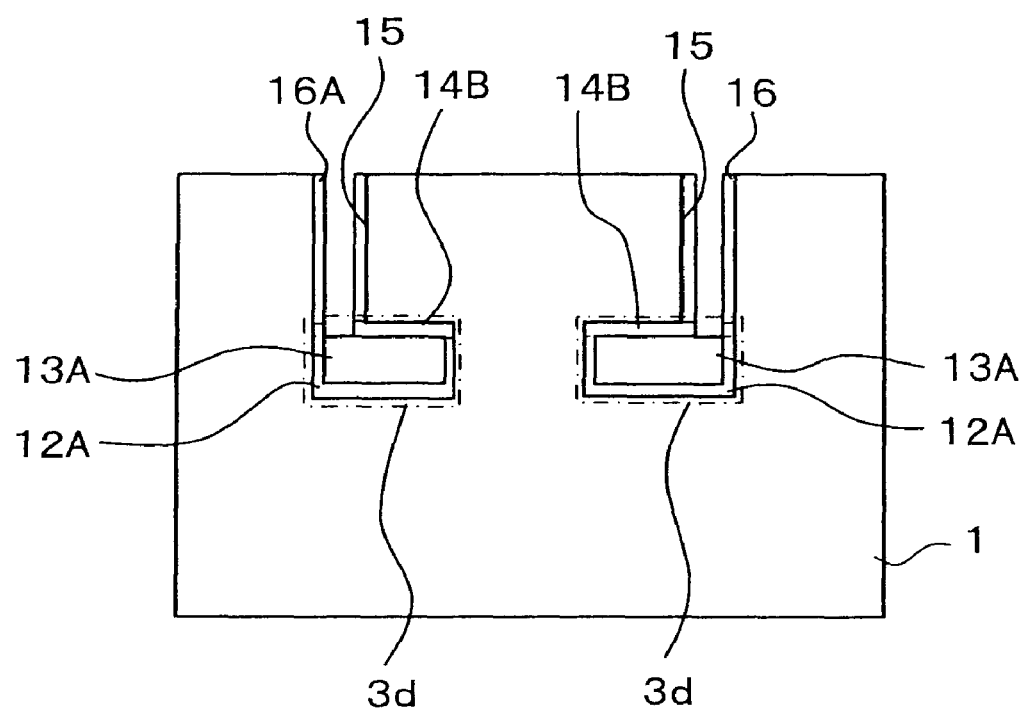
FIG. 13 is a structure diagram for explaining the method of manufacturing the trench-gate IGBT in Embodiment 1 of the present invention.

Next, as shown in FIG. 13, parts of the remaining second insulation films 14A and parts of the third insulation films 16A both of which have been located in the bottom-most parts of the second trenches 15, as well as part of third insulation films 16A upon the top-side surface of the n⁻ layer 1 are removed. Removal of those parts of remaining second insulation films 14A and the third insulation films 16A is performed by using dry etching.

Figure 14:
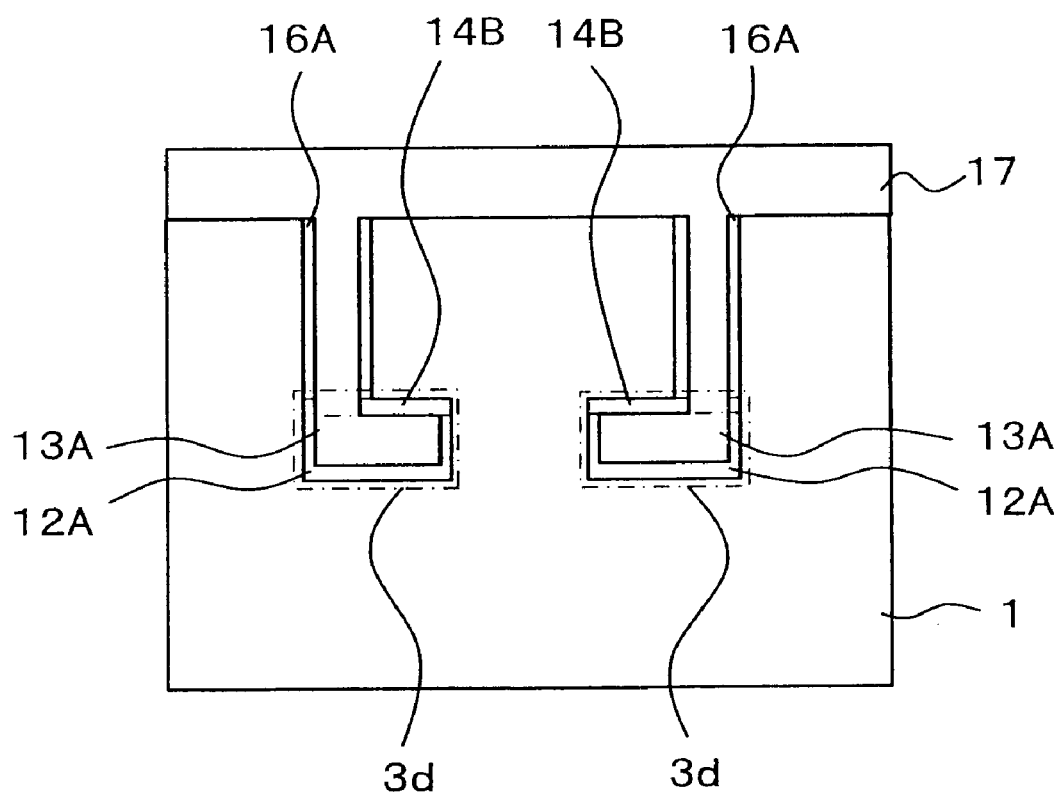
FIG. 14 is a structure diagram for explaining the method of manufacturing the trench-gate IGBT in Embodiment 1 of the present invention.

Next, as shown in FIG. 14, in each space inside surrounded by the remaining second insulation films 14B and remaining third insulation films 16A, and upon the top-side surface of the n⁻ layer 1, a second conductor 17 is formed of a conductive material such as polycrystalline silicon (polysilicon). The second conductor 17 in the figure is formed by using CVD.

Figure 15:
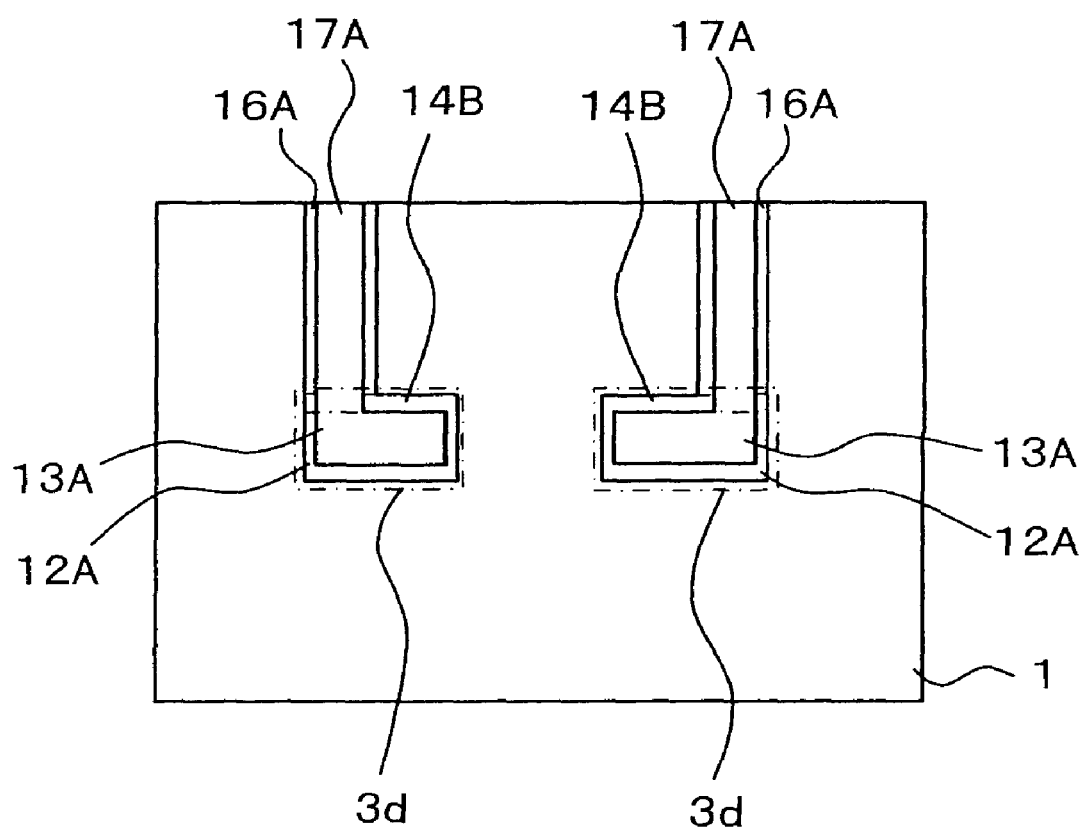
FIG. 15 is a structure diagram for explaining the method of manufacturing the trench-gate IGBT in Embodiment 1 of the present invention.

Next, as shown in FIG. 15, part of the second conductor 17, having been formed upon each space inside surrounded by the remaining second insulation films 14B and remaining third insulation films 16A, and upon the top-side surface of the n⁻ layer 1, is removed. Removal of the part of second conductor 17 is performed by using dry etching or planarization CMP.

Here, as can be understood from the L-shaped trench gates 3 shown in FIG. 1, the trenches 3a are constructed of the first trenches 11 and the second trenches 15; the gate insulation films 3b are constructed of the remaining first insulation films 12A, the remaining second insulation films 14B, and the remaining third insulation films 16A; and the gate electrodes 3c are constructed of the remaining first conductors 13A and the remaining second conductors 17A. Hereinafter, these will be referred to as the L-shaped trench gates 3, the trenches 3a, the gate insulation films 3b, and the gate electrodes 3c shown in FIG. 1.

Figure 16:
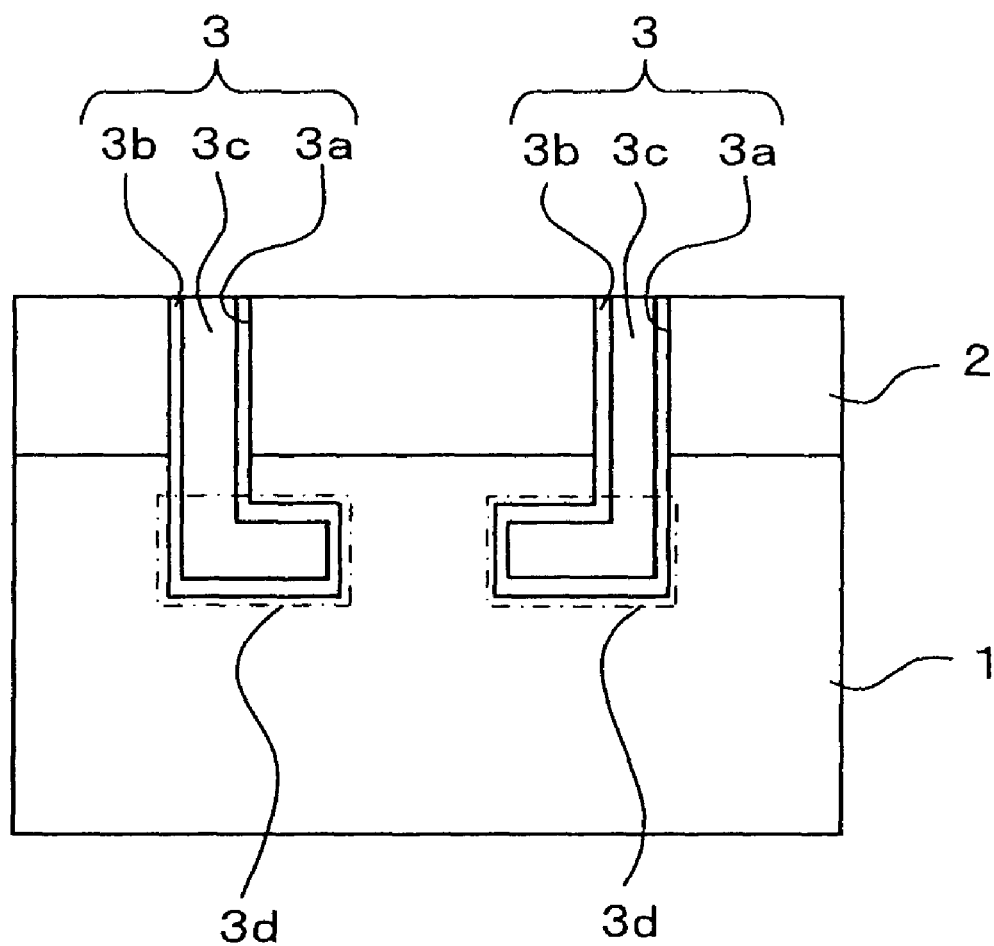
FIG. 16 is a structure diagram for explaining the method of manufacturing the trench-gate IGBT in Embodiment 1 of the present invention.

Next, as shown in FIG. 16, a p base layer 2 that is the second semiconductor layer of the second conductivity type is formed in the top side of the n⁻ layer 1. The p base layer 2 is formed by ion implantation and a heat treatment such as annealing.

Figure 17:
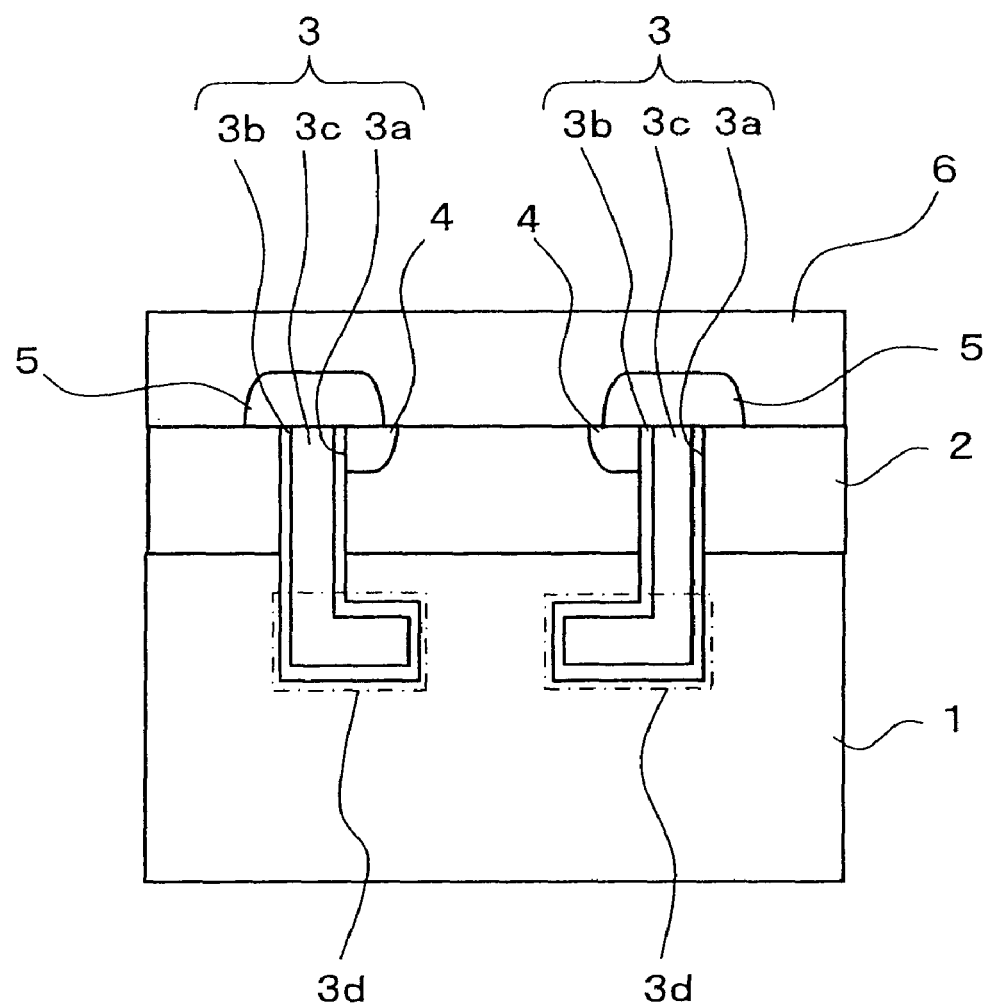
FIG. 17 is a structure diagram for explaining the method of manufacturing the trench-gate IGBT in Embodiment 1 of the present invention.

Next, as shown in FIG. 17, in the top side of the p base layer 2, on each side of the L-shaped trench gates 3 whose bottom portions 3d have been extended, n⁺ emitter regions 4 that are first semiconductor regions of the first conductivity type are selectively formed contiguously bordering on the lateral sides of the L-shaped trench gates 3. The n⁺ emitter regions 4 are formed by ion implantation and a heat treatment such as annealing.

And then, upon the top-side surfaces of the n⁺ emitter regions 4, the L-shaped trench gates 3 and the p base layer 2, an interlayer insulation film (not shown in FIG. 17) is formed by CVD that is made of a silicate glass (such as borophosphosilicate glass, or BPSG) having good coverage and flatness; and subsequently, in order to uncover parts of the n⁺ emitter regions 4 and the top-side surface of the p base layer 2, part of the interlayer insulation film is selectively removed by using dry etching so as to form interlayer insulation films 5 as shown in FIG. 17.

Moreover, in order to cover the top-side surfaces of the p base layer 2 and the n⁺ emitter regions 4, i.e., the parts not covered with the interlayer insulation films 5, and the upper and both lateral sides of the interlayer insulation films 5, an emitter electrode 6 is formed as a first main electrode that is made of a conductive material such as aluminum. According to the structure as arranged above, the emitter electrode 6 is electrically connected with the n⁺ emitter regions 4. Furthermore, the emitter electrode 6 is formed by using sputtering.

On the other hand, as shown in FIG. 1, a p⁺ collector layer 7 that is a third semiconductor layer of the second conductivity type is formed in the other side of the n⁻ layer 1 (in the "bottom" side in the figure). The p⁺ collector layer 7 is formed by ion implantation and a heat treatment such as annealing.

And then, on the bottom-side surface of the p⁺ collector layer 7, a collector electrode 8 is formed as a second main electrode that is made of a conductive material such as aluminum. The collector electrode 8 is formed by using sputtering.

According to the method of manufacturing described above, the trench-gate IGBT shown in FIG. 1 in Embodiment 1 comes to completion. In implementing the method of manufacturing the trench-gate IGBT in Embodiment 1, although not shown in the preceding figures, when etching or ion implantation is carried out, prior to this process, photoengraving (or photolithography) is performed.

Furthermore, the manufacturing process has been described here as an example only; in particular, the manufacturing process is not necessarily bound by the method described above. It is therefore possible to realize other manufacturing process. It is thus acceptable only that manufacturing of the trench-gate IGBT shown in FIG. 1 finally comes to completion. For example, a process has been shown to form the p base layer 2 in the top side of the n⁻ layer 1 by using, e.g., ion implantation; however, it may be also possible that, while forming the second n⁻ layer 1b, the p base layer 2 is alternatively formed to contain impurities in the second conductivity type. In addition, although the process is shown to form the p base layer 2 and the n⁺ emitter regions 4 after having formed the L-shaped trench gates 3, the L-shaped trench gates 3 may be formed after having formed the p base layer 2 and the n⁺ emitter regions 4. In addition, the first n⁻ layer 1a that is an n-type substrate has been placed as the basis; however, it may be possible to use a p-type substrate for the p⁺ collector layer 7, and the p-type substrate is placed as the basis. In this case, the n⁻ layer 1 is formed upon the p⁺ collector layer 7 that is made of the p-type substrate.

Next, the operations of the trench-gate IGBT in Embodiment 1 of the present invention will be explained.

When a predetermined collector voltage is applied across the emitter electrode 6 and the collector electrode 8, and a predetermined gate voltage that can bring the IGBT into an on-state is supplied across the emitter electrode 6 and the gate electrodes 3c, a channel region in the p base layer 2 is inverted into the n-type; thus, a channel is established.

Through the channel being established, electrons are injected from the emitter electrode 6 into the n⁻ layer 1. And then, by the injected electrons, the interspace between the p⁺ collector layer 7 and the n⁻ layer 1 is forward-biased; thus, positive holes are injected from the p⁺ collector layer 7. As a result, impedance of the n⁻ layer 1 is reduced, and the amount of current flowing through the IGBT (its current-currying capability) is increased, so that the IGBT is turned into an on-state.

Moreover, in Embodiment 1, in the directions parallel to the first main surface of the n⁻ layer 1, a set of L-shaped trench gates 3, having their bottom portions 3d each unilaterally extended a predetermined length, are used; and in addition, a predetermined set of adjacent bottom portions 3d of the L-shaped trench gates 3 opposes each other at the protruding ends, and the interspace between the extended bottom portions 3d is set narrower than any other interspace between the trench gates that are perpendicularly formed with respect to the first main surface of the n⁻ layer 1. For these reasons, the mobility of the positive holes injected from the p⁺ collector layer 7 is restricted, so that the positive holes are accumulated between the predetermined set of the adjacent bottom portions 3d of the L-shaped trench gates 3, and in their proximities. And then, by these accumulated positive holes, the amount of supplied electrons injected, through the channel, from the emitter electrode 6 into the n⁻ layer 1 increases, so that the impedance thereof decreases. As a result, in comparison to conventional power devices, it is possible to reduce the on-state voltage and power loss of the trench-gate IGBT. In addition, the bottom portions 3d thereof are flatter in comparison to bottom portions of conventional trench gates; therefore, electric field intensity is mitigated around the bottom portions 3d. For this reason, there exists an effect of increasing performance of withstand (blocking) voltage between the collector and the emitter.

Next, the operations of the trench-gate IGBT turning from the on-state to an off-state will be explained as follows. When in the on-state, a gate voltage applied across the emitter electrode 6 and the gate electrodes 3c is set at zero or biased at a reverse voltage so as to change the IGBT into the off-state, the channel region inverted into the n-type returns into the p-type; thus, the electron injection from the emitter electrode 6 stops. Because the electron injection stops, the positive-hole injection from the p⁺ collector layer 7 also stops. Subsequently, the electrons and the positive holes accumulated in the n⁻ layer 1 cease to exist by either passing through to the collector electrode 8 and the emitter electrode 6, respectively, or by mutual recombination.

Figure 18:
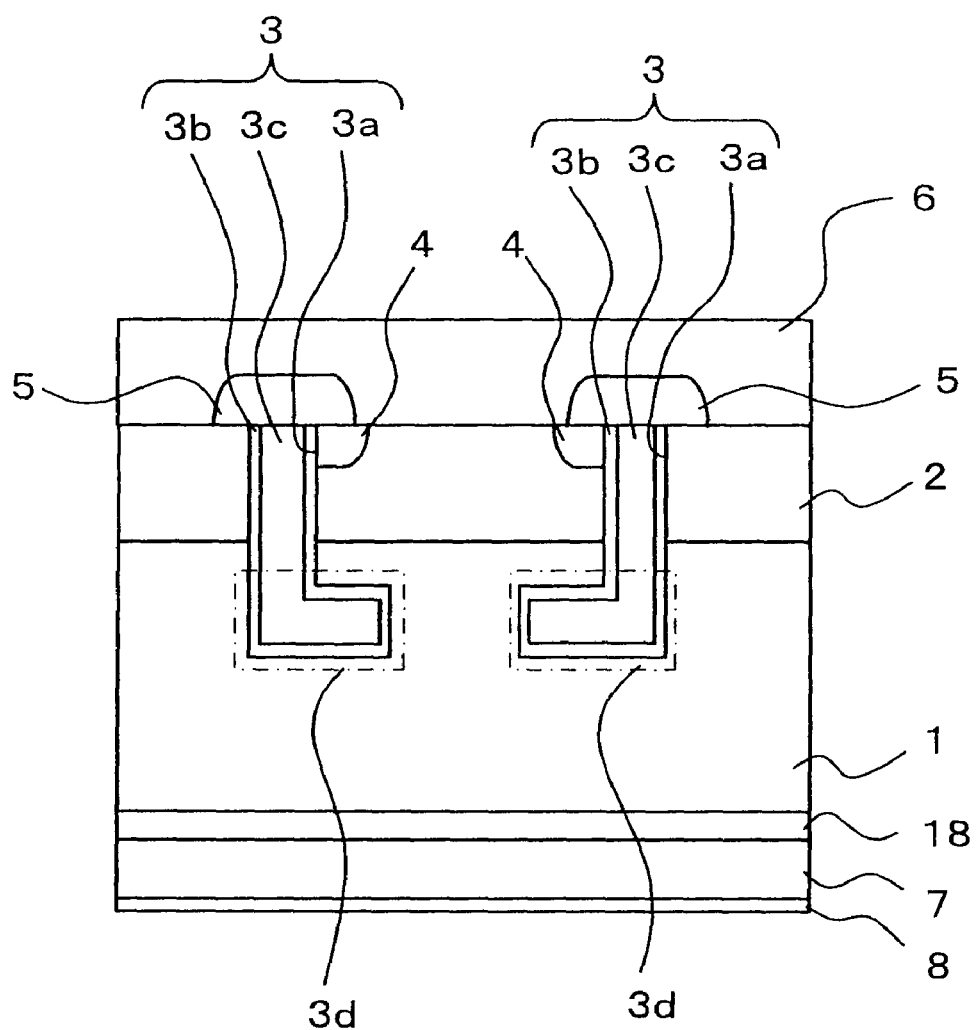
FIG. 18 is a cross-sectional view outlining another brief structure of a trench-gate IGBT that is the power semiconductor device in Embodiment 1 of the present invention.

Moreover, according to Embodiment 1, it is shown that the p+ collector layer 7 is formed on the second main surface of the n− layer 1; however, as shown in FIG. 18, between the n− layer 1 and the p+ collector layer 7, an n+ buffer layer 18 that is a fourth semiconductor layer of the first conductivity type may be formed so as to control the amount of positive holes injected from the p+ collector layer 7 into the n− layer 1. The n+ buffer layer 18 is formed by ion implantation and a heat treatment such as annealing.

In addition, according to Embodiment 1, it is shown that the first semiconductor layer of the first conductivity type (as an n− layer 1) is formed by adding the second n− layer 1b to the first n− layer 1a (as in FIG. 10); however, the first semiconductor layer of the first conductivity type may be formed as an n− layer by adjusting impurity concentration of the second n− layer 1b.

In addition, according to Embodiment 1, it is shown that the n+ emitter regions 4 are selectively provided in the top side of the p base layer 2, on the lateral side of each of the L-shaped trench gates 3 from which bottom portions 3d extend, contiguously bordering on the lateral sides of the L-shaped trench gates 3. However, the n+ emitter regions 4 may be provided contiguously bordering on both lateral sides of the L-shaped trench gates 3 each.

Figure 19:
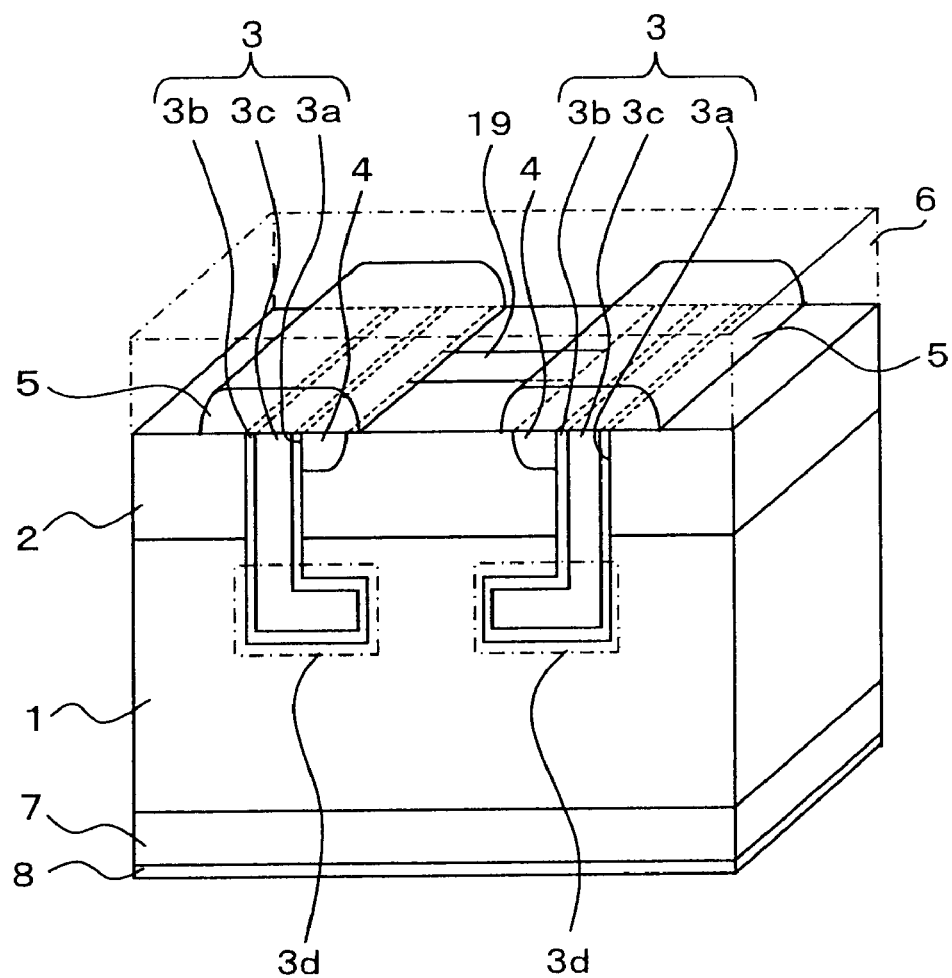
FIG. 19 is a perspective partial-cross-sectional view outlining another structure of a trench-gate IGBT that is the power semiconductor device in Embodiment 1 of the present invention.

Furthermore, according to Embodiment 1, it is shown that the interlayer insulation films 5 each are provided to cover a large part of the top side of the n+ emitter regions 4 each, the top side of the L-shaped trench gates 3 each, and part of the top-side surface of the p base layer 2 (in FIG. 1); however, as shown, for example, in the perspective partial-cross-sectional view of FIG. 19, it may be possible to construct in such a way that the interlayer insulation films 5 each are provided to cover each of the n+ emitter regions 4, each top side of the L-shaped trench gates 3, and part of the top-side surface of the p base layer 2; the interspace between a predetermined set of adjacent n+ emitter regions 4 is bridged with an n+ emitter connection region 19 that is a second semiconductor region of the first conductivity type that has been selectively provided in the top side of the p base layer 2; then, the n+ emitter connection region 19 is electrically connected to the emitter electrode 6.

Embodiment 2

Figure 20:
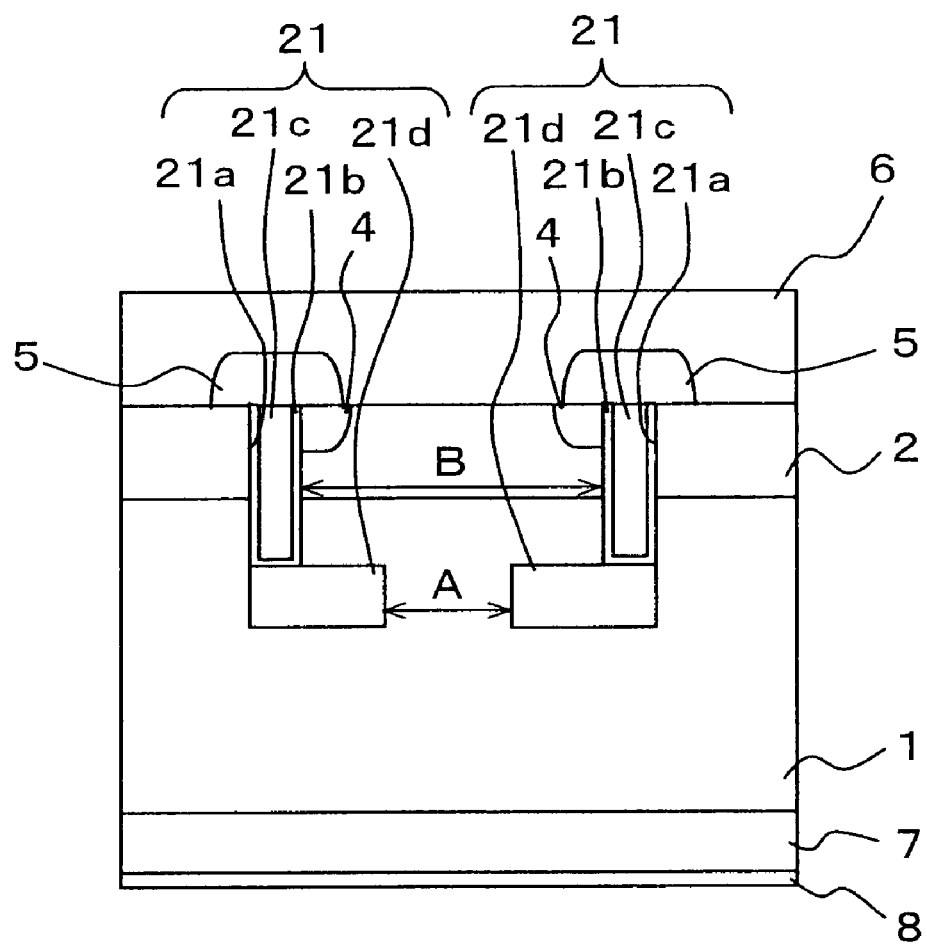
FIG. 20 is a cross-sectional view outlining a structure of a trench-gate IGBT that is a power semiconductor device in Embodiment 2 of the present invention.

Hereafter, Embodiment 2 of the present invention will be explained based on the drawings. FIG. 20 is a cross-sectional view outlining a structure of a trench-gate IGBT that is a power semiconductor device in Embodiment 2 of the present invention. In FIG. 20, from the viewpoint of difference when compared to the trench-gate IGBT shown in FIG. 1 in Embodiment 1, there exists a difference in the structure of L-shaped trench gates. In Embodiment 1, including the bottom portions 3d, the L-shaped trench gates 3 are structured having the trenches 3a, the gate insulation films 3b provided to cover each inner surface of the trenches 3a, and in addition, the gate electrodes 3c provided with which each space inside surrounded by the gate insulation films 3b is filled. In comparison to this, a set or a pair of L-shaped trench gates 21 in Embodiment 2 has its bottom portions identically formed with and made of a dielectric material such as an oxide, and provided as bottom portions 21d; similarly to the arrangement of Embodiment 1, the trench-gate parts (sections) perpendicularly formed with respect to the first main surface of the n− layer 1 are structured having trenches 21a, gate insulation films 21b provided to cover each inner surface of the trenches 21a, and in addition, gate electrodes 21c provided with which each space inside surrounded by the gate insulation films 21b is filled. In addition, similarly to Embodiment 1, an arrangement is made so that the extending end of one of the bottom portions 21d of the pair of L-shaped trench gates 21 opposes that of the other bottom portion of the pair of the L-shaped trench gates 21, on the extending side of the bottom portions 21d. Because of the arrangement, the interspace between a pair of predetermined adjacent bottom portions 21d of L-shaped trench gates 21 (the width indicated by the symbol "A" in the figure) is set narrower than any other interspace between the trench-gate parts (sections) that are perpendicularly formed with respect to the first main surface of the n− layer 1 (the width indicated by the symbol "B" in the figure). Moreover, in FIG. 20, the same reference numerals and symbols designate the same items as or items corresponding to those shown in FIG. 1 in Embodiment 1; thus, their explanation is omitted.

Next, a method of manufacturing the trench-gate IGBT shown in FIG. 20 will be explained by referring to FIG. 21 through FIG. 33. Moreover, in FIG. 21 through FIG. 33, the same reference numerals and symbols designate the same items as or items corresponding to those shown in FIG. 2 through FIG. 17 in Embodiment 1; thus, the following explanation thereof is carried out.

Figure 21:
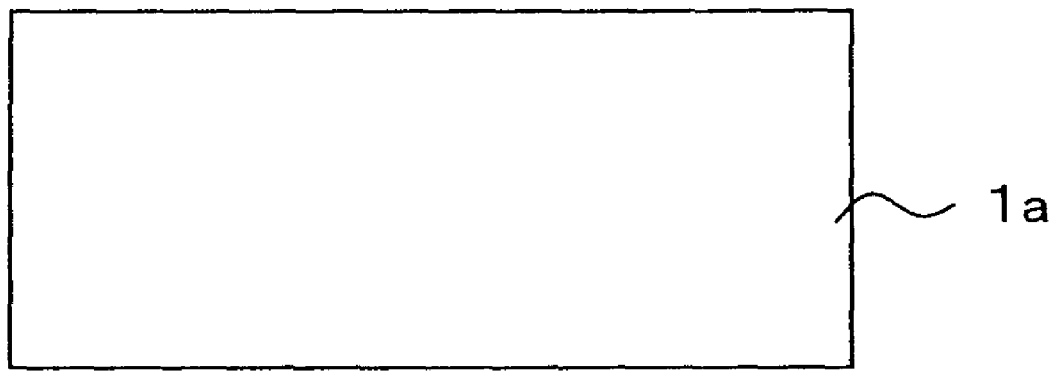
FIG. 21 is a structure diagram for explaining a method of manufacturing the trench-gate IGBT in Embodiment 2 of the present invention.
Figure 22:
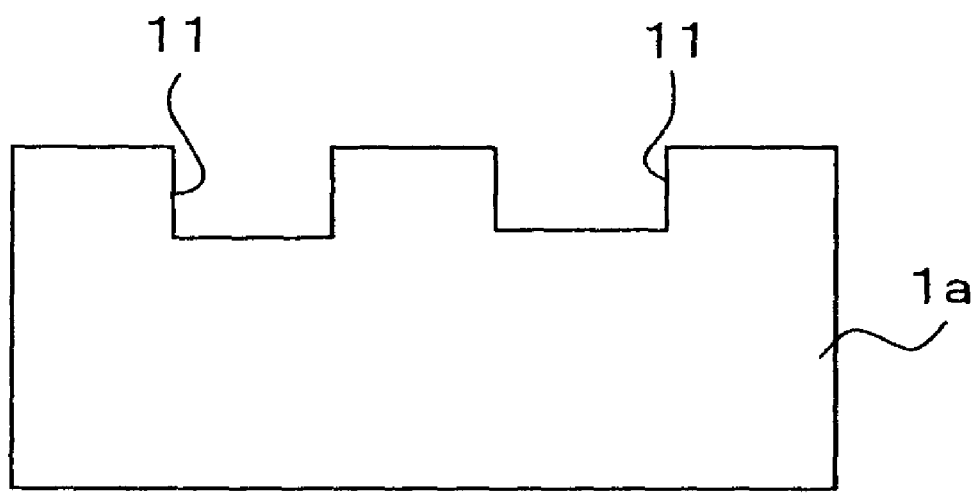
FIG. 22 is a structure diagram for explaining the method of manufacturing the trench-gate IGBT in Embodiment 2 of the present invention.

In the first place, as shown in FIG. 21, after having undergone guard-ring formation for semiconductor-element or unit-cell isolation upon one surface (the "top-side" surface in the figure) of the first n− layer 1a that is to be part of a first semiconductor layer of the first conductivity type and is made of a silicon substrate, as shown in FIG. 22, first trenches 11 are selectively formed in the order of 1000 nm in depth. The first trenches 11 are formed by using dry etching.

Figure 23:
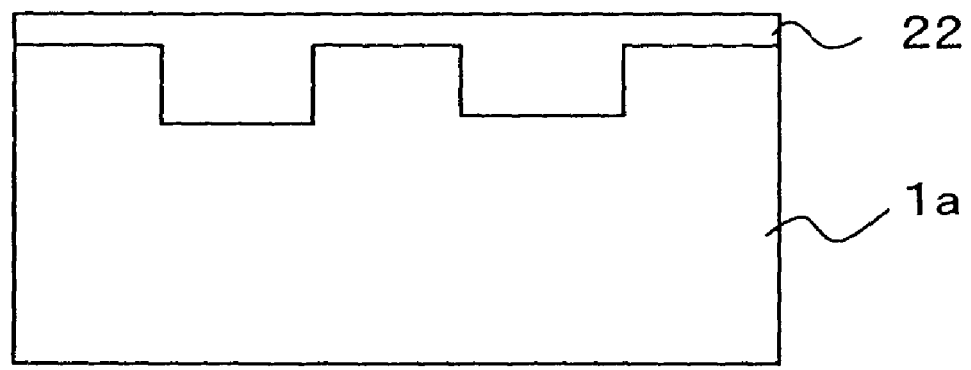
FIG. 23 is a structure diagram for explaining the method of manufacturing the trench-gate IGBT in Embodiment 2 of the present invention.

Next, as shown in FIG. 23, upon the inner surface of the first trenches 11 and one of the surfaces of the first n− layer 1a (hereinafter referred to as "top-side" surface), a first insulation film 22 is formed with and made of an oxide film. The first insulation film 22 in the figure is formed by using CVD.

Figure 24:
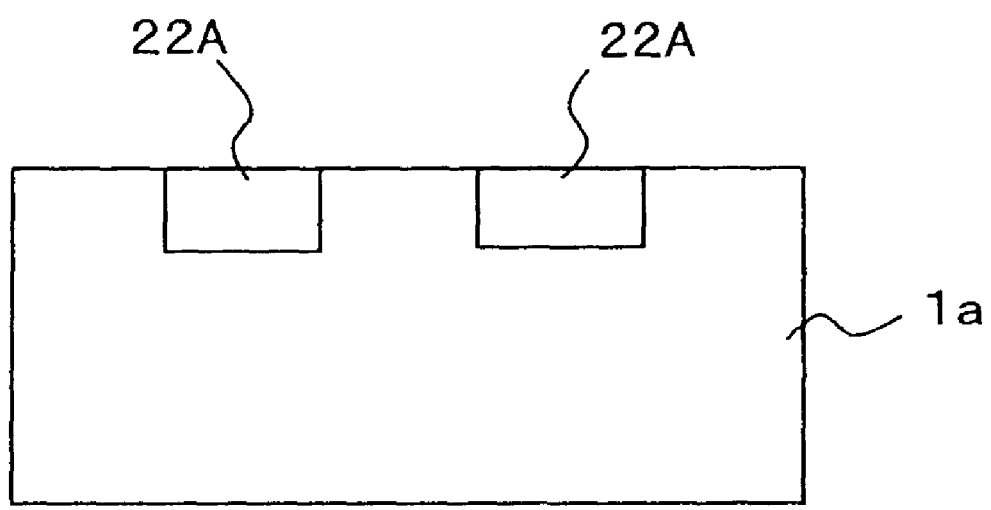
FIG. 24 is a structure diagram for explaining the method of manufacturing the trench-gate IGBT in Embodiment 2 of the present invention.

Next, as shown in FIG. 24, part of the first insulation film 22, having been formed upon the top-side surface of the first n− layer 1a, is removed. According to the removal as arranged above, the bottom portions 21d of the L-shaped trench gates 21 are formed. Removal of the parts of the first insulation film 22 is performed by using dry etching or planarization CMP.

Figure 25:
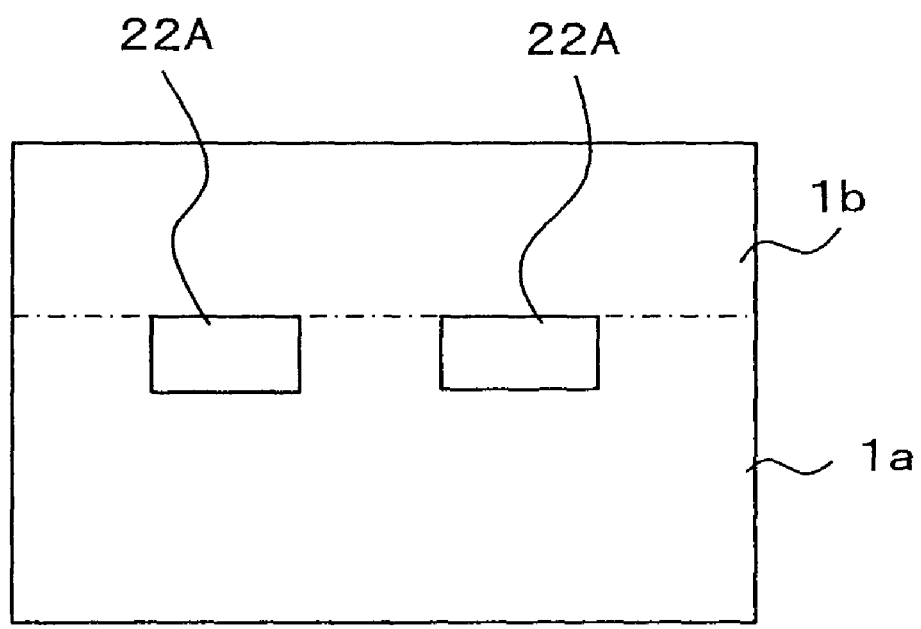
FIG. 25 is a structure diagram for explaining the method of manufacturing the trench-gate IGBT in Embodiment 2 of the present invention.

Next, as shown in FIG. 25, upon the top-side surface of the first n− layer 1a and the bottom portions 21d (i.e., the remaining first insulation films 22A), a second n− layer 1b that is to be part of the first semiconductor layer of the first conductivity type is formed in the order of 5000 nm in thickness. The second n− layer 1b is an amorphous silicon layer that is formed by CVD, or an epitaxial layer that is formed by an epitaxial growth method. In a case of the amorphous silicon layer, its mono-crystalline layer is obtained by a heat treatment. And then, the n− layer 1 that is the first semiconductor layer of the first conductivity type is constructed by adding the second n− layer 1b to the first n− layer 1a, both having the same impurity concentration. Hereinafter, the n− layer 1 will be taken into consideration for explanatory purposes.

Figure 26:
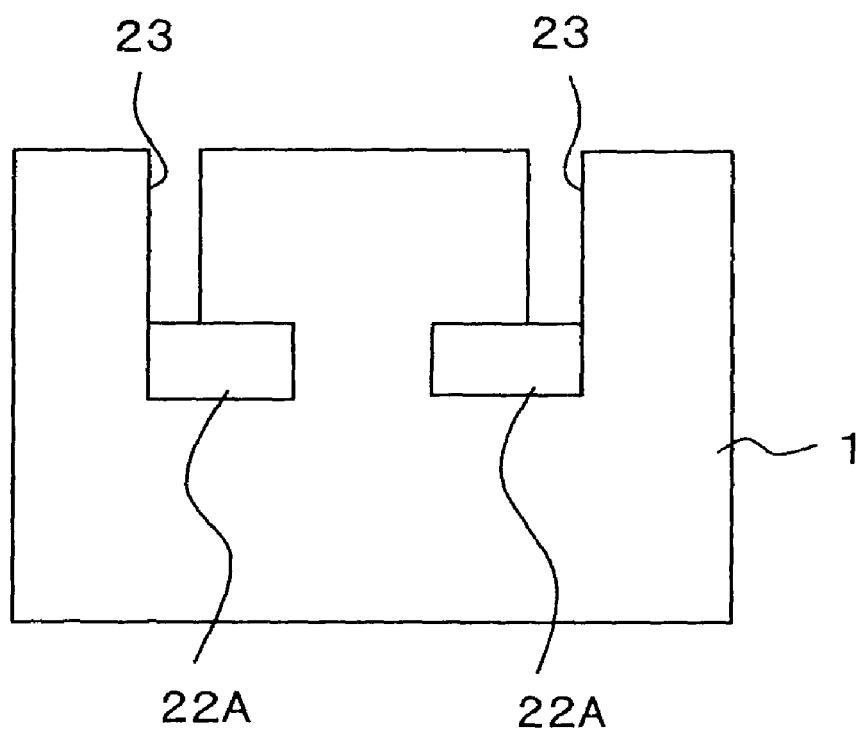
FIG. 26 is a structure diagram for explaining the method of manufacturing the trench-gate IGBT in Embodiment 2 of the present invention.

Next, as shown in FIG. 26, second trenches 23 are formed from the top side of the n− layer 1, perpendicularly with respect to the top-side (or first main) surface of the n− layer 1, to reach each top side of the remaining first insulation films 22A. These second trenches 23 are formed so that each of the outer lateral surfaces of a predetermined adjacent pair of the first trenches 11 is approximately coincident with its corresponding outer lateral surface of the pair of second trenches 23. The second trenches 23 are formed by using dry etching.

Figure 27:
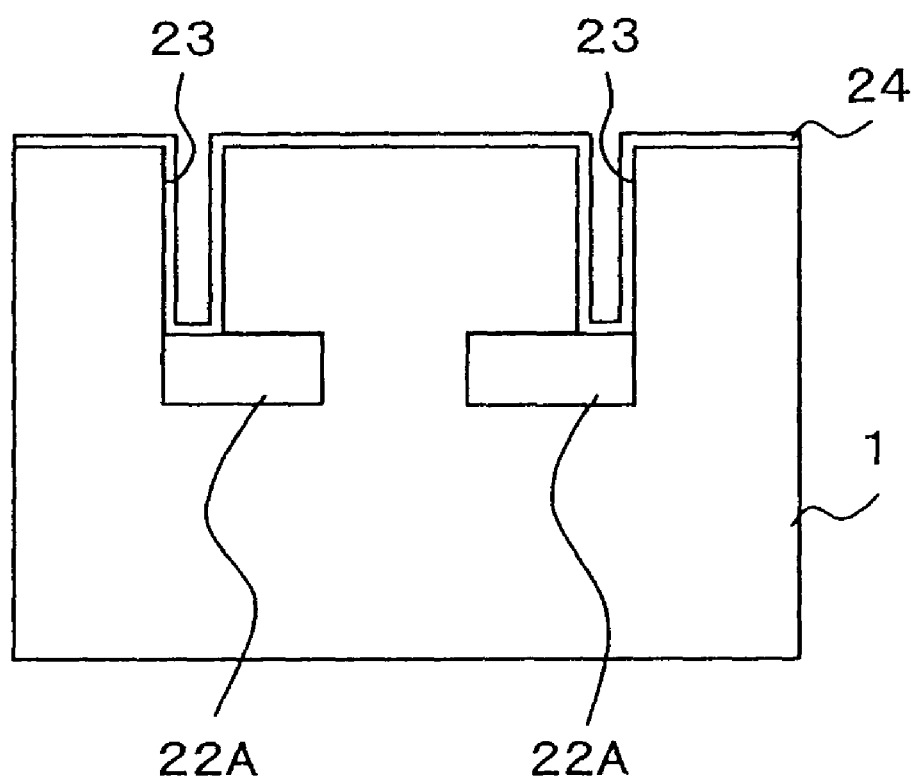
FIG. 27 is a structure diagram for explaining the method of manufacturing the trench-gate IGBT in Embodiment 2 of the present invention.

Next, as shown in FIG. 27, upon each inner surface of the second trenches 23 and the top-side surface of the n⁻ layer 1, a second insulation film 24 is formed of an oxide film in the order of 100 nm in thickness. The second insulation film 24 in the figure is formed by using thermal oxidation or CVD.

Figure 28:
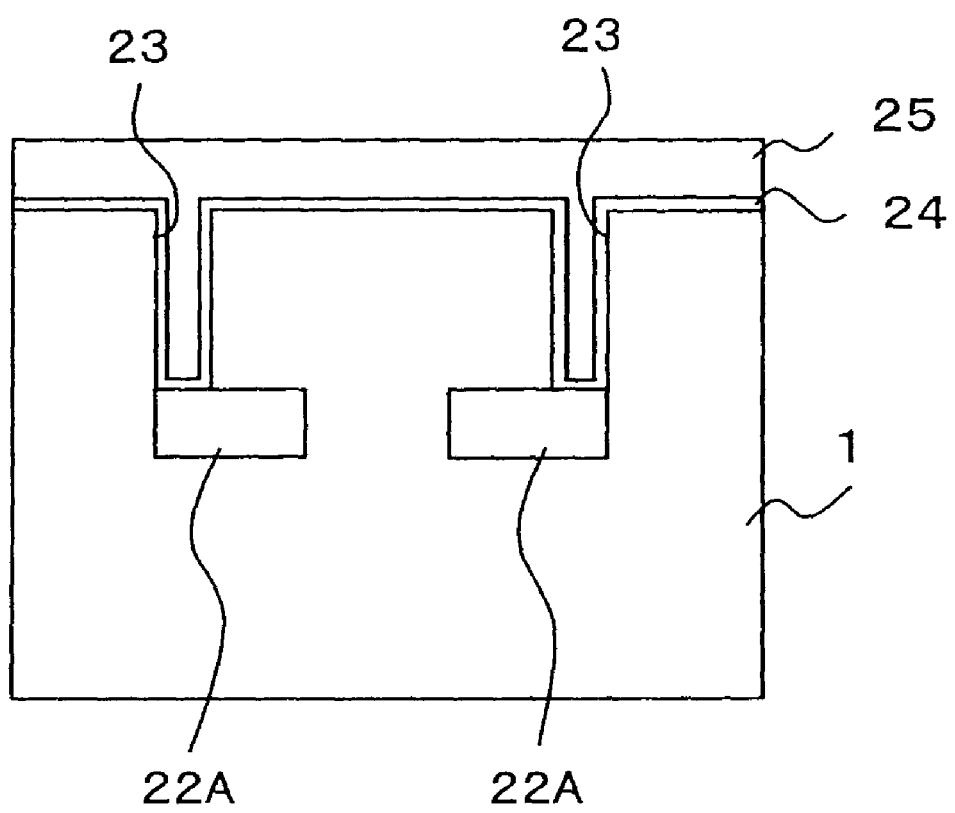
FIG. 28 is a structure diagram for explaining the method of manufacturing the trench-gate IGBT in Embodiment 2 of the present invention.

Next, as shown in FIG. 28, upon the surface of the second insulation film 24 (including in each space inside surrounded by the second insulation film 24), a first conductor 25 is formed of a conductive material such as polycrystalline silicon (polysilicon). The first conductor 25 in the figure is formed by using CVD.

Figure 29:
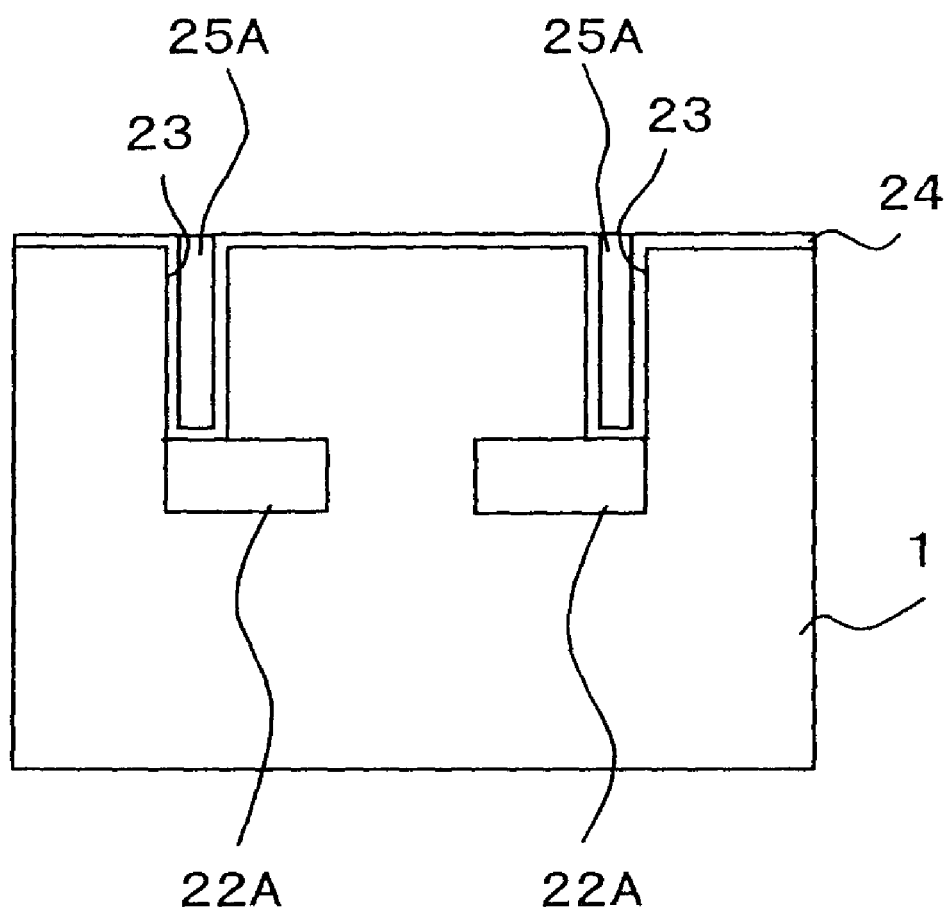
FIG. 29 is a structure diagram for explaining the method of manufacturing the trench-gate IGBT in Embodiment 2 of the present invention.

Next, as shown in FIG. 29, part of the first conductor 25, having been formed upon the top-side surface of the second insulation film 24, is removed until part of the second insulation film 24 upon the n⁻ layer 1 is uncovered. Removal of the part of first conductor 25 is performed by using dry etching or planarization CMP.

Figure 30:
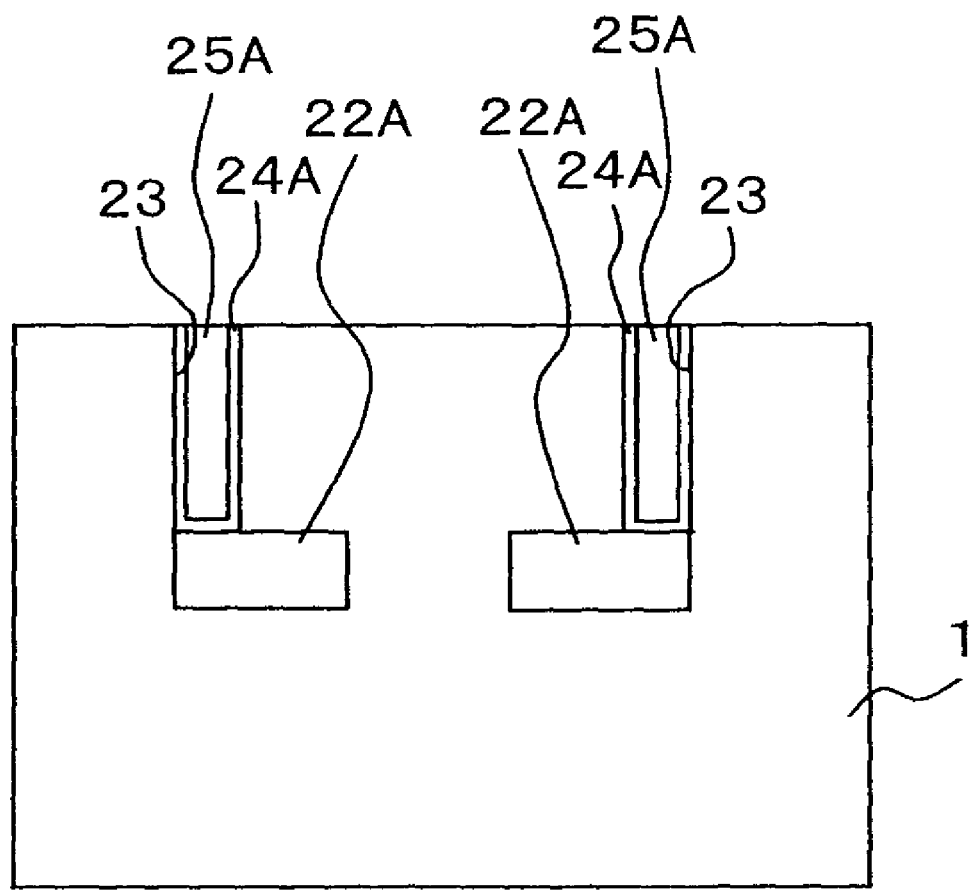
FIG. 30 is a structure diagram for explaining the method of manufacturing the trench-gate IGBT in Embodiment 2 of the present invention.

Moreover, as shown in FIG. 30, part of the second insulation film 24 upon the top-side surface of the n- layer 1 and top-end part of each of the remaining first conductors 25A are removed until part of top-side surface of the n⁻ layer 1 is uncovered. Removal of those parts of the second insulation film 24 and the remaining first conductors 25A is performed by using dry etching. Note that, as can be understood from the L-shaped trench gates 21 shown in FIG. 20, the trenches 21*a* are constructed of the second trenches 23; the gate insulation films 21*b* are constructed of the remaining second insulation films 24A; the gate electrodes 21*c* are constructed of the remaining first conductors 25A; and in addition, the bottom portions 21*d* are constructed of the remaining first insulation films 22A. Hereinafter, these will be referred to as the L-shaped trench gates 21, the trenches 21*a*, the gate insulation films 21*b*, the gate electrodes 21*c*, and the bottom portions 21*d* shown in FIG. 20.

Figure 31:
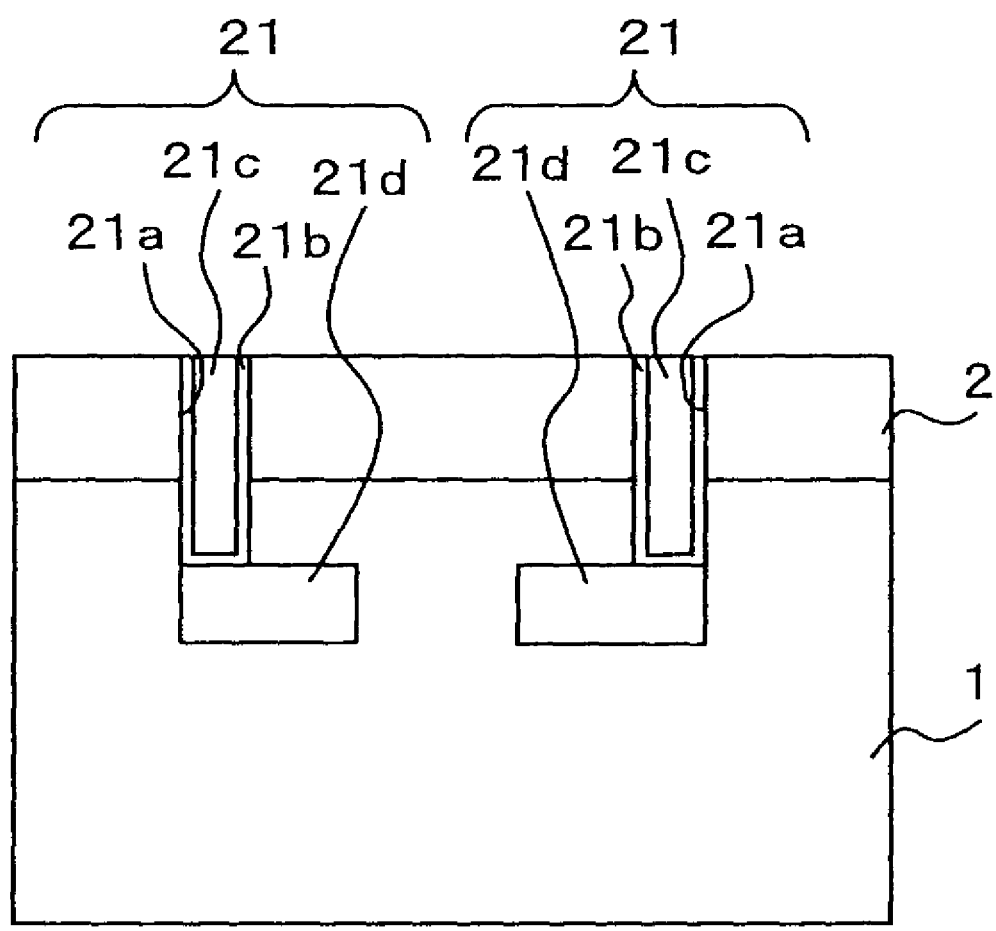
FIG. 31 is a structure diagram for explaining the method of manufacturing the trench-gate IGBT in Embodiment 2 of the present invention.

Next, as shown in FIG. 31, a p base layer 2 that is a second semiconductor layer of the second conductivity type is formed in the top side of the n⁻ layer 1. The p base layer 2 is formed by ion implantation and a heat treatment such as annealing.

Figure 32:
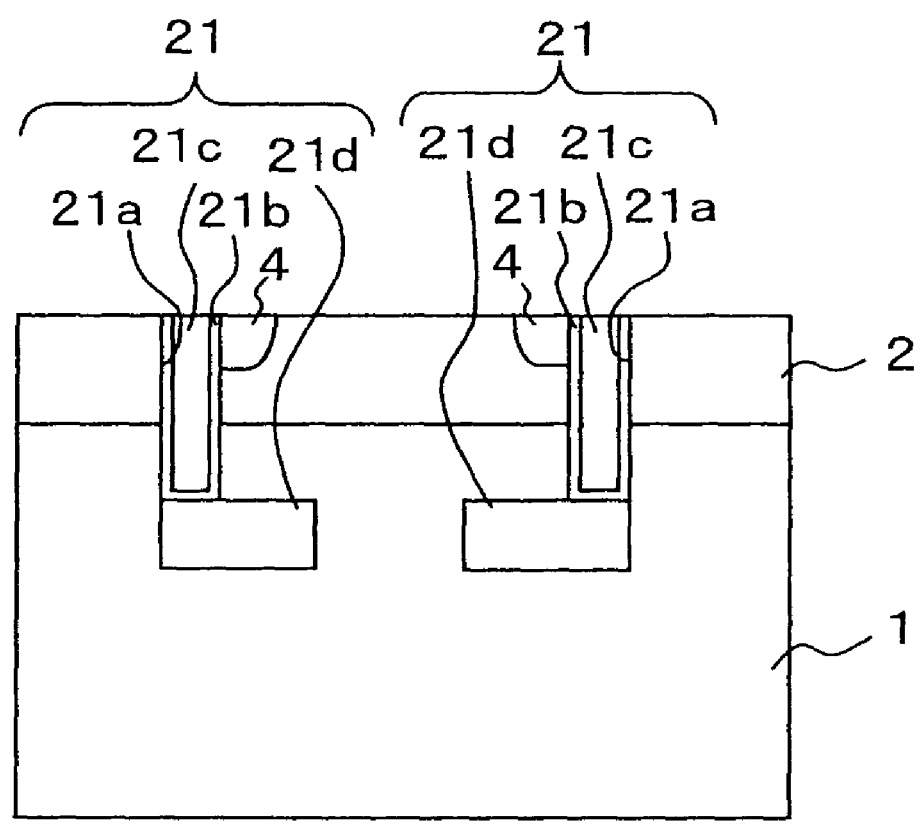
FIG. 32 is a structure diagram for explaining the method of manufacturing the trench-gate IGBT in Embodiment 2 of the present invention.

Next, as shown in FIG. 32, in the top side of the p base layer 2, on each side of the L-shaped trench gates 21 whose bottom portions 21*d* have been extended, n⁺ emitter regions 4 that are first semiconductor regions of the first conductivity type are selectively formed contiguously bordering on the lateral sides of the L-shaped trench gates 21. The n⁺ emitter regions 4 are formed by ion implantation and a heat treatment such as annealing.

Figure 33:
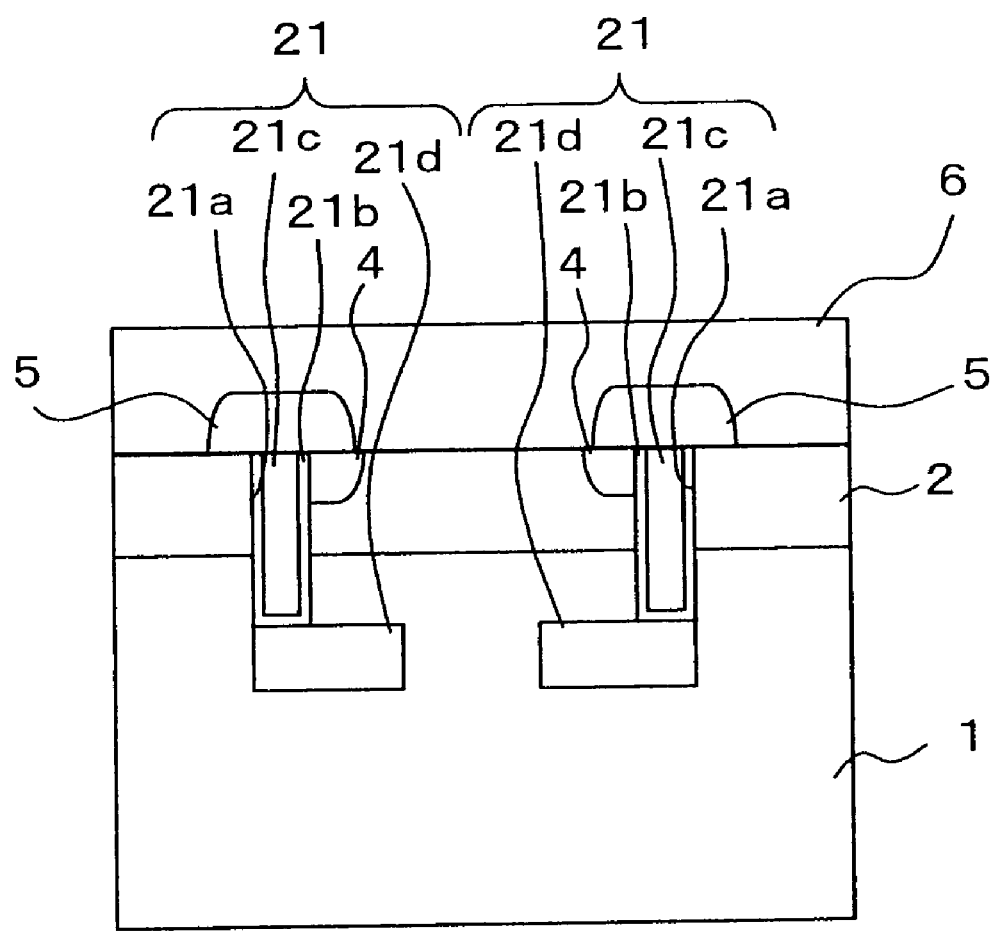
FIG. 33 is a structure diagram for explaining the method of manufacturing the trench-gate IGBT in Embodiment 2 of the present invention.

Next, upon the top-side surfaces of the n⁺ emitter regions 4, the L-shaped trench gates 21 and the p base layer 2, an interlayer insulation film (not shown in FIG. 33) is formed by CVD that is made of a silicate glass (such as borophosphosilicate glass, or BPSG) having good coverage and flatness; and subsequently, in order to uncover parts of the n⁺ emitter regions 4 and the top-side surface of the p base layer 2, part of the interlayer insulation film is selectively removed by using dry etching so as to form interlayer insulation films 5 as shown in FIG. 33.

Moreover, in order to cover the top-side surfaces of the p base layer 2 and the n⁺ emitter regions 4, i.e., the parts not covered with the interlayer insulation films 5, and the upper and both lateral sides of the interlayer insulation films 5, an emitter electrode 6 is formed as a first main electrode that is made of a conductive material such as aluminum. According to the structure as arranged above, the emitter electrode 6 is electrically connected with the n⁺ emitter regions 4. Furthermore, the emitter electrode 6 is formed by using sputtering.

On the other hand, as shown in FIG. 20, a p⁺ collector layer 7 that is a third semiconductor layer of the second conductivity type is formed in the other side of the n⁻ layer 1 (in the "bottom" side in the figure). The p⁺ collector layer 7 is formed by ion implantation and a heat treatment such as annealing.

And then, on the bottom-side surface of the p⁺ collector layer 7, a collector electrode 8 is formed as a second main electrode that is made of a conductive material such as aluminum. The collector electrode 8 is formed by using sputtering.

According to the method of manufacturing described above, the trench-gate IGBT shown in FIG. 20 in Embodiment 2 comes to completion. In implementing the method of manufacturing the trench-gate IGBT in Embodiment 2, although not shown in the preceding figures, when etching or ion implantation is carried out, prior to this process, photoengraving (or photolithography) is performed.

Furthermore, the manufacturing process has been described here as an example only; in particular, the manufacturing process is not necessarily bound by the method described above. It is therefore possible to realize other manufacturing process. It is thus acceptable only that manufacturing of the trench-gate IGBT shown in FIG. 20 finally comes to completion. For example, a process has been shown to form the p base layer 2 in the top side of the n⁻ layer 1 by using, e.g., ion implantation; however, it may be also possible that, while forming the second n⁻ layer 1*b*, the p base layer 2 is alternatively formed to contain impurities in the second conductivity type. In addition, although the process is shown to form the p base layer 2 and the n⁺ emitter regions 4 after having formed the L-shaped trench gates 21, the L-shaped trench gates 21 may be formed after having formed the p base layer 2 and the n⁺ emitter regions 4. In addition, the first n⁻ layer 1*a* that is an n-type substrate has been placed as the basis; however, it may be possible to use a p-type substrate for the p⁺ collector layer 7, and the p-type substrate is placed as the basis. In this case, the n⁻ layer 1 is formed upon the p⁺ collector layer 7 that is made of the p-type substrate.

Next, the operations of the trench-gate IGBT in Embodiment 2 of the present invention will be explained.

When a predetermined collector voltage is applied across the emitter electrode 6 and the collector electrode 8, and a predetermined gate voltage that can bring the IGBT into an on-state is supplied across the emitter electrode 6 and the gate electrodes 21*c*, a channel region in the p base layer 2 is inverted into the n-type; thus, a channel is established.

Through the channel being established, electrons are injected from the emitter electrode 6 into the n⁻ layer 1. And then, by the injected electrons, the interspace between the p⁺ collector layer 7 and the n⁻ layer 1 is forward-biased; thus, positive holes are injected from the p⁺ collector layer 7. As a result, impedance of the n⁻ layer 1 is reduced, and the amount of current flowing through the IGBT (its current-currying capability) is increased, so that the IGBT is turned into an on-state.

Moreover, in Embodiment 2, in the directions parallel to the first main surface of the n⁻ layer 1, a set of L-shaped trench gates 21, having their bottom portions 21*d* each unilaterally extended a predetermined length, are used; and in addition, a predetermined set of adjacent bottom portions 21*d* of the L-shaped trench gates 21 opposes each other at the protruding ends, and the interspace between the extended bottom portions 21*d* is set narrower than any other interspace between the trench gates that are perpendicularly formed with respect to the first main surface of the n⁻ layer 1. For these reasons, the mobility of the positive holes injected from the p+ collector layer 7 is restricted, so that the positive holes are accumulated between the predetermined set of the adjacent bottom portions 21d of the L-shaped trench gates 21, and in their proximities. And then, by these accumulated positive holes, the amount of supplied electrons injected, through the channel, from the emitter electrode 6 into the n− layer 1 increases, so that the impedance thereof decreases. As a result, in comparison to conventional power devices, it is possible to reduce the on-state voltage and power loss of the trench-gate IGBT. In addition, because the bottom portions 21d of the L-shaped trench gates 21 are solely constructed by using the first insulation film 22 (i.e., the remaining first insulation films 22A) of an oxide film, in comparison to Embodiment 1, there exists an effect of further simplifying a manufacturing process.

Next, the operations of the trench-gate IGBT turning from the on-state to an off-state will be explained as follows. When in the on-state, a gate voltage applied across the emitter electrode 6 and the gate electrodes 21c is set at zero or biased at a reverse voltage so as to change the IGBT into the off-state, the channel region inverted into the n-type returns into the p-type; thus, the electron injection from the emitter electrode 6 stops. Because the electron injection stops, the positive-hole injection from the p+ collector layer 7 also stops. Subsequently, the electrons and the positive holes accumulated in the n− layer 1 cease to exist by either passing through to the collector electrode 8 and the emitter electrode 6, respectively, or by mutual recombination.

Moreover, in Embodiment 2, similarly to the arrangement of Embodiment 1 as shown in FIG. 18, an n+ buffer layer 18 that is a fourth semiconductor layer of the first conductivity type may be formed between the n− layer 1 and the p+ collector layer 7. In addition, the first semiconductor layer of the first conductivity type (which is an n− layer 1) may be formed as an n layer by adjusting impurity concentration of the second n− layer 1b that constitutes the first semiconductor layer of the first conductivity type. In addition, the n+ emitter regions 4 may be provided contiguously bordering on both lateral sides of the L-shaped trench gates 21 each. Similarly to the Embodiment 1, it is also possible to reduce the on-state voltage and power loss of the trench-gate IGBT.

Furthermore, in Embodiment 2, similarly to the arrangement of Embodiment 1 as shown in FIG. 19, it may be possible to construct in such a way that the interlayer insulation films 5 each are provided to cover each of the n+ emitter regions 4, each top side of the L-shaped trench gates 21, and part of the top-side surface of the p base layer 2; the interspace between a predetermined set of adjacent n+ emitter regions 4 is bridged with the n+ emitter connection region 19 that has been selectively provided in the top side of the p base layer 2; then, the n+ emitter connection region 19 is electrically connected to the emitter electrode 6.

Embodiment 3

Figure 34:
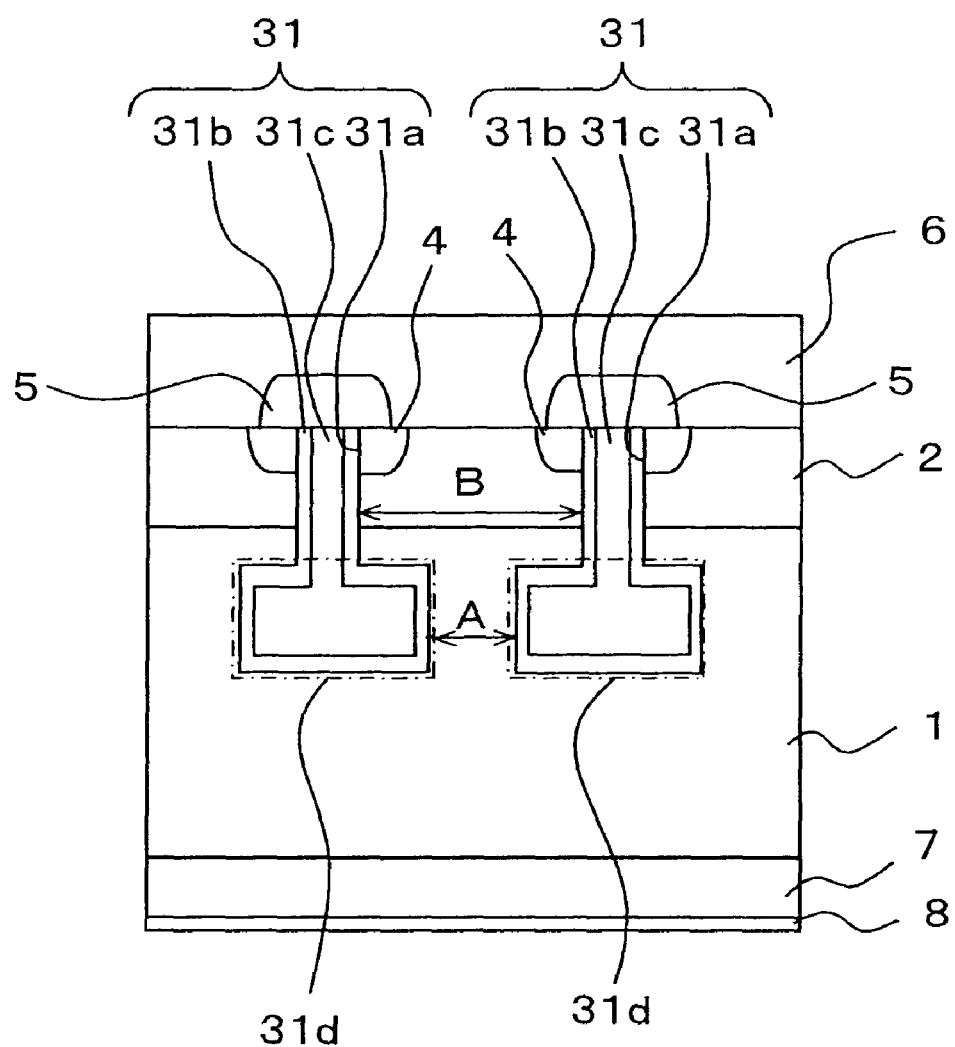
FIG. 34 is a cross-sectional view outlining a structure of a trench-gate IGBT that is a power semiconductor device in Embodiment 3 of the present invention.

Hereafter, Embodiment 3 of the present invention will be explained based on the drawings. FIG. 34 is a cross-sectional view outlining a structure of a trench-gate IGBT that is a power semiconductor device in Embodiment 3 of the present invention. In FIG. 34, there exists the difference in the structure of trench gates when compared to the trench-gate IGBT shown in FIG. 1 in Embodiment 1; namely, a set or a pair of T-shaped trench gates 31 (one of each shaped like an inverted letter "T") are provided, each having trenches 31a, gate insulation films 31b provided to cover the inner surface of the trenches 31a, and in addition, gate electrodes 31c provided with which each space inside surrounded by the gate insulation films 31b is filled. Each of the T-shaped trench gates 31 is provided, from the top-side surface of the p base layer 2, perpendicularly with respect to the first main surface of the n− layer 1, to reach into a location of the n− layer 1; at the lower ends of each of the trench gates 31, bottom portions 31d are provided to bilaterally extend a predetermined length in each direction parallel to the first main surface of the n− layer 1. In addition, an arrangement is made so that the extending inner end of one of the bottom portions 31d of the pair of T-shaped trench gates 31 opposes that of the other bottom portion of the pair of the T-shaped trench gates 31, at the extending inner side of the bottom portions 31d (thus, in their opposing directions). Because of the arrangement, the interspace between a pair of predetermined adjacent bottom portions 31d of T-shaped trench gates 31 at the extending inner ends (the width indicated by the symbol "A" in the figure) is set narrower than any other interspace between the trench-gate parts (sections) that are perpendicularly formed with respect to the first main surface of the n− layer 1 (the width indicated by the symbol "B" in the figure). In addition, in Embodiment 3, a set or two pairs of n+ emitter regions 4 each are selectively provided in the top side of the p base layer 2, on both sides of the T-shaped trench gates 31 from which bottom portions 31d extend, and contiguously bordering on the both sides of the T-shaped trench gates 31. Moreover, in FIG. 34, the same reference numerals and symbols designate the same items as or items corresponding to those shown in FIG. 1 in Embodiment 1; thus, their explanation is omitted.

Next, a method of manufacturing the trench-gate IGBT shown in FIG. 34 will be explained by referring to FIG. 35 through FIG. 51. Moreover, in FIG. 35 through FIG. 51, the same reference numerals and symbols designate the same items as or items corresponding to those shown in FIG. 2 through FIG. 17 in Embodiment 1; thus, the following explanation thereof is carried out.

Figure 35:
FIG. 35 is a structure diagram for explaining a method of manufacturing the trench-gate IGBT in Embodiment 3 of the present invention.
Figure 36:
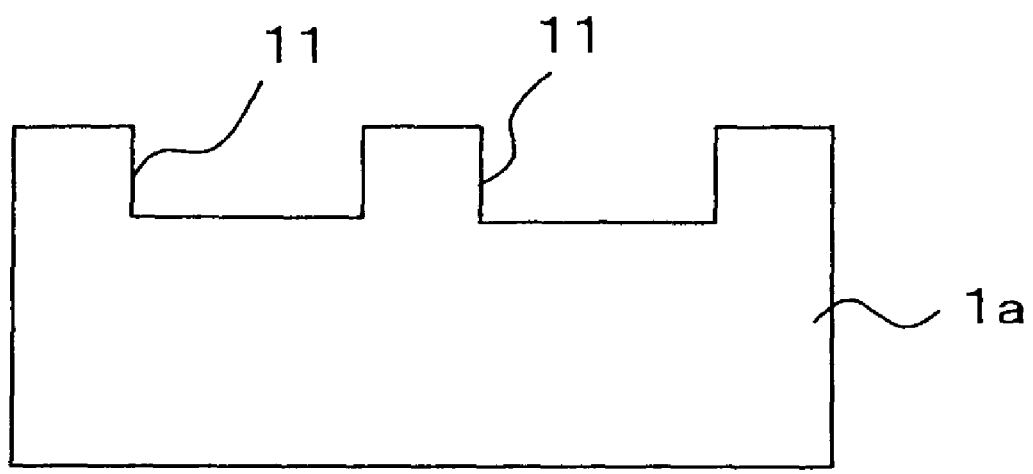
FIG. 36 is a structure diagram for explaining the method of manufacturing the trench-gate IGBT in Embodiment 3 of the present invention.

In the first place, as shown in FIG. 35, after having undergone guard-ring formation for semiconductor-element or unit-cell isolation upon one surface (the "top-side" surface in the figure) of a first n− layer 1a that is a first semiconductor layer of a first conductivity type and is made of a silicon substrate, as shown in FIG. 36, first trenches 11 are selectively formed in the order of 1000 nm in depth. The first trenches 11 are formed by using dry etching. The first trenches 11 form the bottom portions 31d of the T-shaped trench gates 31, which will constitute each part of the trenches 31a.

Figure 37:
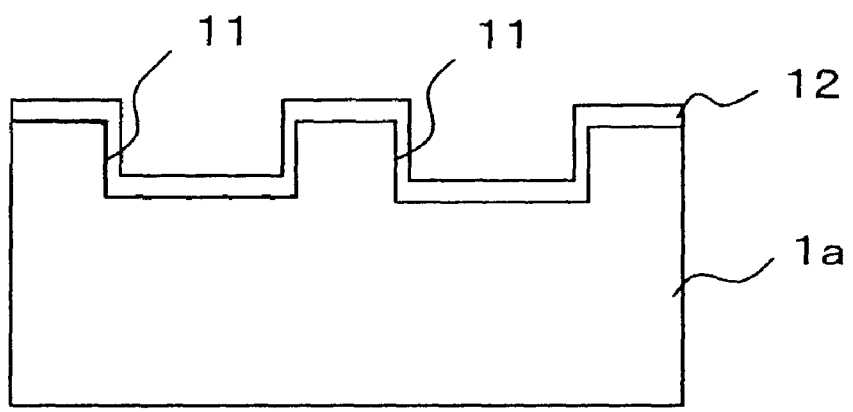
FIG. 37 is a structure diagram for explaining the method of manufacturing the trench-gate IGBT in Embodiment 3 of the present invention.

Next, as shown in FIG. 37, upon the inner surface of the first trenches 11 and one of the surfaces of the first n− layer 1a (hereinafter referred to as "top-side" surface), a first insulation film 12 is formed with and made of an oxide film in the order of 100 nm in thickness. The first insulation film 12 in the figure is formed by using thermal oxidation or CVD.

Figure 38:
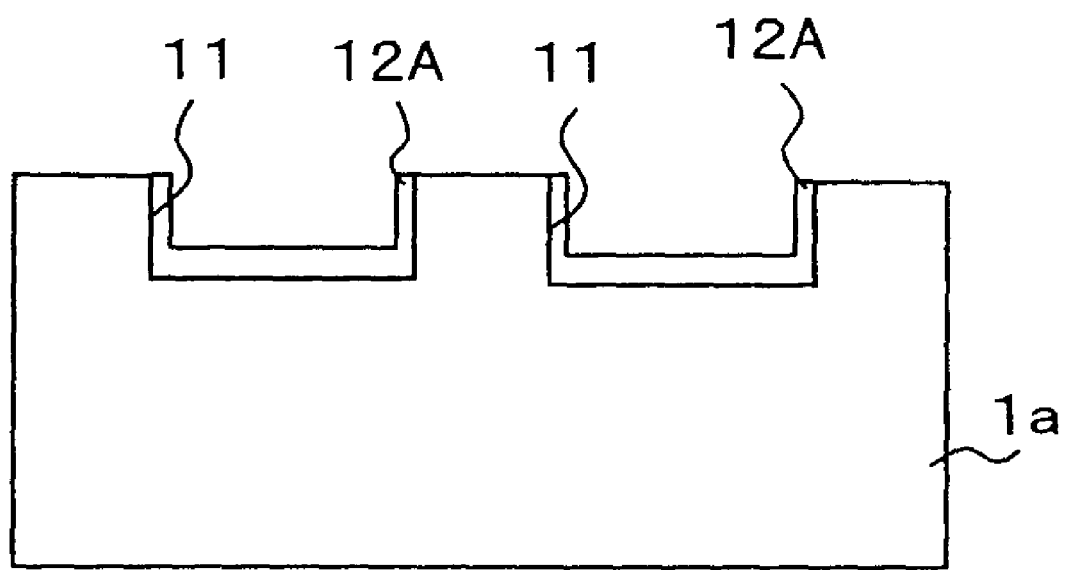
FIG. 38 is a structure diagram for explaining the method of manufacturing the trench-gate IGBT in Embodiment 3 of the present invention.

Next, as shown in FIG. 38, part of the first insulation film 12, having been formed upon the top-side surface of the first n− layer 1a, is removed. Removal of the parts of first conductor 12 is performed by using dry etching or planarization CMP.

Figure 39:
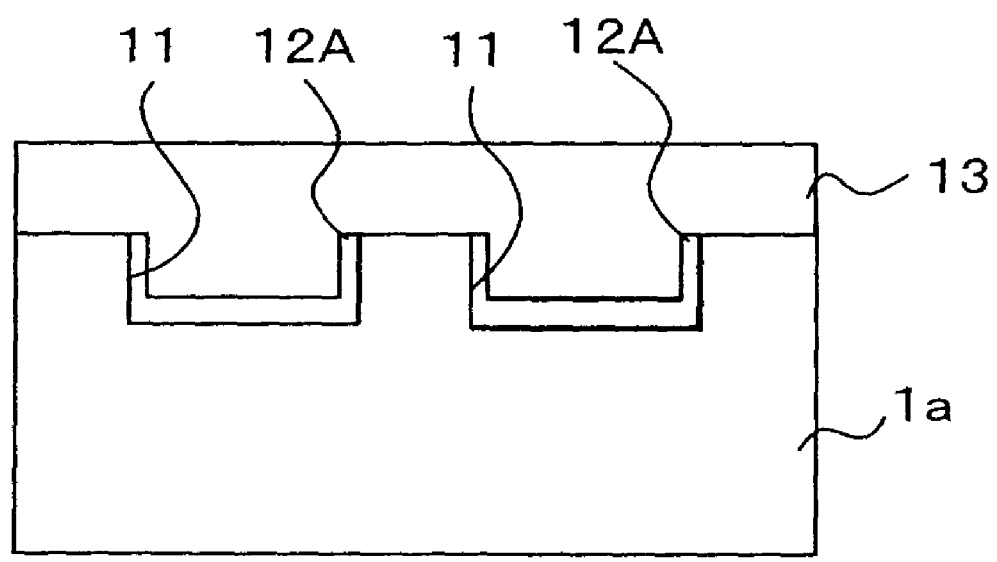
FIG. 39 is a structure diagram for explaining the method of manufacturing the trench-gate IGBT in Embodiment 3 of the present invention.

Next, as shown in FIG. 39, in each space inside surrounded by remaining part of the first insulation films 12A and upon the top-side surface of the first n− layer 1a, a first conductor 13 is formed with and made of a conductive material such as polycrystalline silicon (polysilicon). The first conductor 13 in the figure is formed by using CVD.

Figure 40:
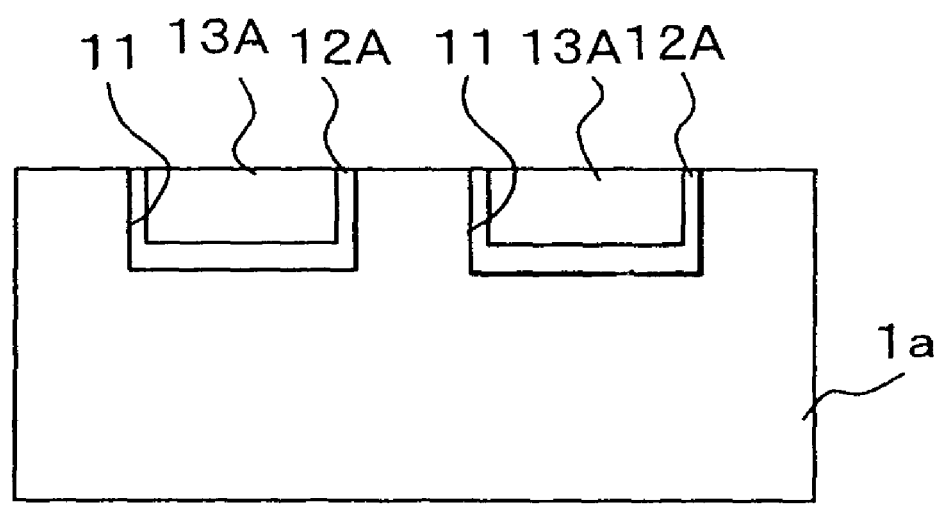
FIG. 40 is a structure diagram for explaining the method of manufacturing the trench-gate IGBT in Embodiment 3 of the present invention.

Next, as shown in FIG. 40, part of the first conductor 13, having been formed upon each space inside surrounded by remaining part of the first insulation films 12A and upon the top-side surface of the first n− layer 1a, is removed. Removal of the part of first conductor 13 is performed by using dry etching or planarization CMP.

Figure 41:
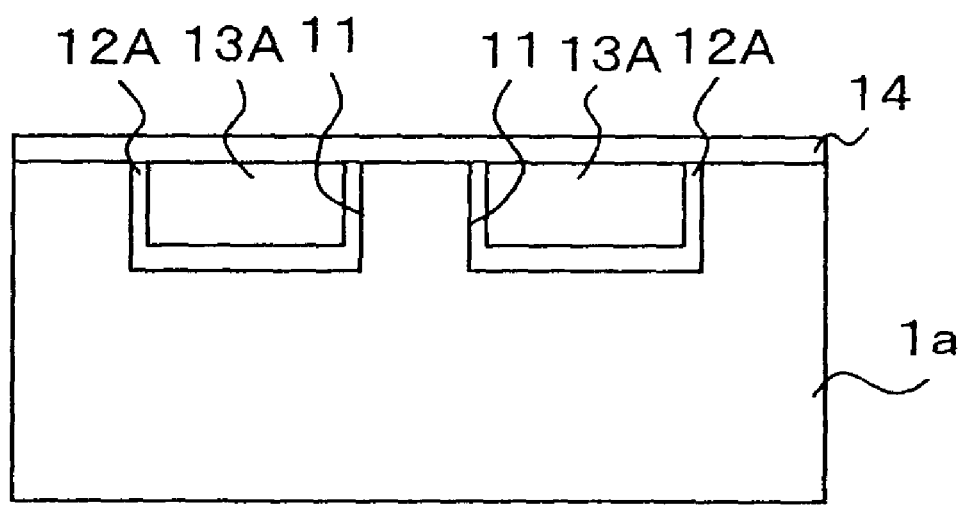
FIG. 41 is a structure diagram for explaining the method of manufacturing the trench-gate IGBT in Embodiment 3 of the present invention.

Next, as shown in FIG. 41, upon the top-side surface of the first n⁻ layer 1a, and upon the remaining parts of the first insulation films 12A and remaining parts of first conductors 13A on this top-side surface, a second insulation film 14 is formed with and made of an oxide film in the order of 100 nm in thickness. The second insulation film 14 in the figure is formed by using thermal oxidation or CVD.

Figure 42:
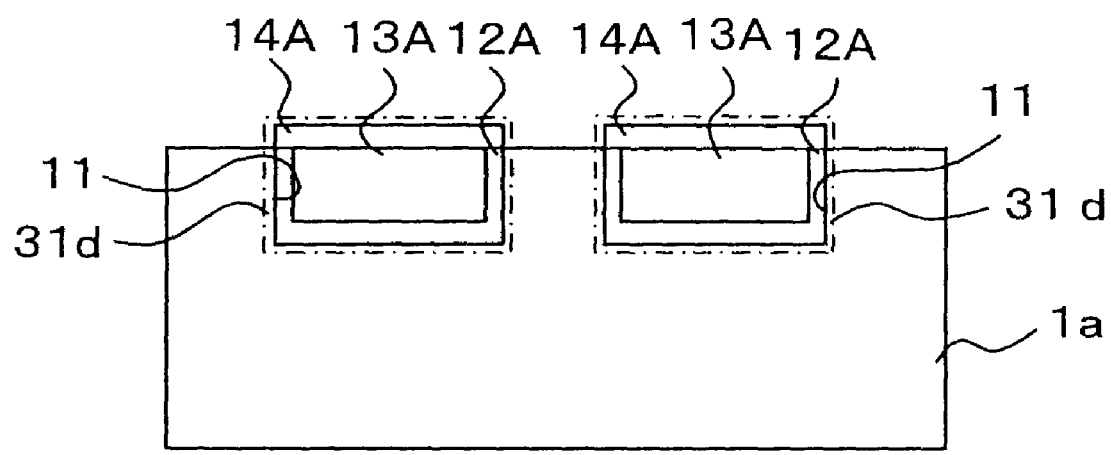
FIG. 42 is a structure diagram for explaining the method of manufacturing the trench-gate IGBT in Embodiment 3 of the present invention.

Next, as shown in FIG. 42, part of the second insulation film 14, having been formed upon the top-side surface of the first n⁻ layer 1a, is selectively removed. Removal of the selected parts of second insulation film 14 is performed by using dry etching or planarization CMP. Note that, each of the bottom portions 31d of the T-shaped trench gates 31 is constructed of each of the first trenches 11, the remaining first conductors 13A, the remaining first insulation films 12A, and the remaining second insulation films 14A.

Figure 43:
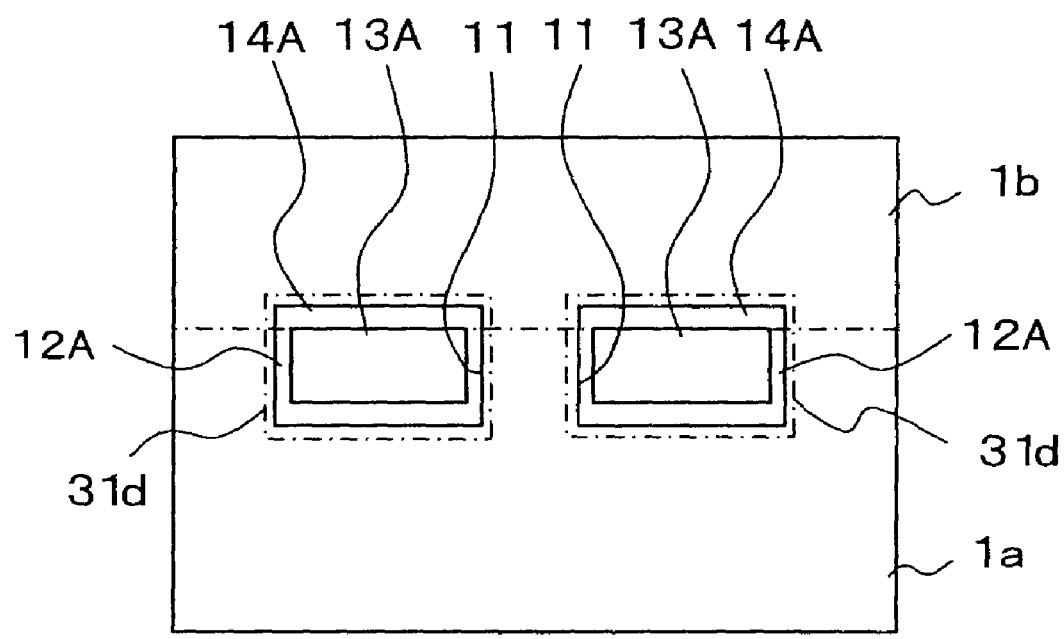
FIG. 43 is a structure diagram for explaining the method of manufacturing the trench-gate IGBT in Embodiment 3 of the present invention.

Next, as shown in FIG. 43, upon the top-side surface of the first n⁻ layer 1a and the remaining second insulation films 14A, a second n⁻ layer 1b that is to be part of a first semiconductor layer of the first conductivity type is formed in the order of 5000 nm in thickness. The second n⁻ layer 1b is an amorphous silicon layer that is formed by CVD, or an epitaxial layer that is formed by an epitaxial growth method. In a case of the amorphous silicon layer, its mono-crystalline layer is obtained by a heat treatment. And then, the n⁻ layer 1 that is the first semiconductor layer of the first conductivity type is constructed by adding the second n⁻ layer 1b to the first n⁻ layer 1a, both having the same impurity concentration. Hereinafter, the n⁻ layer 1 will be taken into consideration for explanatory purposes.

Figure 44:
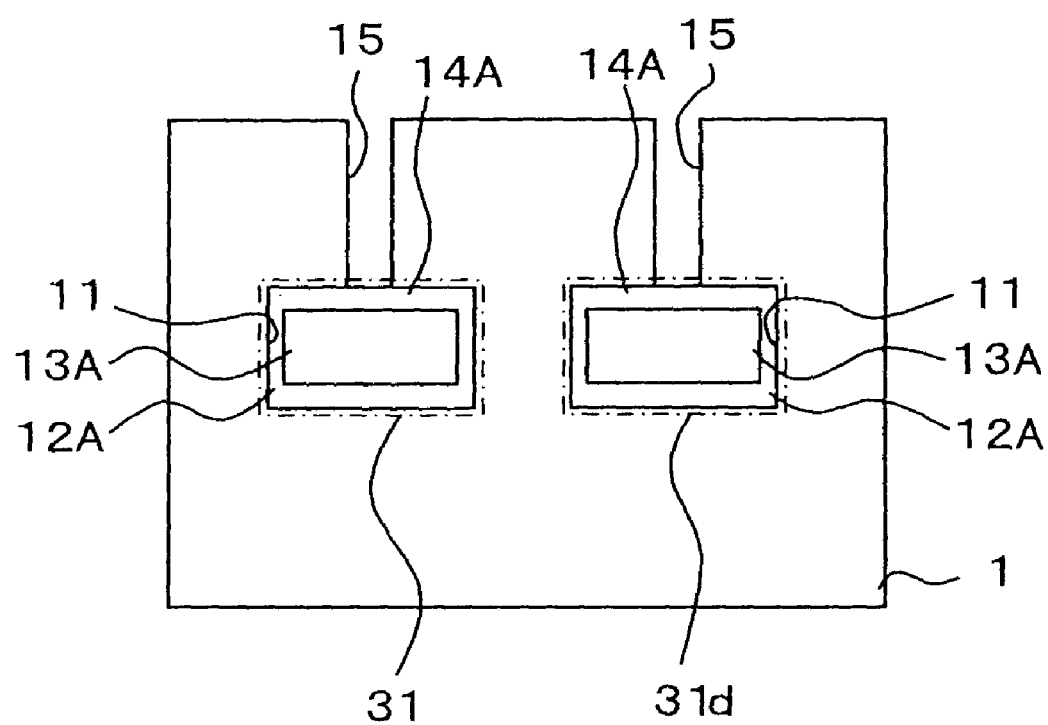
FIG. 44 is a structure diagram for explaining the method of manufacturing the trench-gate IGBT in Embodiment 3 of the present invention.

Next, as shown in FIG. 44, second trenches 15 are formed from the top side of the n⁻ layer 1, perpendicularly with respect to the top-side (or first main) surface of the n⁻ layer 1, to reach each top side of the remaining second insulation films 14A in an intermediate position thereon, usually in each center. The second trenches 15 are formed by using dry etching.

Figure 45:
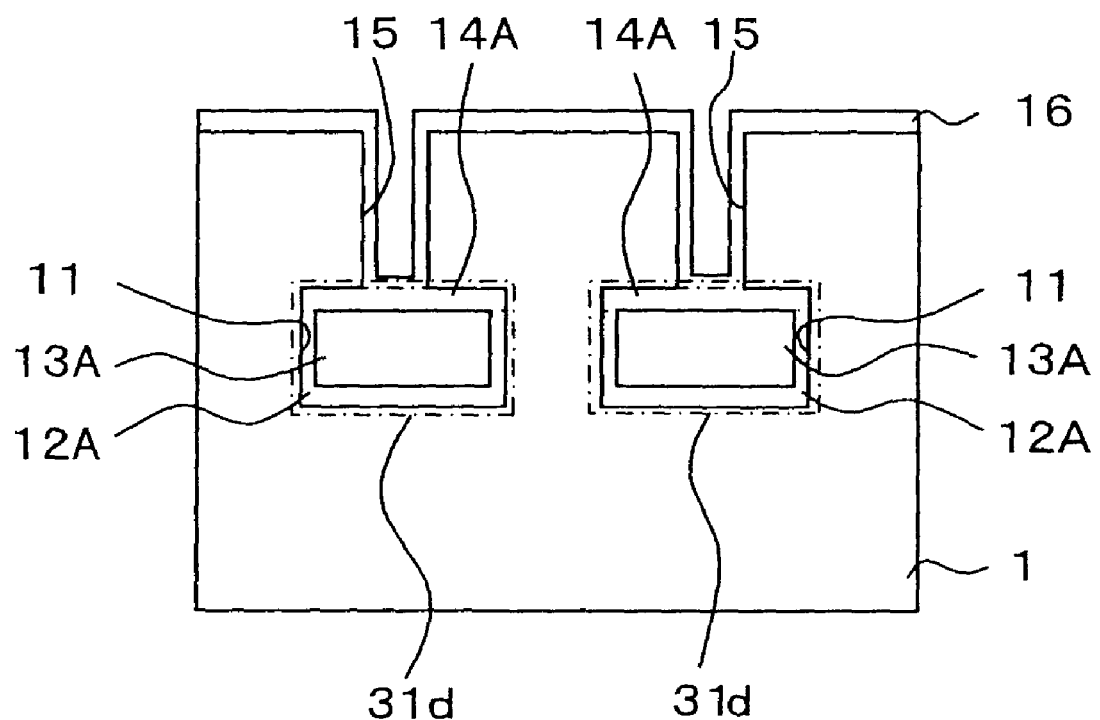
FIG. 45 is a structure diagram for explaining the method of manufacturing the trench-gate IGBT in Embodiment 3 of the present invention.

Next, as shown in FIG. 45, upon the inner surface of the second trenches 15 and the top-side surface of the n⁻ layer 1, a third insulation film 16 is formed with and made of an oxide film in the order of 100 nm in thickness. The third insulation film 16 in the figure is formed by using thermal oxidation or CVD.

Figure 46:
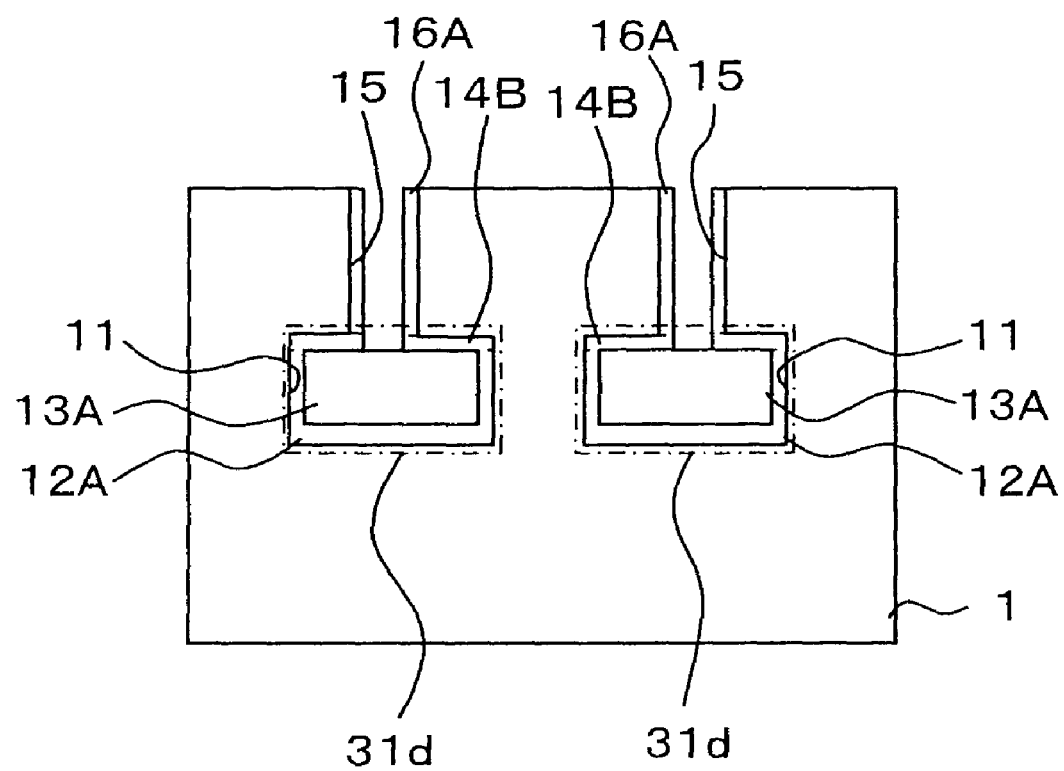
FIG. 46 is a structure diagram for explaining the method of manufacturing the trench-gate IGBT in Embodiment 3 of the present invention.

Next, as shown in FIG. 46, parts of the remaining second insulation films 14A and parts of the third insulation films 16A both of which have been located in the bottom-most parts of the second trenches 15, as well as part of third insulation films 16A upon the top-side surface of the n⁻ layer 1 are removed. Removal of those parts of remaining second insulation films 14A and the third insulation films 16A is performed by using dry etching.

Figure 47:
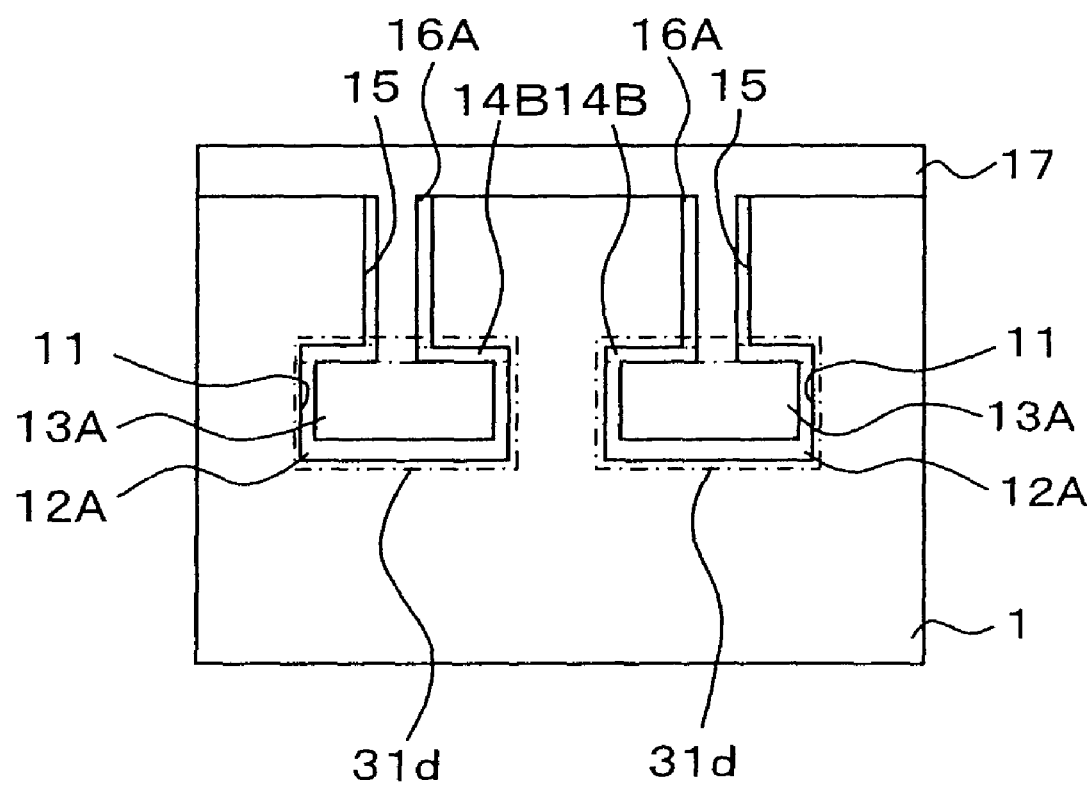
FIG. 47 is a structure diagram for explaining the method of manufacturing the trench-gate IGBT in Embodiment 3 of the present invention.

Next, as shown in FIG. 47, in each space inside surrounded by the remaining second insulation films 14B and remaining third insulation films 16A, and upon the top-side surface of the n⁻ layer 1, a second conductor 17 is formed of a conductive material such as polycrystalline silicon (polysilicon). The second conductor 17 in the figure is formed by using CVD.

Figure 48:
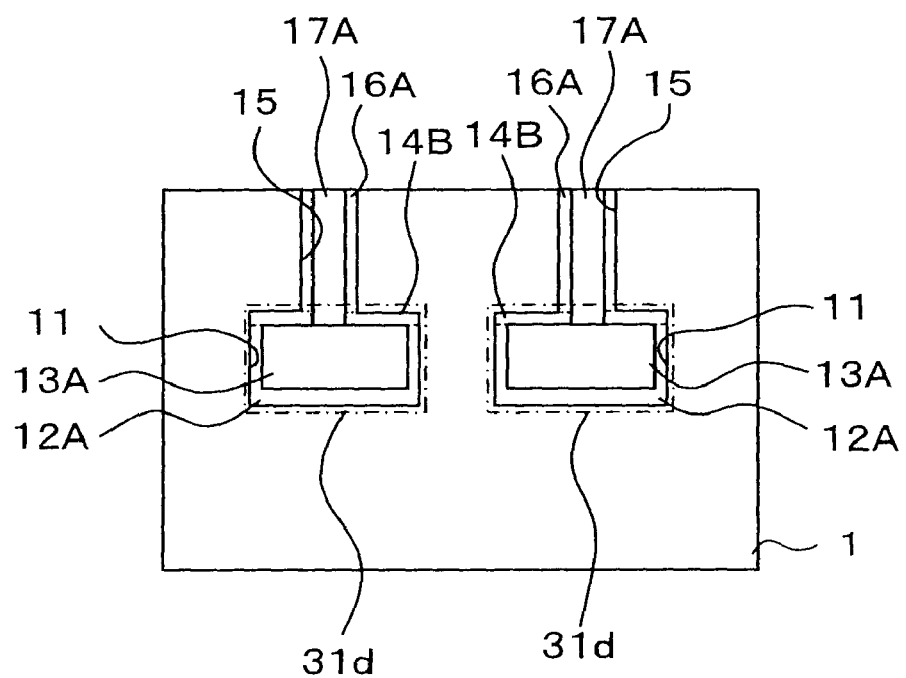
FIG. 48 is a structure diagram for explaining the method of manufacturing the trench-gate IGBT in Embodiment 3 of the present invention.

Next, as shown in FIG. 48, part of the second conductor 17 upon the top-side surface of the n- layer 1 is removed until part of top-side surface of the n⁻ layer 1 is uncovered. Removal of the part of second conductor 17 is performed by using dry etching or planarization CMP.

Here, as can be understood from the T-shaped trench gates 31 shown in FIG. 34, the trenches 31a are constructed of the first trenches 11 and the second trenches 15; the gate insulation films 31b are constructed of the remaining first insulation films 12A, the remaining second insulation films 14B, and the remaining third insulation films 16A; and the gate electrodes 31c are constructed of the remaining first conductors 13A and the remaining second conductors 17A. Hereinafter, these will be referred to as the T-shaped trench gates 31, the trenches 31a, the gate insulation films 31b, and the gate electrodes 31c shown in FIG. 34.

Figure 49:
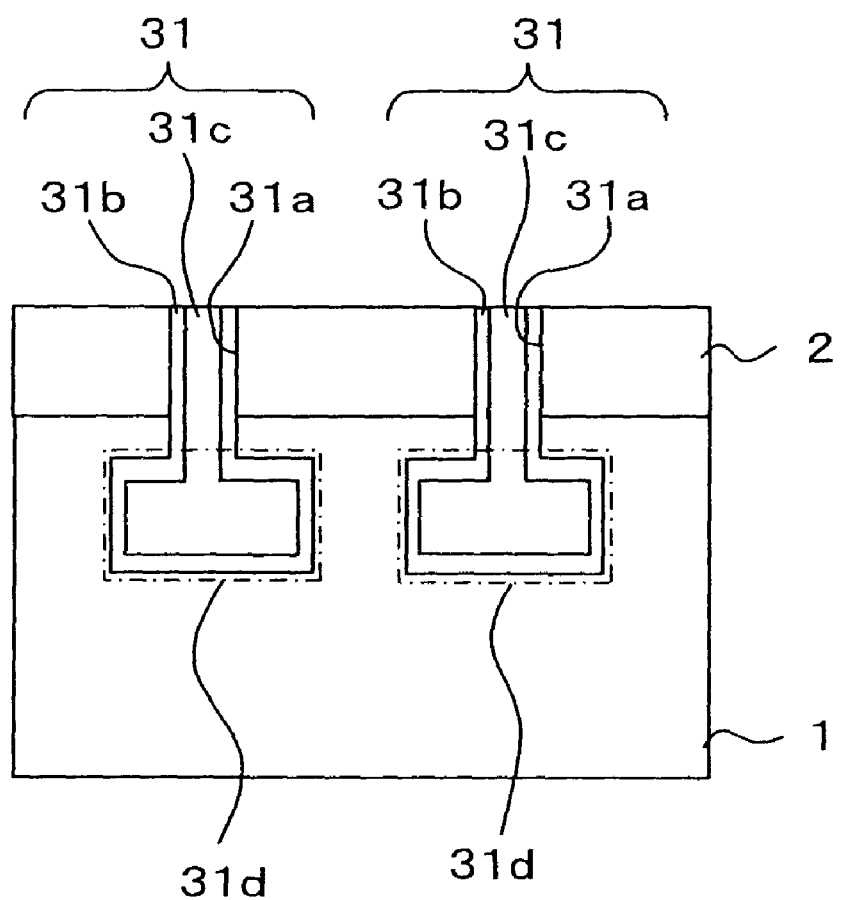
FIG. 49 is a structure diagram for explaining the method of manufacturing the trench-gate IGBT in Embodiment 3 of the present invention.

Next, as shown in FIG. 49, a p base layer 2 that is a second semiconductor layer of the second conductivity type is formed in the top side of the n⁻ layer 1. The p base layer 2 is formed by ion implantation and a heat treatment such as annealing.

Figure 50:
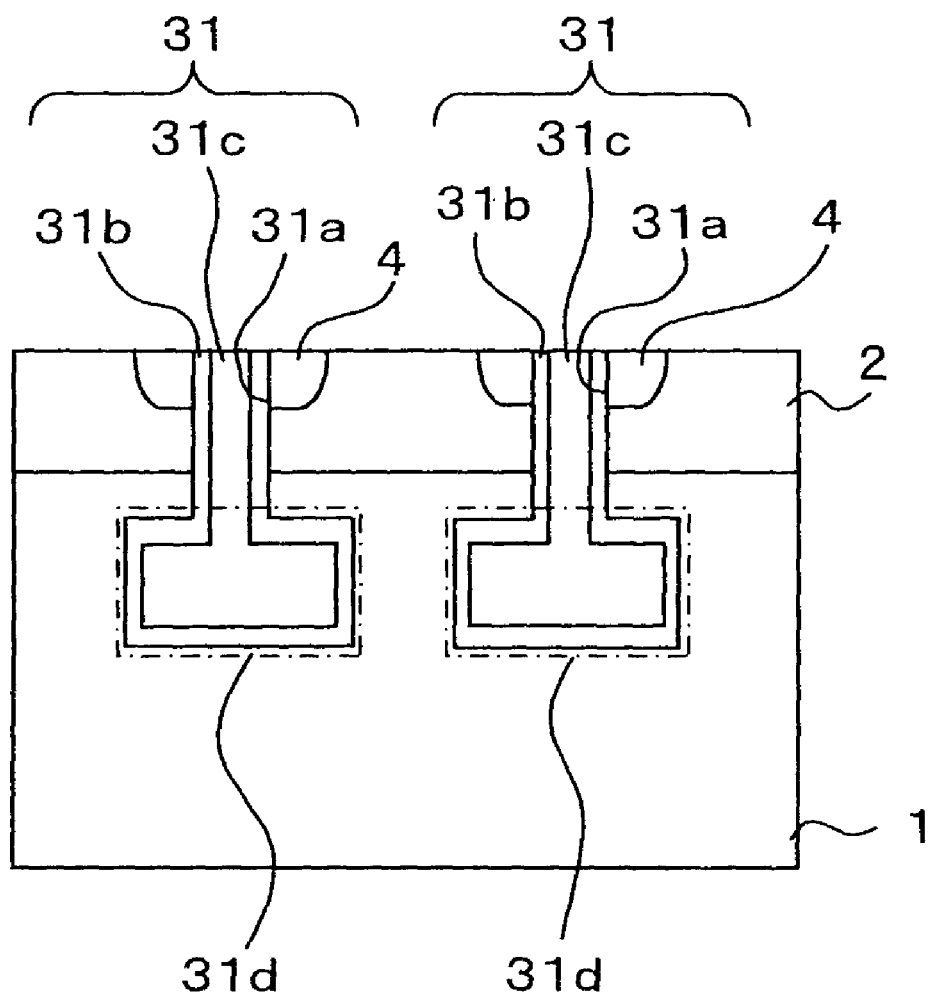
FIG. 50 is a structure diagram for explaining the method of manufacturing the trench-gate IGBT in Embodiment 3 of the present invention.

Next, as shown in FIG. 50, in the top side of the p base layer 2, on both sides of the T-shaped trench gates 31 each whose bottom portions 31d have been extended in parallel, n⁺ emitter regions 4 that are first semiconductor regions of the first conductivity type are selectively formed contiguously bordering on both the lateral sides of the T-shaped trench gates 31. The n⁺ emitter regions 4 are formed by ion implantation and a heat treatment such as annealing.

Figure 51:
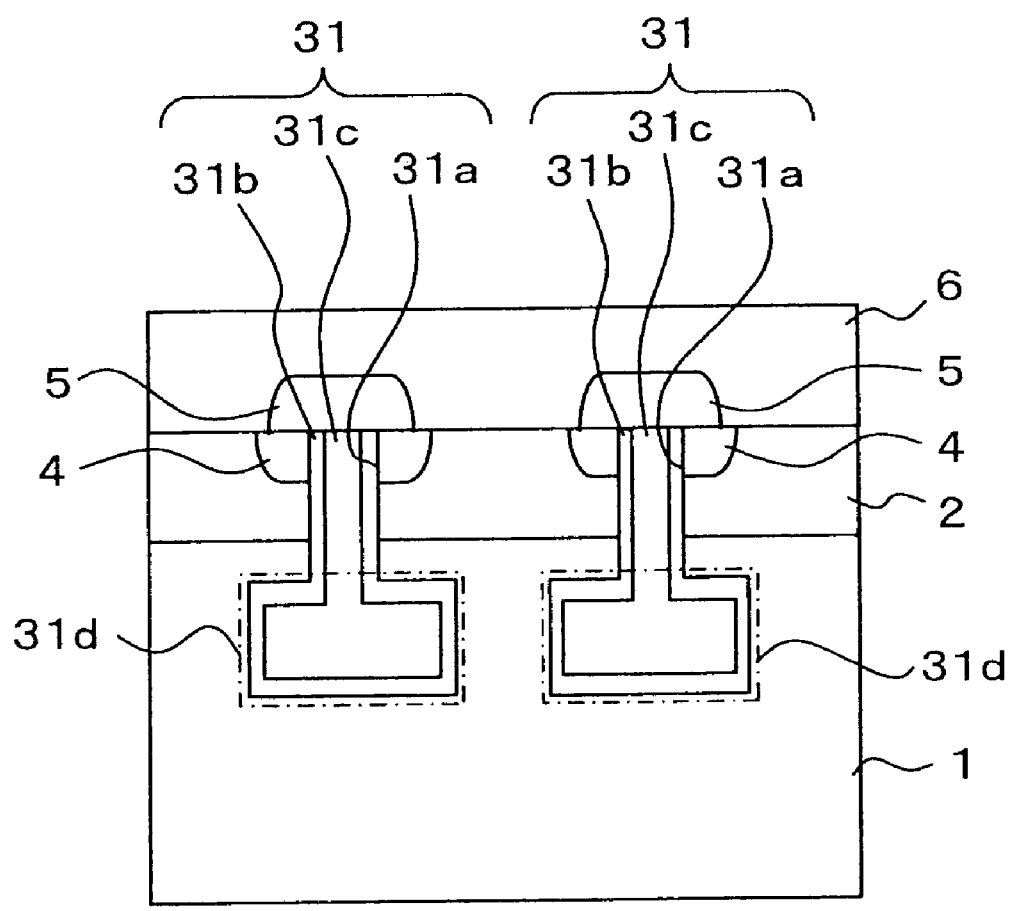
FIG. 51 is a structure diagram for explaining the method of manufacturing the trench-gate IGBT in Embodiment 3 of the present invention.

Next, upon the top-side surfaces of the n⁺ emitter regions 4, the T-shaped trench gates 31 and the p base layer 2, an interlayer insulation film (not shown in FIG. 51) is formed by CVD that is made of a silicate glass (such as borophosphosilicate glass, or BPSG) having good coverage and flatness; and subsequently, in order to uncover parts of the n⁺ emitter regions 4 and the top-side surface of the p base layer 2, part of the interlayer insulation film is selectively removed by using dry etching so as to form interlayer insulation films 5 as shown in FIG. 51.

Moreover, in order to cover the top-side surfaces of the p base layer 2 and the n⁺ emitter regions 4, i.e., the parts not covered with the interlayer insulation films 5, and the upper and both lateral sides of the interlayer insulation films 5, an emitter electrode 6 is formed as a first main electrode that is made of a conductive material such as aluminum. According to the structure as arranged above, the emitter electrode 6 is electrically connected with the n⁺ emitter regions 4. Furthermore, the emitter electrode 6 is formed by using sputtering.

On the other hand, as shown in FIG. 34, a p⁺ collector layer 7 that is a third semiconductor layer of the second conductivity type is formed in the other side of the n⁻ layer 1 (in the "bottom" side in the figure). The p⁺ collector layer 7 is formed by ion implantation and a heat treatment such as annealing.

And then, on the bottom-side surface of the p⁺ collector layer 7, a collector electrode 8 is formed as a second main electrode that is made of a conductive material such as aluminum. The collector electrode 8 is formed by using sputtering.

According to the method of manufacturing described above, the trench-gate IGBT shown in FIG. 34 in Embodiment 3 comes to completion. In implementing the method of manufacturing the trench-gate IGBT in Embodiment 3, although not shown in the preceding figures, when etching or ion implantation is carried out, prior to this process, photoengraving (or photolithography) is performed.

Furthermore, the manufacturing process has been described here as an example only; in particular, the manufacturing process is not necessarily bound by the method described above. It is therefore possible to realize other manufacturing process. It is thus acceptable only that manufacturing of the trench-gate IGBT shown in FIG. 34 finally comes to completion. For example, a process has been shown to form the p base layer 2 in the top side of the n⁻ layer 1 by using, e.g., ion implantation; however, it may be also possible that, while forming the second n⁻ layer 1b, the p base layer 2 is alternatively formed to contain impurities in the second conductivity type. In addition, although the process is shown to form the p base layer 2 and the n⁺ emitter regions 4 after having formed the T-shaped trench gates 31, the T-shaped trench gates 31 may be formed after having formed the p base layer 2 and the n⁺ emitter regions 4. In addition, the first n⁻ layer 1a that is an n-type substrate has been placed as the basis; however, it may be possible to use a p-type substrate for the p⁺ collector layer 7, and the p-type substrate is placed as the basis. In this case, the n⁻ layer 1 is formed upon the p⁺ collector layer 7 that is made of the p-type substrate.

Next, the operations of the trench-gate IGBT in Embodiment 3 of the present invention will be explained.

When a predetermined collector voltage is applied across the emitter electrode 6 and the collector electrode 8, and a predetermined gate voltage that can bring the IGBT into an on-state is supplied across the emitter electrode 6 and the gate electrodes 31c, a channel region in the p base layer 2 is inverted into the n-type; thus, a channel is established.

Through the channel being established, electrons are injected from the emitter electrode 6 into the n⁻ layer 1. And then, by the injected electrons, the interspace between the p⁺ collector layer 7 and the n⁻ layer 1 is forward-biased; thus, positive holes are injected from the p⁺ collector layer 7. As a result, impedance of the n⁻ layer 1 is reduced, and the amount of current flowing through the IGBT (its current-currying capability) is increased, so that the IGBT is turned into an on-state.

Moreover, in Embodiment 3, in the directions parallel to the first main surface of the n⁻ layer 1, a set of T-shaped trench gates 31, having their bottom portions 31d each bilaterally extended a predetermined length, are used; and in addition, a predetermined set of adjacent bottom portions 31d of the T-shaped trench gates 31 opposes each other at the protruding ends, and the interspace between the extended bottom portions 31d at the extending inner ends is set narrower than any other interspace between the trench gates that are perpendicularly formed with respect to the first main surface of the n⁻ layer 1. For these reasons, the mobility of the positive holes injected from the p⁺ collector layer 7 is restricted, so that the positive holes are accumulated between the predetermined set of the adjacent bottom portions 31d of the T-shaped trench gates 31, and in their proximities. And then, by these accumulated positive holes, the amount of supplied electrons injected, through the channel, from the emitter electrode 6 into the n⁻ layer 1 increases, so that the impedance thereof decreases. As a result, in comparison to conventional power devices, it is possible to reduce the on-state voltage and power loss of the trench-gate IGBT. In addition, the bottom portions 31d thereof are flatter in comparison to bottom portions of conventional trench gates; therefore, electric field intensity is mitigated around the bottom portions 31d. For this reason, there exists an effect of increasing performance of withstand (blocking) voltage between the collector and the emitter.

Next, the operations of the trench-gate IGBT turning from the on-state to an off-state will be explained as follows. When in the on-state, a gate voltage applied across the emitter electrode 6 and the gate electrodes 31c is set at zero or biased at a reverse voltage so as to change the IGBT into the off-state, the channel region inverted into the n-type returns into the p-type; thus, the electron injection from the emitter electrode 6 stops. Because the electron injection stops, the positive-hole injection from the p⁺ collector layer 7 also stops. Subsequently, the electrons and the positive holes accumulated in the n⁻ layer 1 cease to exist by either passing through to the collector electrode 8 and the emitter electrode 6, respectively, or by mutual recombination.

Moreover, according to Embodiment 3, it is shown that the p⁺ collector layer 7 is formed on the second main surface of the n⁻ layer 1; however, similarly to the arrangement of Embodiment 1 as shown in FIG. 18, an n⁺ buffer layer 18 that is a fourth semiconductor layer of the first conductivity type may be formed between the n⁻ layer 1 and the p⁺ collector layer 7.

In addition, according to Embodiment 3, it is shown that the first semiconductor layer of the first conductivity type (as an n⁻ layer 1) is formed by adding the second n⁻ layer 1b to the first n⁻ layer 1a (as in FIG. 43); however, the first semiconductor layer of the first conductivity type may be formed as an n layer by adjusting impurity concentration of the second n⁻ layer 1b.

Furthermore, in Embodiment 3, similarly to the arrangement of Embodiment 1 as shown in FIG. 19, it may be possible to construct in such a way that the interlayer insulation films 5 each are provided to cover each of the n⁺ emitter regions 4, each top side of the T-shaped trench gates 31, and part of the top-side surface of the p base layer 2; the interspace between a predetermined set of adjacent n⁺ emitter regions 4 is bridged with the n⁺ emitter connection region 19 that has been selectively provided in the top side of the p base layer 2; then, the n⁺ emitter connection region 19 is electrically connected to the emitter electrode 6.

Embodiment 4

Figure 52:
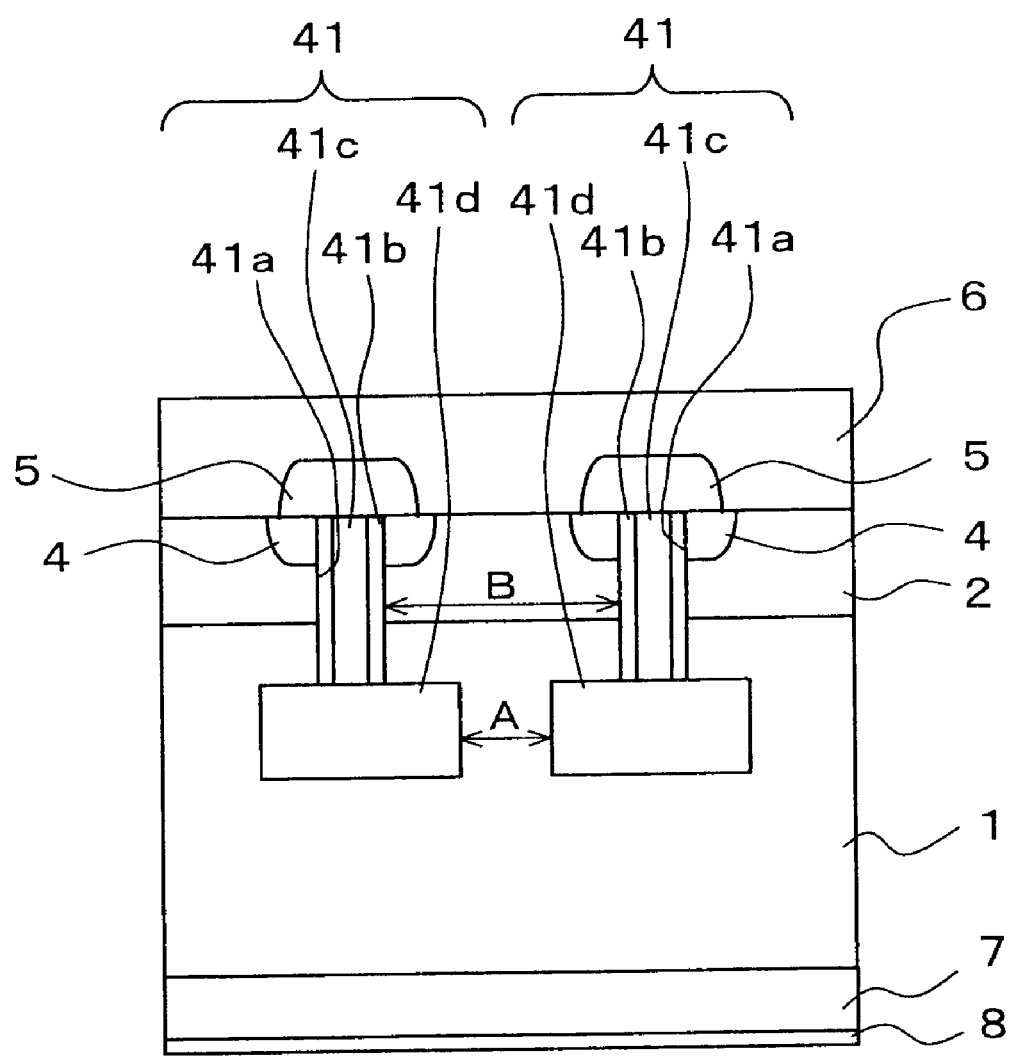
FIG. 52 is a cross-sectional view outlining a structure of a trench-gate IGBT that is a power semiconductor device in Embodiment 4 of the present invention.

In Embodiment 3, including the bottom portions 31d, a set or a pair of T-shaped trench gates 31 are structured having the trenches 31a, the gate insulation films 31b provided to cover the inner surface of the trenches 31a, and in addition, the gate electrodes 31c provided with which each space inside surrounded by the gate insulation films 31b is filled; however, it may be possible to make an arrangement in that, the bottom portions 31d are identically formed with and made of a dielectric material such as an oxide described in Embodiment 2, and are provided as bottom portions 41d shown in FIG. 52; similarly to the arrangement of Embodiment 3, the trench-gate parts (sections) perpendicularly formed with respect to the first main surface of the n⁻ layer 1 are structured having trenches 41a, gate insulation films 41b provided to cover each inner surface of the trenches 41a, and in addition, gate electrodes 41c provided with which each space inside surrounded by the gate insulation films 41b is filled.

The operations of a trench-gate IGBT in Embodiment 4 of the present invention are comparably equal to the operations explained in Embodiment 3. Thus, in comparison to conventional power devices, it is also possible to reduce the on-state voltage and power loss of the trench-gate IGBT. In addition, because the bottom portions 41d of T-shaped trench gates 41 are solely formed of a dielectric material, in comparison to Embodiment 3, there exists an effect of further simplifying a manufacturing process. Moreover, in implementing a method of manufacturing the trench-gate IGBT in Embodiment 4, the method of manufacturing explained in Embodiment 2 can be applied.

Furthermore, in Embodiment 4, similarly to the arrangement of Embodiment 1 as shown in FIG. 19, it may be possible to construct in such a way that the interlayer insulation films 5 each are provided to cover each of the n⁺ emitter regions 4, each top side of the T-shaped trench gates 41, and part of the top-side surface of the p base layer 2; the interspace between a predetermined set of adjacent n⁺ emitter regions 4 is bridged with the n+ emitter connection region 19 that has been selectively provided in the top side of the p base layer 2; then, the n+ emitter connection region 19 is electrically connected to the emitter electrode 6.

Embodiment 5

Figure 53:
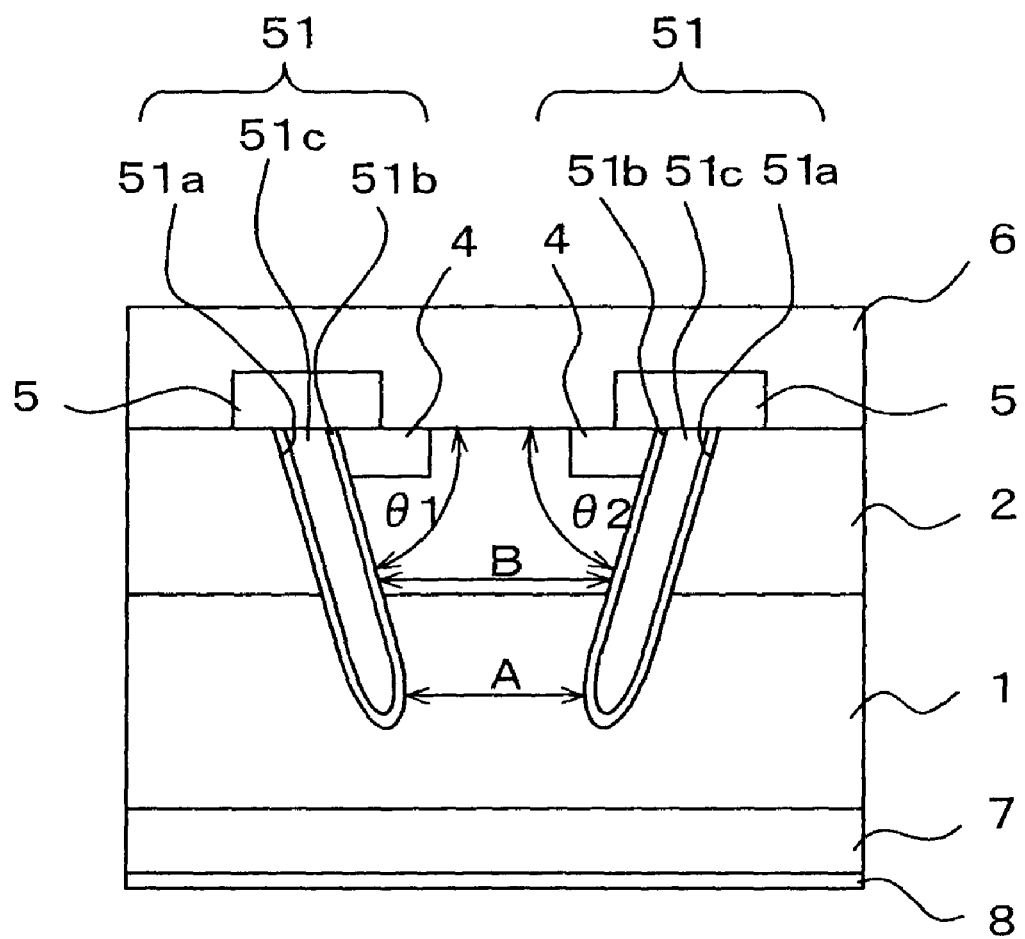
FIG. 53 is a cross-sectional view outlining a structure of a trench-gate IGBT that is a power semiconductor device in Embodiment 5 of the present invention.

Hereafter, Embodiment 5 of the present invention will be explained based on the drawings. FIG. 53 is a cross-sectional view outlining a structure of a trench-gate IGBT that is a power semiconductor device in Embodiment 5 of the present invention. In FIG. 53, a p base layer 2 that is a second semiconductor layer of a second conductivity type is provided upon a first main surface (namely, the "top-side" surface in the figure) of an n− layer 1 that is a first semiconductor layer of a first conductivity type.

And then, a set or a pair of trench gates 51 are provided, each having trenches 51a that pass from the top side of the p base layer 2 through into the n− layer 1; gate insulation films 51b that are made of an oxide film and provided to cover the inner surface of the trenches 51a; and in addition, gate electrodes 51c that are provided with which each space inside surrounded by the gate insulation films 51b is filled. An arrangement is made in that, each of the trench gates 51 is provided having a predetermined tilt from a perpendicular with respect to the first main surface of the n− layer 1 (tilt angles θ1 and θ2 are shown in the figure such that usually θ1=θ2, and each of the angles θ1 and θ2 is less than 90°, namely θ1<90° and θ2<90°). In addition, each of the trench gates 51 is provided, with adjacent ones of the trench gates 51 at the tilting inner side, so that they are tilting toward each other. Because of the arrangement, the interspace between a pair of predetermined adjacent bottom portions of the trench gates 51 placed in the n− layer 1 (the width indicated by the symbol "A" in the figure) is set narrower than any other interspace between the trench-gate parts (sections) other than the bottom portions (the width indicated, for example, by the symbol "B" in the figure).

Moreover, in the top side of the p base layer 2, on each side of the trench gates 51 each (of whose bottom portions) tilts toward the other, and on the contiguously bordering sides of the trench gates 51, a set or a pair of n+ emitter regions 4 that are first semiconductor regions of the first conductivity type are selectively provided. In addition, interlayer insulation films 5 each are provided to cover a large part of the top side of each of the n+ emitter regions 4, each top side of the trench gates 51, and a part of the top-side surface of the p base layer 2; in addition, an emitter electrode 6 that is a first main electrode is provided to cover the remaining top-side surface of the n+ emitter regions 4, i.e., the parts not covered by the interlayer insulation films 5, the entire surface of the interlayer insulation films 5, and the remaining top-side surface of the p base layer 2.

On the other hand, a p+ collector layer 7 that is a third semiconductor layer of the second conductivity type is provided on a second main surface (namely, the "bottom-side" surface in the figure) of the n− layer 1; in addition, a collector electrode 8 that is a second main electrode is provided on the bottom-side surface of the p+ collector layer 7. Moreover, in FIG. 53, the same reference numerals and symbols designate the same items as or items corresponding to those shown in FIG. 1 in Embodiment 1.

Next, a method of manufacturing the trench-gate IGBT shown in FIG. 53 will be explained by referring to FIG. 54 through FIG. 63. Moreover, in FIG. 54 through FIG. 63, the same reference numerals and symbols designate the same items as or items corresponding to those shown in FIG. 2 through FIG. 17 in Embodiment 1; thus, the following explanation thereof is carried out.

Figure 54:
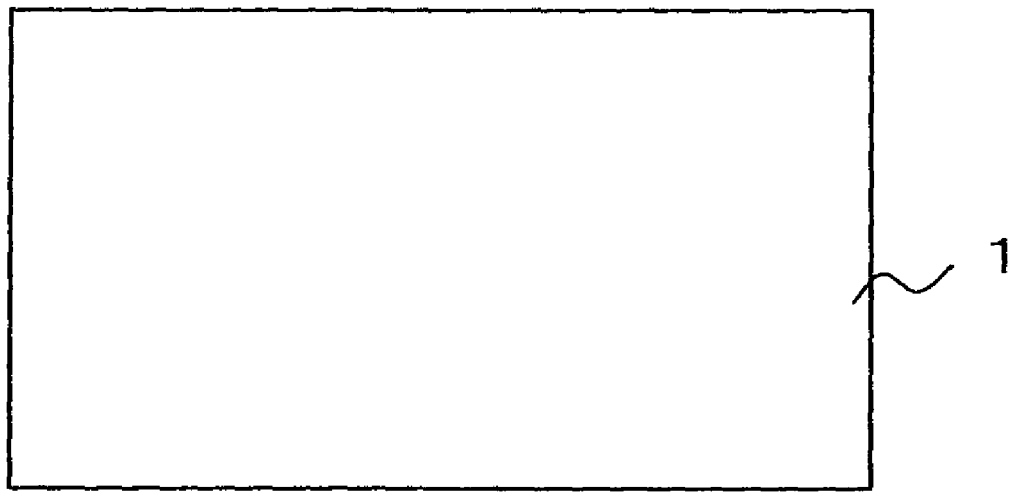
FIG. 54 is a structure diagram for explaining a method of manufacturing the trench-gate IGBT in Embodiment 5 of the present invention.
Figure 55:
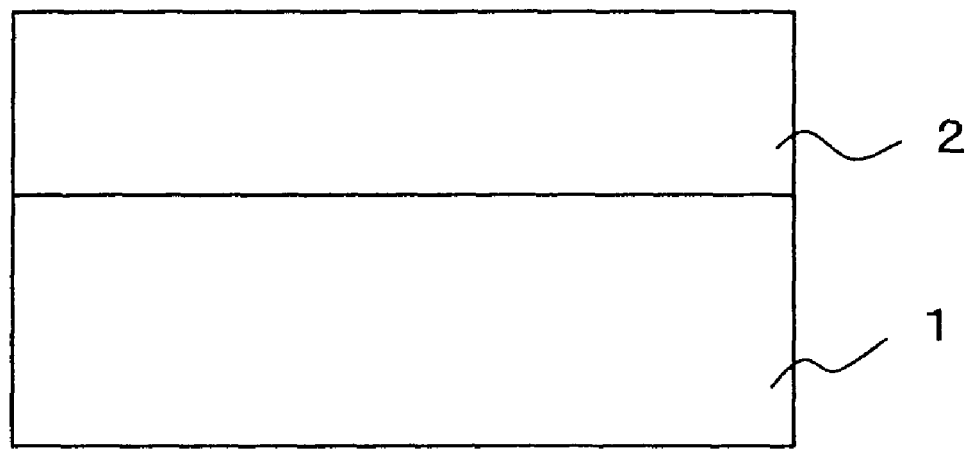
FIG. 55 is a structure diagram for explaining the method of manufacturing the trench-gate IGBT in Embodiment 5 of the present invention.

In the first place, as shown in FIG. 54, after having undergone guard-ring formation for semiconductor-element or unit-cell isolation upon one surface (the "top-side" surface in the figure) of a first n− layer 1 that is a first semiconductor layer of a first conductivity type and is made of a silicon substrate, as shown in FIG. 55, a p base layer 2 that is a second semiconductor layer of a second conductivity type is formed in the top side of the n− layer 1. The p base layer 2 is formed by ion implantation and a heat treatment such as annealing.

Figure 56:
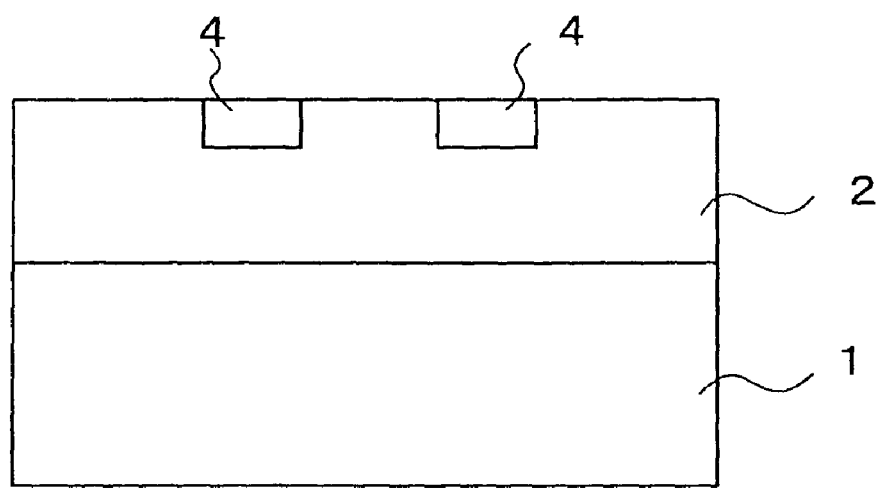
FIG. 56 is a structure diagram for explaining the method of manufacturing the trench-gate IGBT in Embodiment 5 of the present invention.

Next, as shown in FIG. 56, in the top side of the p base layer 2, a set or a pair of n+ emitter regions 4 that are first semiconductor regions of the first conductivity type are selectively formed. The n+ emitter regions 4 are formed by ion implantation and a heat treatment such as annealing.

Figure 57:
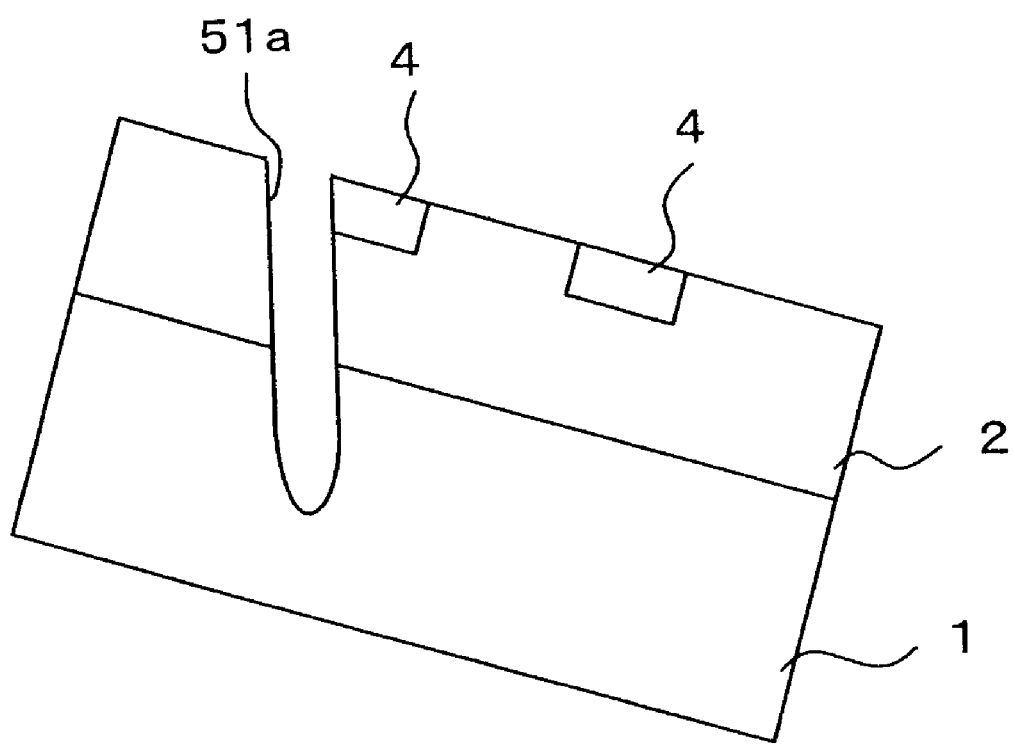
FIG. 57 is a structure diagram for explaining the method of manufacturing the trench-gate IGBT in Embodiment 5 of the present invention.
Figure 58:
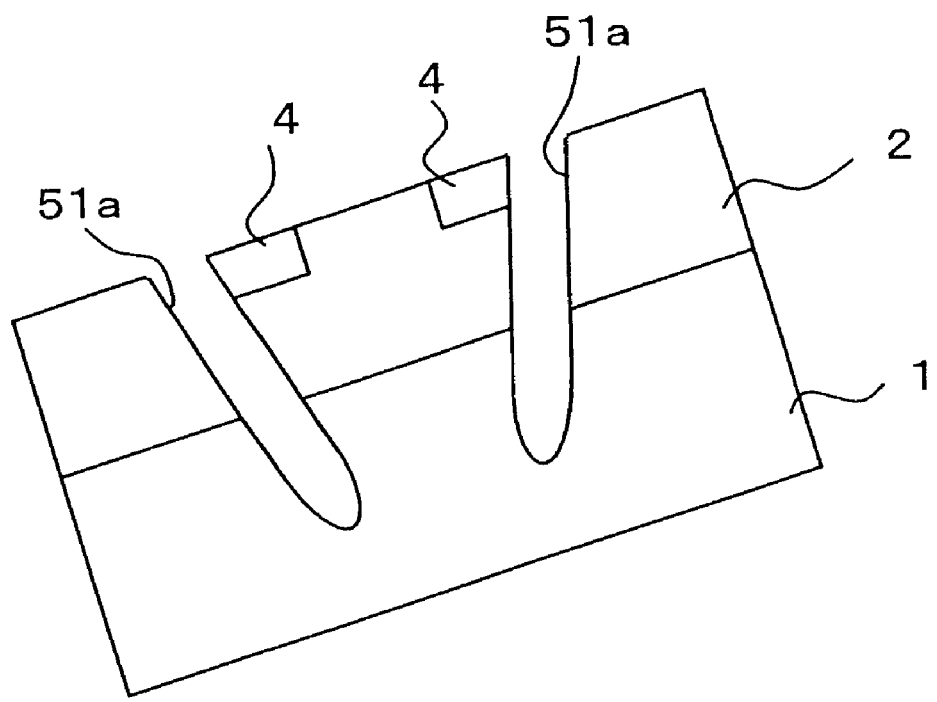
FIG. 58 is a structure diagram for explaining the method of manufacturing the trench-gate IGBT in Embodiment 5 of the present invention.

Next, as shown in FIG. 57 and FIG. 58, from the top side of the p base layer 2, trenches 51a each are formed having a predetermined tilt from a perpendicular with respect to the top-side surface of the n− layer 1, contiguously bordering on each of the n+ emitter regions 4 having been selectively formed associated with the trenches 51a each (of whose bottom portions) tilts toward the other, and reaching into a location of the n− layer 1. In addition, each of the trenches 51a is formed, with predetermined adjacent ones of the trenches 51a at the tilting inner side, so that they are tilting toward each other. Moreover, the trenches 51a are formed by using dry etching. In each case, the dry etching is performed with a predetermined tilt angle kept with respect to the top-side surface of the p− layer 1. Here, the n− layer 1 that is the silicon substrate is held in a state having the predetermined tilt angle.

Figure 59:
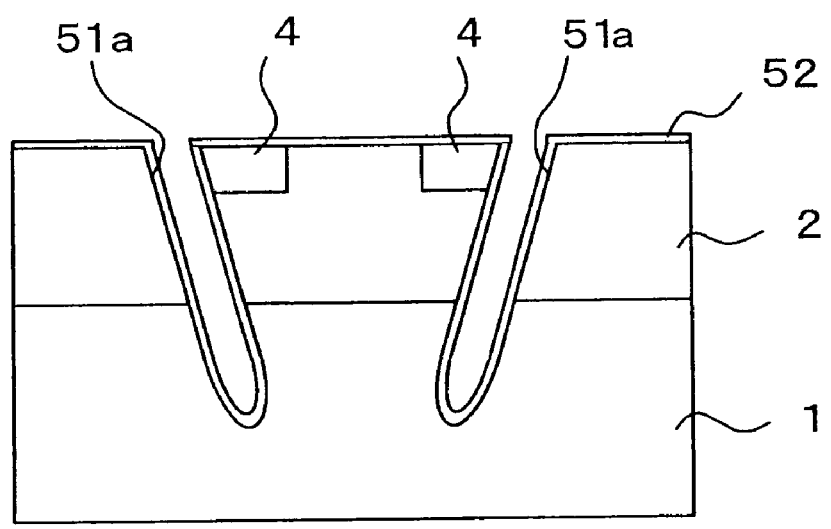
FIG. 59 is a structure diagram for explaining the method of manufacturing the trench-gate IGBT in Embodiment 5 of the present invention.

Next, as shown in FIG. 59, upon the inner surface of the trenches 51a, and upon the top-side surfaces of the n+ emitter regions 4 and the p base layer 2, a first insulation film 52 is formed with and made of an oxide film in the order of 100 nm in thickness. The first insulation film 52 in the figure is formed by using thermal oxidation or CVD.

Figure 60:
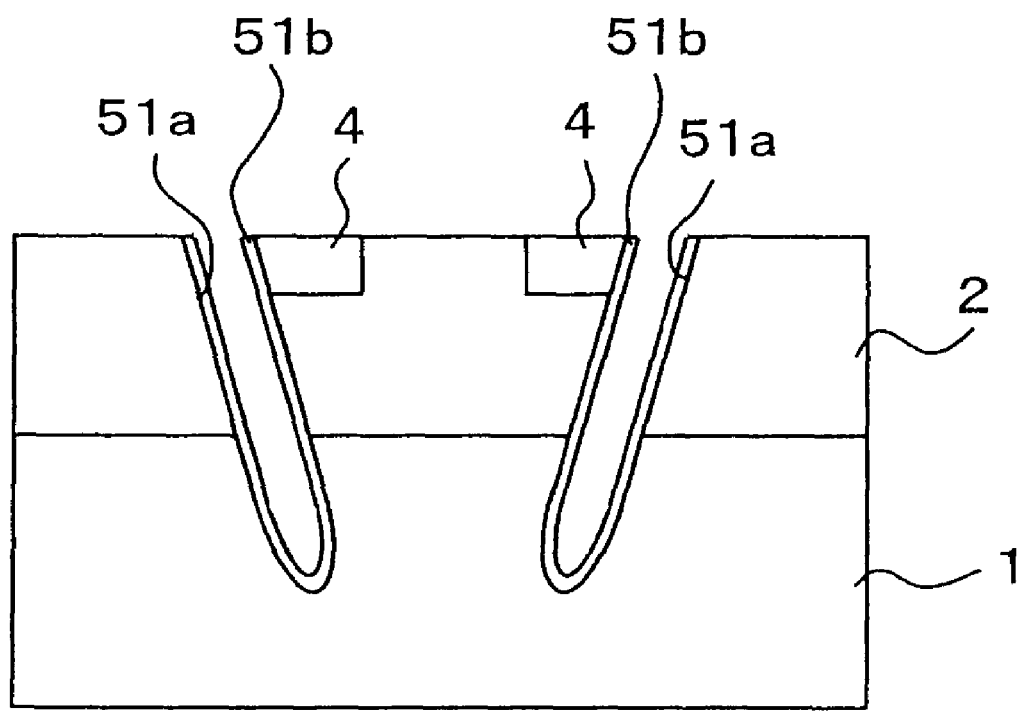
FIG. 60 is a structure diagram for explaining the method of manufacturing the trench-gate IGBT in Embodiment 5 of the present invention.

Next, as shown in FIG. 60, part of the first insulation film 52, having been formed upon the top-side surfaces of the n+ emitter regions 4 and the p base layer 2, is removed. By this removal, insulation films are formed in each space inside the trenches 51a surrounded by remaining parts of the first insulation film 52; note that, these insulation films are equivalent to the gate insulation films 51b. Hereinafter, the gate insulation films 51b will be taken into consideration for explanatory purposes. Moreover, removal of the parts of the first insulation film 52 is performed by using dry etching or planarization CMP.

Figure 61:
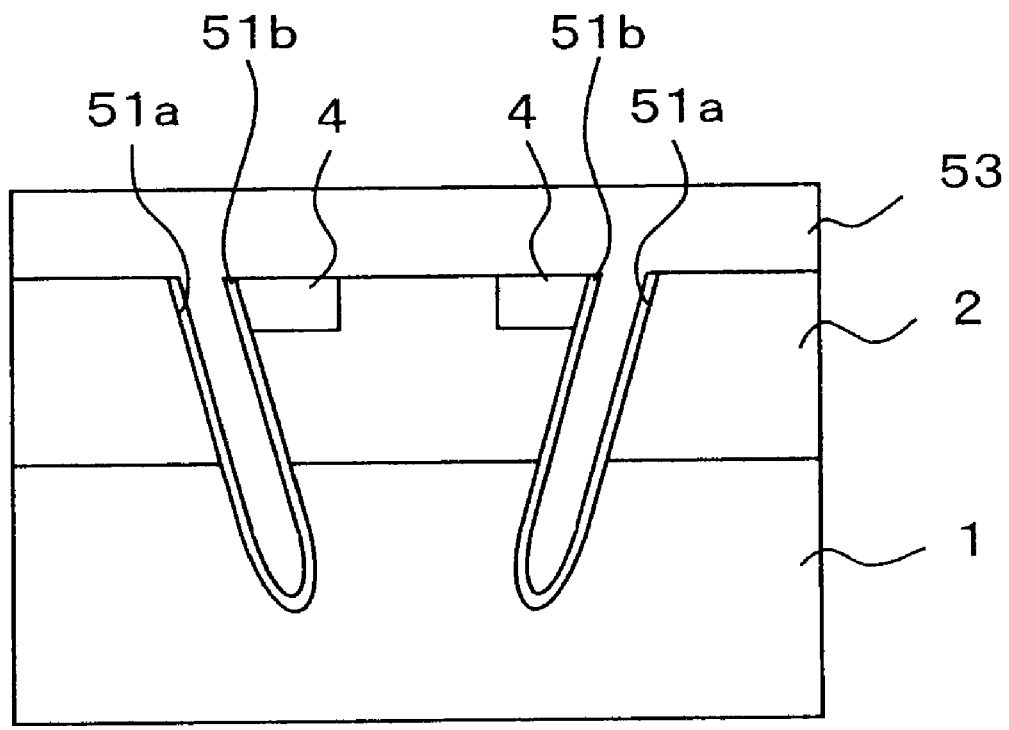
FIG. 61 is a structure diagram for explaining the method of manufacturing the trench-gate IGBT in Embodiment 5 of the present invention.

Next, as shown in FIG. 61, in each space inside surrounded by the gate insulation films 51b, and upon the top-side surfaces of the n+ emitter regions 4 and the p base layer 2, a first conductor 53 is formed of a conductive material such as polycrystalline silicon (polysilicon). The first conductor 53 in the figure is formed by using CVD.

Figure 62:
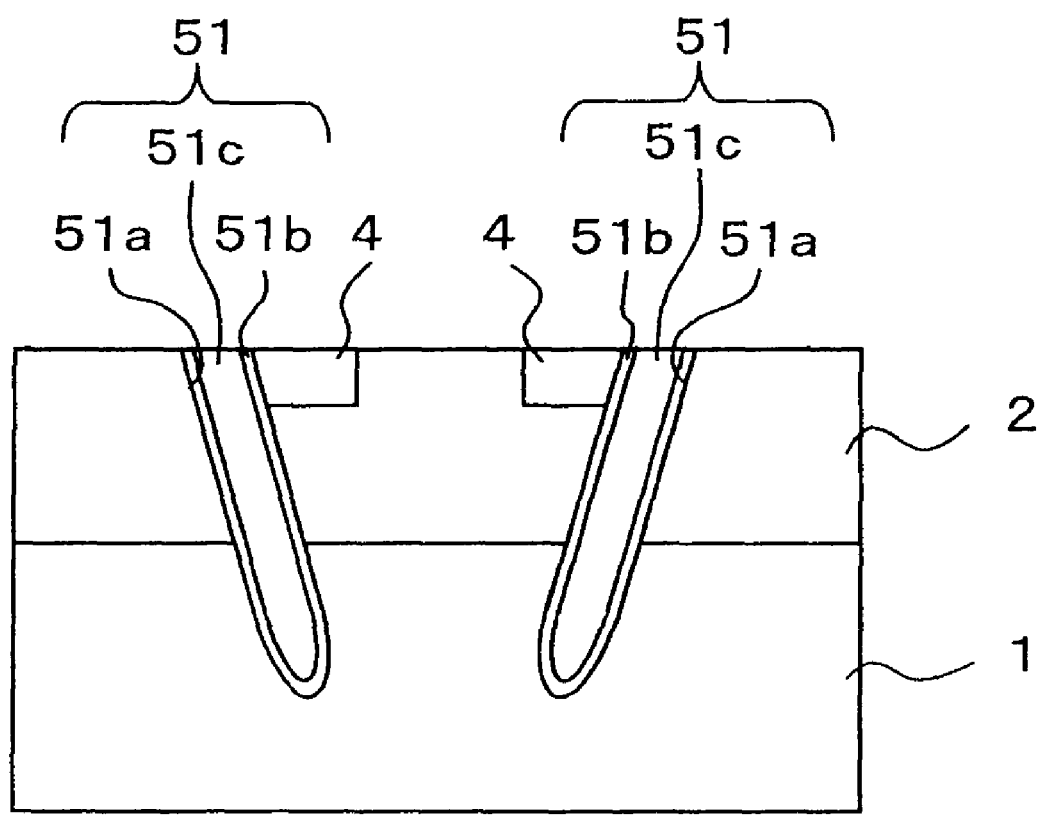
FIG. 62 is a structure diagram for explaining the method of manufacturing the trench-gate IGBT in Embodiment 5 of the present invention.

Next, as shown in FIG. 62, part of the first conductor 53, having been formed upon the top-side surfaces of the n+ emitter regions 4, the p base layer 2, and top-end part of each of subsequently remaining conductors 51c, is removed (i.e., until part of top-side surface of the p base layer 2 is uncovered). By this removal, remaining parts of the first conductor 53 are formed in each space inside the gate insulation films 51b. Note that, these remaining parts of the first conductor 53 are equivalent to gate conductors 51c. Hereinafter, the gate conductors 51c will be taken into consideration for explanatory purposes. And then, each of the trench gates 51 is constructed of each of the trenches 51a, the gate insulation films 51b, and the gate conductors 51c. Moreover, removal of the part of first conductor 53 is performed by using dry etching or planarization CMP.

Figure 63:
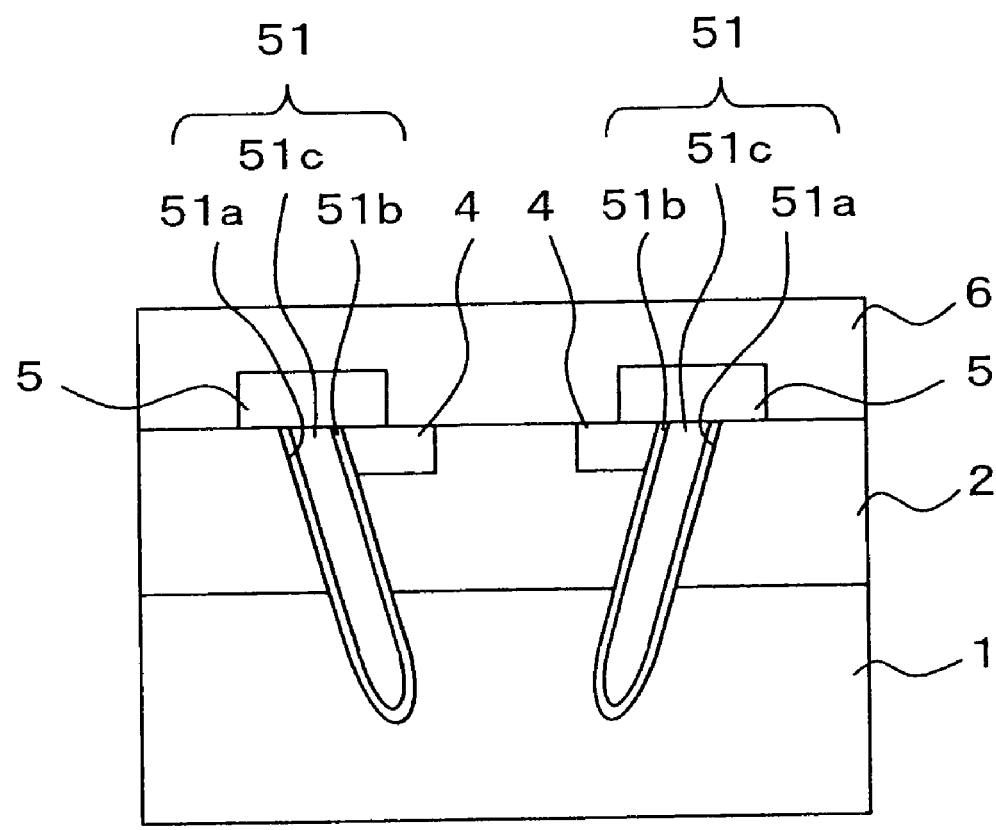
FIG. 63 is a structure diagram for explaining the method of manufacturing the trench-gate IGBT in Embodiment 5 of the present invention.

And then, upon the top-side surfaces of the n$^+$ emitter regions 4, the trench gates 51 and the p base layer 2, an interlayer insulation film (not shown in FIG. 63) is formed by CVD that is made of a silicate glass (such as borophosphosilicate glass, or BPSG) having good coverage and flatness; and subsequently, in order to uncover parts of the n$^+$ emitter regions 4 and the top-side surface of the p base layer 2, part of the interlayer insulation film is selectively removed by using dry etching so as to form interlayer insulation films 5 as shown in FIG. 63.

Moreover, in order to cover the top-side surfaces of the p base layer 2 and the n$^+$ emitter regions 4, i.e., the parts not covered with the interlayer insulation films 5, and the upper and both lateral sides of the interlayer insulation films 5, an emitter electrode 6 is formed as a first main electrode that is made of a conductive material such as aluminum. According to the structure as arranged above, the emitter electrode 6 is electrically connected with the n$^+$ emitter regions 4. Furthermore, the emitter electrode 6 is formed by using sputtering.

On the other hand, as shown in FIG. 53, a p$^+$ collector layer 7 that is a third semiconductor layer of the second conductivity type is formed in the other side of the n$^-$ layer 1 (in the "bottom" side in the figure). The p$^+$ collector layer 7 is formed by ion implantation and a heat treatment such as annealing.

And then, on the bottom-side surface of the p$^+$ collector layer 7, a collector electrode 8 is formed as a second main electrode that is made of a conductive material such as aluminum. The collector electrode 8 is formed by using sputtering.

According to the method of manufacturing described above, the trench-gate IGBT shown in FIG. 53 in Embodiment 5 comes to completion. Although the preceding figures do not show, in the method of manufacturing the trench-gate IGBT in Embodiment 5, when etching or an ion implantation is carried out, photoengraving (or photolithography) is performed, beforehand.

Furthermore, the manufacturing process has been described here as an example only; in particular, the manufacturing process is not necessarily bound by the method described above. It is therefore possible to realize other manufacturing process. It is thus acceptable only that manufacturing of the trench-gate IGBT shown in FIG. 53 finally comes to completion. For example, a process has been shown to form the p base layer 2 in the top side of the n$^-$ layer 1 by using, e.g., ion implantation; however, it may be also possible that the p base layer 2 is alternatively formed upon the n$^-$ layer 1. In addition, although the process is shown to form the p base layer 2 and the n$^+$ emitter regions 4 before forming the trench gates 51, the p base layer 2 and the n$^+$ emitter regions 4 may be formed after having formed the trench gates 51. In addition, the n$^-$ layer 1 that is an n-type substrate has been placed as the basis; however, it may be possible to use a p-type substrate for the p$^+$ collector layer 7, and the p-type substrate is placed as the basis. In this case, the n$^-$ layer 1 is formed upon the p$^+$ collector layer 7 that is made of the p-type substrate.

Next, the operations of the trench-gate IGBT in Embodiment 5 of the present invention will be explained.

When a predetermined collector voltage is applied across the emitter electrode 6 and the collector electrode 8, and a predetermined gate voltage that can bring the IGBT into an on-state is supplied across the emitter electrode 6 and the gate electrodes 51c, a channel region in the p base layer 2 is inverted into the n-type; thus, a channel is established.

Through the channel being established, electrons are injected from the emitter electrode 6 into the n$^-$ layer 1. And then, by the injected electrons, the interspace between the p$^+$ collector layer 7 and the n$^-$ layer 1 is forward-biased; thus, positive holes are injected from the p$^+$ collector layer 7. As a result, impedance of the n$^-$ layer 1 is reduced, and the amount of current flowing through the IGBT (its current-currying capability) is increased, so that the IGBT is turned into an on-state.

Moreover, in Embodiment 5, the trench gates 51 are used each having a predetermined tilt from a perpendicular with respect to the first (top-side) surface of the n$^-$ layer 1, being additionally formed with the predetermined adjacent trench gates 51 each (of whose bottom portions) tilts toward the other; and the interspace between a predetermined set of adjacent bottom portions of the trench gates 51 reaching into a location of the n$^-$ layer 1 is set narrower than any other interspace between the trench-gate parts (sections) other than the bottom portions. For these reasons, the mobility of the positive holes injected from the p$^+$ collector layer 7 is restricted, so that the positive holes are accumulated between the predetermined set of the adjacent bottom portions of the trench gates 51, and in their proximities. And then, by these accumulated positive holes, the amount of supplied electrons injected, through the channel, from the emitter electrode 6 into the n$^-$ layer 1 increases, so that the impedance thereof decreases. As a result, in comparison to conventional power devices, it is possible to reduce the on-state voltage and power loss of the trench-gate IGBT.

Next, the operations of the trench-gate IGBT turning from the on-state to an off-state will be explained as follows. When in the on-state, a gate voltage applied across the emitter electrode 6 and the gate electrodes 51c is set at zero or biased at a reverse voltage so as to change the IGBT into the off-state, the channel region inverted into the n-type returns into the p-type; thus, the electron injection from the emitter electrode 6 stops. Because the electron injection stops, the positive-hole injection from the p$^+$ collector layer 7 also stops. Subsequently, the electrons and the positive holes accumulated in the n$^-$ layer 1 cease to exist by either passing through to the collector electrode 8 and the emitter electrode 6, respectively, or by mutual recombination.

Moreover, according to Embodiment 5, it is shown that the p$^+$ collector layer 7 is formed on the second main surface of the n$^-$ layer 1; however, as shown in FIG. 18, similarly to Embodiment 1, between the n$^-$ layer 1 and the p$^+$ collector layer 7, an n$^+$ buffer layer 18 that is a fourth semiconductor layer of the first conductivity type may be formed. The p$^+$ buffer layer 18 is formed by ion implantation and a heat treatment such as annealing.

Moreover, according to Embodiment 5, it is shown that the p base layer 2 is formed upon the first main surface of the n$^-$ layer 1; however, as described similarly in Embodiment 1, between the n$^-$ layer 1 and the p base layer 2, an n layer that is the first conductivity type may be formed, and the first semiconductor layer of the first conductivity type is constructed by adding the n layer to the n$^-$ layer 1. Before forming the p base layer 2, upon the n$^-$ layer 1, the n layer is formed as an amorphous silicon layer by using CVD, or as an epitaxial layer. In a case of the amorphous silicon layer, its mono-crystalline layer is obtained by a heat treatment. And then, the p base layer 2 is formed in the top side of the n layer by ion implantation and annealing.

In addition, according to Embodiment 5, it is shown that the n$^+$ emitter regions 4 are selectively provided in the top side of the p base layer 2, on the lateral side of each of the trenches 51a each (of whose bottom portions) tilts toward the other, contiguously bordering the trench gates 51. However, the n⁺ emitter regions 4 may be provided contiguously bordering on both the lateral sides of the trench gates 51 each.

Furthermore, in Embodiment 5, similarly to the arrangement of Embodiment 1 as shown in FIG. 19, it may be possible to construct in such a way that the interlayer insulation films 5 each are provided to cover each of the n⁺ emitter regions 4, each top side of the trench gates 51, and part of the top-side surface of the p base layer 2; the interspace between a predetermined set of adjacent n⁺ emitter regions 4 is bridged with the n⁺ emitter connection region 19 that has been selectively provided in the top side of the p base layer 2; then, the n⁺ emitter connection region 19 is electrically connected to the emitter electrode 6.

In Embodiment 1 through Embodiment 5, the trench-gate structures have been described in that each enables reducing an on-state voltage and power loss of the trench-gate IGBT. It is also possible to apply the trench-gate structures each to a planar IGBT so as to reduce the on-state voltage and power loss of the planar IGBT. More particularly, in a case of a high withstand-voltage semiconductor module (for example, more than 2 kV rating) that utilizes a plurality of semiconductor unit-cells or chips (such as IGBTs) with high withstand-voltage ratings connected in parallel one another, in order to avoid breakdown of the semiconductor module owing to concentration of on-state currents or difficulty in current flow in part of semiconductor unit-cells or chips, reducing variation in current-carrying capability for each unit-cell or chip is demanded. From this viewpoint, in comparison to the trench-gate IGBT, the planar IGBT can reduce the variation because of its inherent structure. In technical application fields where high withstand-voltage semiconductor modules are used, the planar IGBT also has obtained wide popularity in usage, it is therefore very useful to apply the trench-gate structures in the present invention to the planar IGBT. Hereinafter, planar-type IGBTs applying the trench-gate structures according to the present invention will be explained.

Embodiment 6

Figure 64:
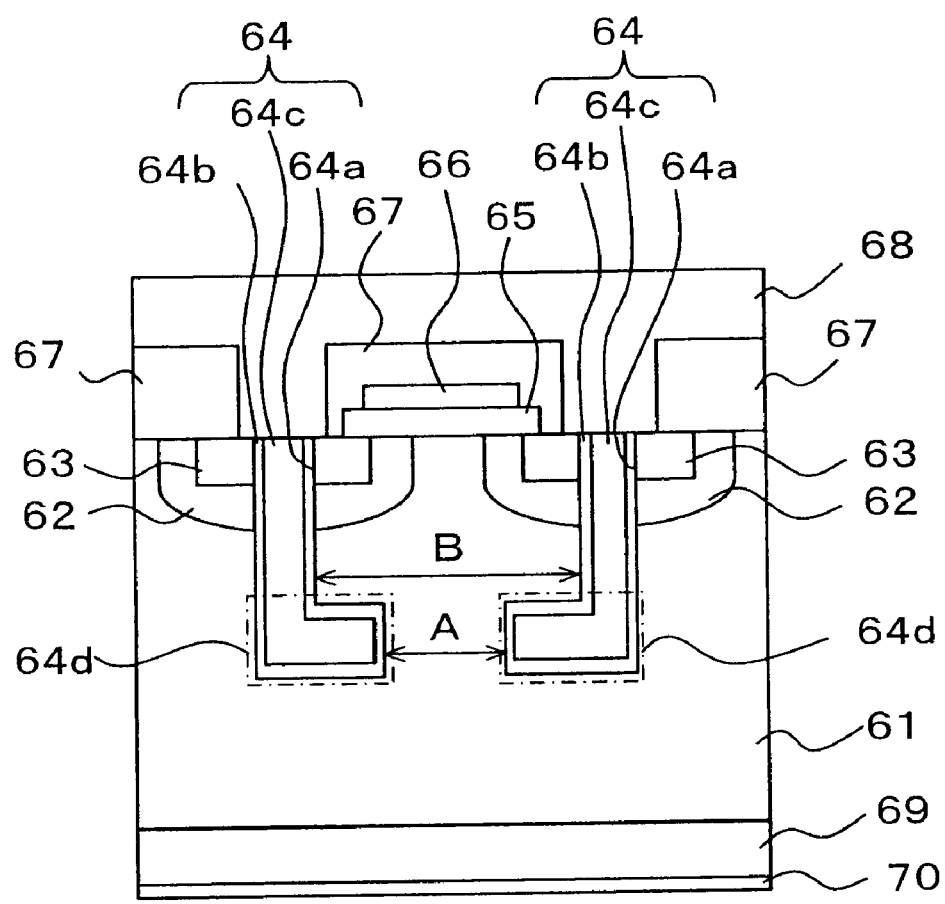
FIG. 64 is a cross-sectional view outlining a structure of a planar IGBT that is a power semiconductor device in Embodiment 6 of the present invention.

Hereafter, Embodiment 6 of the present invention will be explained based on the drawings. FIG. 64 is a cross-sectional view outlining a structure of a planar IGBT that is a power semiconductor device in Embodiment 6 of the present invention. In FIG. 64, the planar IGBT is structured in that, a set or pairs of p base regions 62 that are first semiconductor regions of a second conductivity type are selectively provided in a first main-surface side (namely, in the "top side" in the figure) of an n⁻ layer 61 that is a first semiconductor layer of a first conductivity type. In addition, a set or pairs of n⁺ emitter regions 63 that are second semiconductor regions of the first conductivity type are selectively provided in the top side of the p base regions 62.

And then, a set or a pair of L-shaped emitter trenches 64 are provided, each having trenches 64*a* that pass from the top side of the n⁺ emitter regions 63 through into the n⁻ layer 61; gate insulation films 64*b* that are made of an oxide film and provided to cover the inner surface of the trenches 64*a*; and in addition, trench electrodes 64*c* that are provided with which each space inside surrounded by the gate insulation films 64*b* is filled. The structure of the L-shaped emitter trenches 64 corresponds to that of the L-shaped trench gates 3 described in Embodiment 1 that are constructed of the trenches 3*a*, the gate insulation films 3*b*, and the gate electrodes 3*c*, respectively. Each of the L-shaped emitter trenches 64 is provided, from the top side surface of the n⁺ emitter regions 63, contiguously bordering on both lateral sides of the n⁺ emitter regions 63 and the p base regions 62 each, perpendicularly with respect to the first main surface of the n⁻ layer 61, to reach into a location of the n⁻ layer 61; at the lower ends of each of the emitter trenches 64, bottom portions 64*d* are provided to unilaterally extend a predetermined length in one direction parallel to the first main surface of the n⁻ layer 61. In addition, an arrangement is made so that the extending end of one of the bottom portions 64*d* of the pair of L-shaped emitter trenches 64 opposes that of the other bottom portion of the pair of the L-shaped emitter trenches 64, on the extending side of the bottom portions 64*d*. Because of the arrangement, the interspace between a pair of predetermined adjacent bottom portions 64*d* of L-shaped emitter trenches 64 (the width indicated by the symbol "A" in the figure) is set narrower than any other interspace between the emitter-trench parts (sections) that are perpendicularly formed with respect to the first main surface of the n⁻ layer 61 (the width indicated by the symbol "B" in the figure).

In addition, at the inner top-side under which the bottom portions 64*d* of the L-shaped emitter trenches 64 extend, upon the top-side surfaces of the n⁻ layer 61, the p base regions 62, and part of the n⁺ emitter regions 63, a gate insulation film 65 is provided. Upon the gate insulation film 65, a gate electrode 66 is provided. And then, one of interlayer insulation films 67 is provided to cover the upper and both lateral sides of the gate electrode 66, parts of the gate insulation film 65, and a large part of the inner top-side of the n⁺ emitter regions 63. Another interlayer insulation films 67 are similarly provided so as to cover both outer parts of the top side under which the bottom portions 64*d* of the L-shaped emitter trenches 64 do not extend; although, the gate electrode 66 and the gate insulation film 65 are not provided thereon.

Moreover, an emitter electrode 68 that is a first main electrode is provided to cover parts of the n⁺ emitter regions 63 upon which the interlayer insulation films 67 are not provided, the upper and lateral sides of the interlayer insulation films 67, and each top side of the L-shaped emitter trenches 64.

On the other hand, a p⁺ collector layer 69 that is a second semiconductor layer of the second conductivity type is provided on a second main surface (namely, the "bottom-side" surface in the figure) of the n⁻ layer 61; in addition, a collector electrode 70 that is a second main electrode is provided on the bottom-side surface of the p⁺ collector layer 69.

Next, a method of manufacturing the planar IGBT shown in FIG. 64 will be explained by referring to FIG. 65 through FIG. 69.

Figure 65:
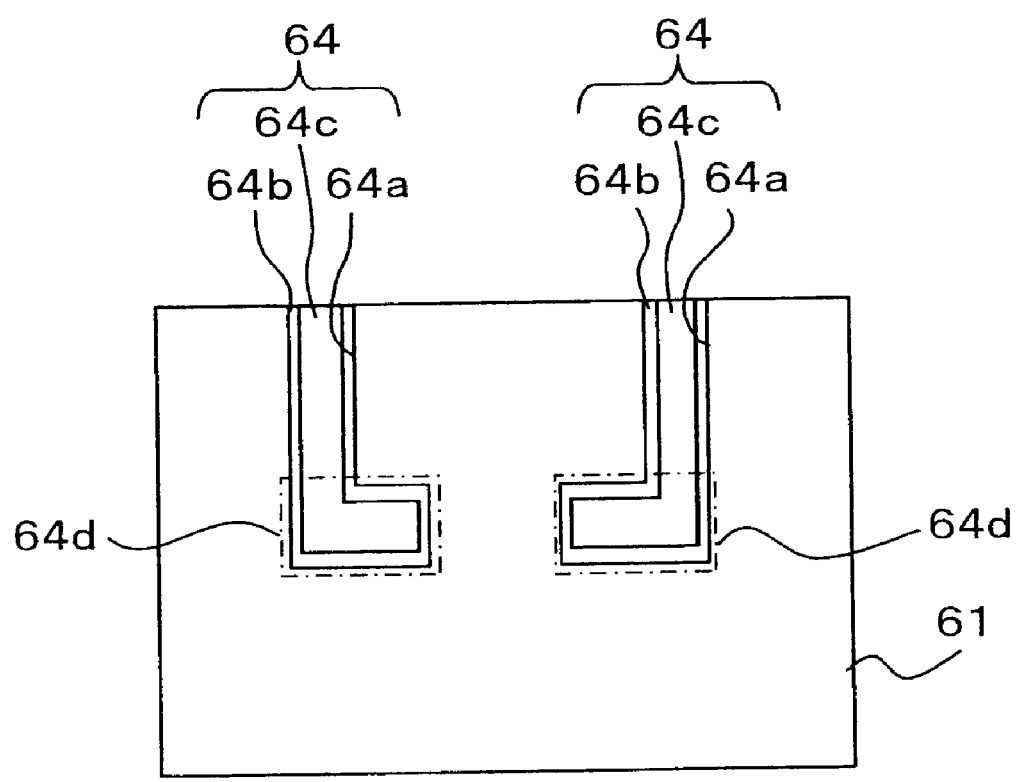
FIG. 65 is a structure diagram for explaining a method of manufacturing the planar IGBT in Embodiment 6 of the present invention.

In the first place, the structure shown in FIG. 65 is equivalent to that shown in FIG. 15 in Embodiment 1. Because the structure is identical to that having been obtained by the method of manufacturing shown in FIG. 2 through FIG. 15 in Embodiment 1, the explanation having led to the same structure is omitted. Hereafter, the method of manufacturing that proceeds will be explained.

Figure 66:
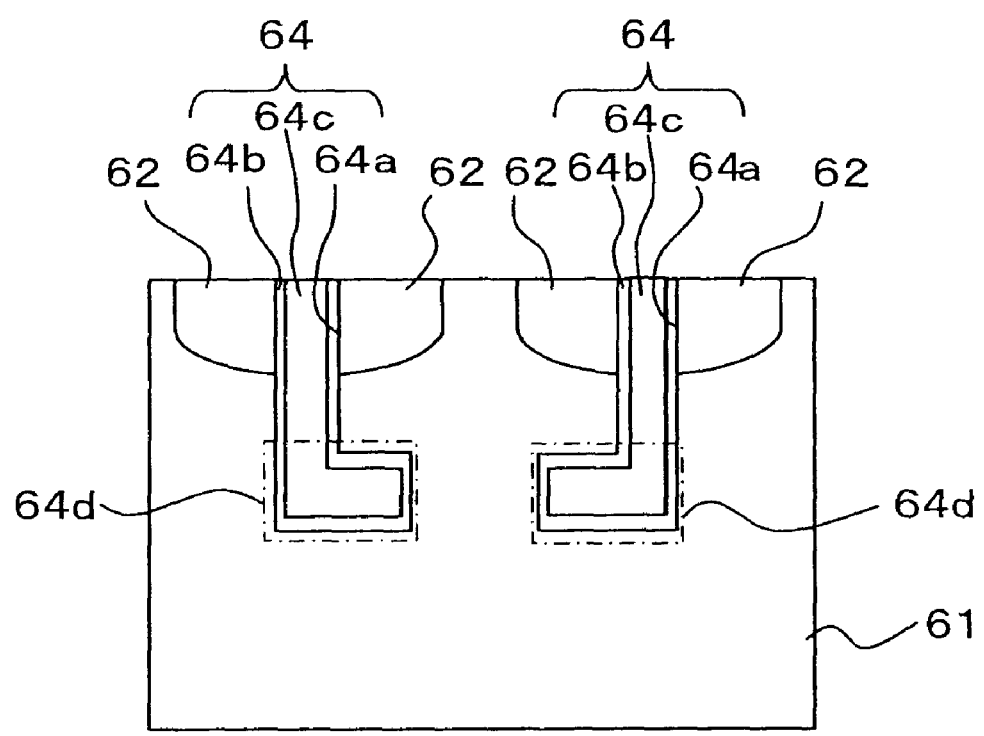
FIG. 66 is a structure diagram for explaining the method of manufacturing the planar IGBT in Embodiment 6 of the present invention.

After having formed a set or a pair of L-shaped emitter trenches 64 shown in FIG. 65 (that are equivalent to the L-shaped trench gates 3 in Embodiment 1), as shown in FIG. 66, in the top side of an n⁻ layer 61 that is a first semiconductor layer of a first conductivity type, contiguously bordering on both lateral sides of the L-shaped emitter trenches 64 each, p base regions 62 that are first semiconductor regions of a second conductivity type are selectively provided. The p base regions 62 are formed by ion implantation and a heat treatment such as annealing.

Figure 67:
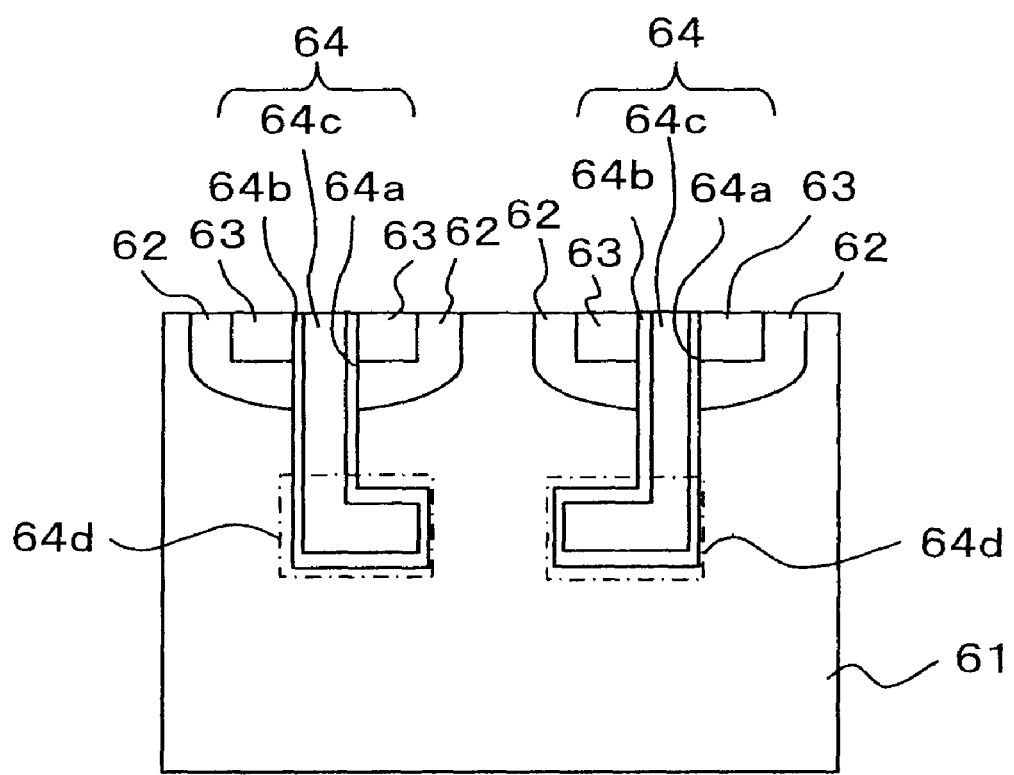
FIG. 67 is a structure diagram for explaining the method of manufacturing the planar IGBT in Embodiment 6 of the present invention.

Next, as shown in FIG. 67, in the top side of the p base regions 62, n⁺ emitter regions 63 that are second semiconductor regions of the first conductivity type are selectively formed contiguously bordering on both the lateral sides of the L-shaped emitter trenches 64 each. The n+ emitter regions 63 are formed by ion implantation and a heat treatment such as annealing.

Figure 68:
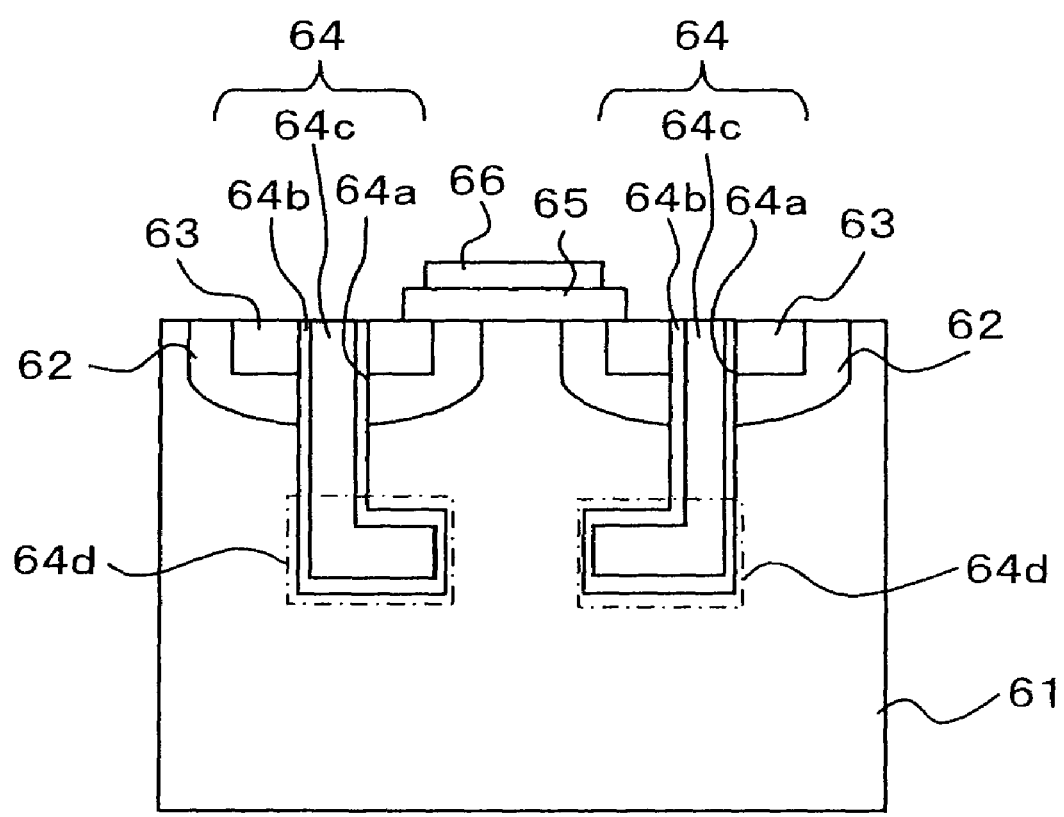
FIG. 68 is a structure diagram for explaining the method of manufacturing the planar IGBT in Embodiment 6 of the present invention.

Next, as shown in FIG. 68, at the inner top-side under which the bottom portions 64d of the L-shaped emitter trenches 64 extend, upon the top-side surfaces of the n− layer 61, the p base regions 62, and part of the n+ emitter regions 63, a gate insulation film 65 is formed. After having once formed an oxide film entirely upon the top-side surface of the n− layer 61 by using thermal oxidation or CVD, the gate insulation film 65 is then formed by removal of unnecessary parts of the oxide film by using dry etching.

And then, upon the gate insulation film 65, a gate electrode 66 is formed of a conductive material such as polycrystalline silicon (polysilicon). After having once formed a polysilicon film entirely upon the top-side surfaces of the n- layer 61 and the gate insulation film 65 by using CVD, the gate electrode 66 is formed by removal of unnecessary parts of the polysilicon film by using dry etching.

Figure 69:
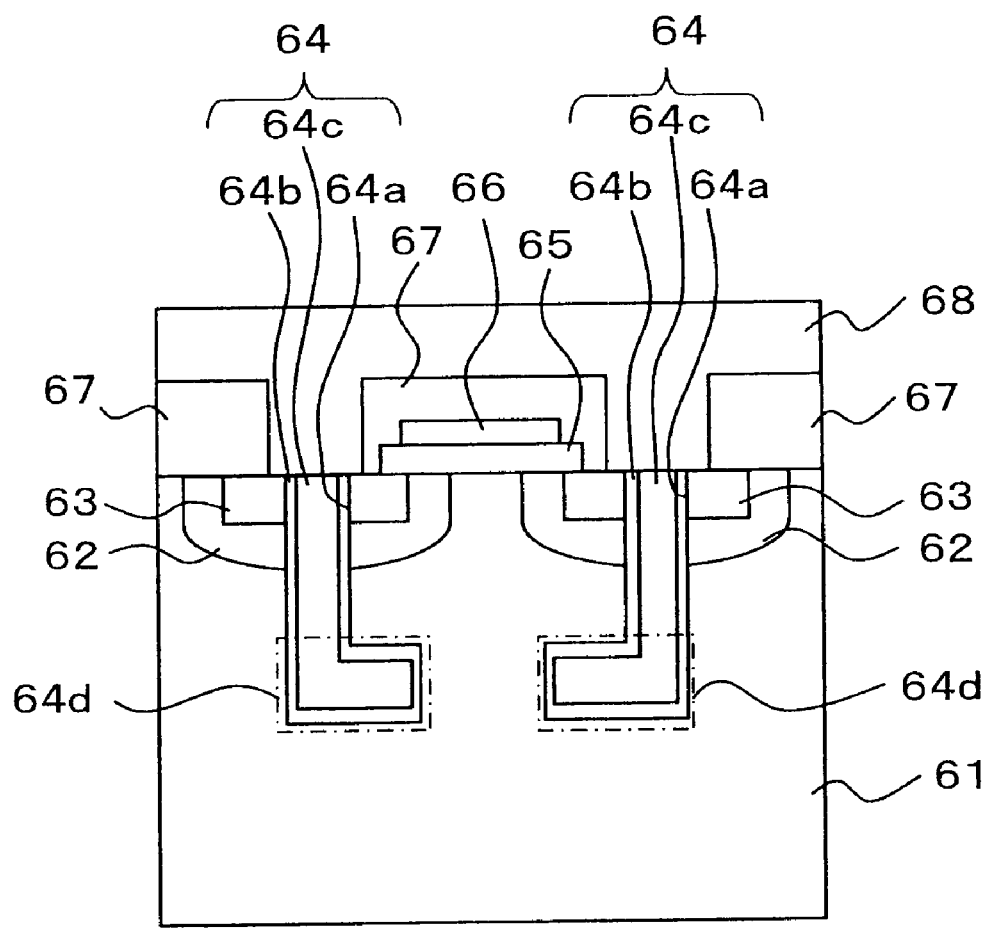
FIG. 69 is a structure diagram for explaining the method of manufacturing the planar IGBT in Embodiment 6 of the present invention.

Next, as shown in FIG. 69, at the inner top-side under which the bottom portions 64d of the L-shaped emitter trenches 64 extend, one of interlayer insulation films 67 is provided to cover the upper and both lateral sides of the gate electrode 66, parts of the gate insulation film 65, and a large part of the top side of each of the n+ emitter regions 63; and, at both outer parts of the top side under which the bottom portions 64d of the L-shaped emitter trenches 64 do not extend, another interlayer insulation films 67 are provided to cover part of the top-side surface of the n− layer 61, part of the top side of p base regions 62, and a large part of the top side of each of the n+ emitter regions 63. The interlayer insulation films 67 are made of a silicate glass (such as borophosphosilicate glass, or BPSG) having good coverage and flatness. After having once formed an insulation film entirely upon the top-side surfaces of the n− layer 61, the p base regions 62, and part of the n+ emitter regions 63 by using CVD, the interlayer insulation films 67 are formed by removal of unnecessary parts of the insulation film by using etching, so that parts of the top-side surfaces of the n+ emitter regions 63 and each top side of the L-shaped emitter trenches 64 are uncovered.

And then, an emitter electrode 68 that is a first main electrode made of a conductive material such as aluminum is formed to cover each top side of the L-shaped emitter trenches 64, uncovered parts of the n+ emitter regions 63, and the upper and lateral sides of the interlayer insulation films 67. According to the structure as arranged above, the emitter electrode 6 is electrically connected with the n+ emitter regions 63 and trench electrodes 64c of the L-shaped emitter trenches 64. Moreover, the emitter electrode 68 is formed by using sputtering.

On the other hand, as shown in FIG. 64, a p+ collector layer 69 that is a second semiconductor layer of the second conductivity type is formed in the other side of the n− layer 61 (in the "bottom" side in the figure). The p+ collector layer 69 is formed by ion implantation and a heat treatment such as annealing.

And then, on the bottom-side surface of the p+ collector layer 69, a collector electrode 70 that is a second main electrode made of a conductive material such as aluminum is formed. The collector electrode 70 is formed by using sputtering.

According to the method of manufacturing described above, the planar IGBT shown in FIG. 64 in Embodiment 6 comes to completion. Although the preceding figures do not show, in the method of manufacturing the planar IGBT in Embodiment 6, when etching or an ion implantation is carried out, photoengraving (or photolithography) is performed, beforehand.

Furthermore, the manufacturing process has been described here as an example only; in particular, the manufacturing process is not necessarily bound by the method described above. It is therefore possible to realize other manufacturing process. In addition, although the process is shown to form the p base regions 62 and the n+ emitter regions 63 after having formed the L-shaped emitter trenches 64, the L-shaped emitter trenches 64 may be formed after having formed the p base regions 62 and the n+ emitter regions 63. In addition, the n− layer 61 that is an n-type substrate has been placed as the basis; however, it may be possible to use a p-type substrate for the p+ collector layer 69, and the p-type substrate is placed as the basis. In this case, the n− layer 61 is formed upon the p+ collector layer 69 that is made of the p-type substrate.

Next, the operations of the planar IGBT in Embodiment 6 of the present invention will be explained.

When a predetermined collector voltage is applied across the emitter electrode 68 and the collector electrode 70, and a predetermined gate voltage that can bring the IGBT into an on-state is supplied across the emitter electrode 68 and the gate electrode 66, a channel region in the p base regions 62 is inverted into the n-type; thus, a channel is established. Moreover, at this moment, the same magnitude of the voltage with the emitter electrode 68 is applied to the trench electrodes 64c of the L-shaped emitter trenches 64. Because of these, leakage currents that appear in the interface between the trenches and their silicon surroundings are reduced; therefore, it is also not a case in which a leakage-current characteristic of the planar IGBT in Embodiment 6 is, in comparison, inferior to conventional planar IGBTs.

Next, through the channel being established, electrons are injected from the emitter electrode 68 into the n− layer 61. And then, by the injected electrons, the interspace between the p+ collector layer 69 and the n− layer 61 is forward-biased; thus, positive holes are injected from the p+ collector layer 69. As a result, impedance of the n− layer 61 is reduced, and the amount of current flowing through the IGBT (its current-currying capability) is increased, so that the IGBT is turned into an on-state.

Moreover, in Embodiment 6, similarly to Embodiment 1, in the directions parallel to the first main surface of the n− layer 61, a set of L-shaped emitter trenches 64, having their bottom portions 64d each unilaterally extended a predetermined length, are used; and in addition, a predetermined set of adjacent bottom portions 64d of the L-shaped emitter trenches 64 opposes each other at the protruding ends, and the interspace between the extended bottom portions 64d is set narrower than any other interspace between the emitter trenches that are perpendicularly formed with respect to the first main surface of the n− layer 61. For these reasons, the mobility of the positive holes injected from the p+ collector layer 69 is restricted, so that the positive holes are accumulated between the predetermined set of the adjacent bottom portions 64d of the L-shaped emitter trenches 64, and in their proximities. And then, by these accumulated positive holes, the amount of supplied electrons injected, through the channel, from the emitter electrode 68 into the n− layer 61 increases, so that the impedance thereof decreases. As a result, in comparison to conventional power devices, it is possible to reduce the on-state voltage and power loss of the planar IGBT.

Next, the operations of the planar IGBT turning from the on-state to an off-state will be explained as follows. When in the on-state, a gate voltage applied across the emitter electrode 68 and the gate electrode 66 is set at zero or biased at a reverse voltage so as to change the IGBT into the off-state, the channel region inverted into the n-type returns into the p-type; thus, the electron injection from the emitter electrode 68 stops. Because the electron injection stops, the positive-hole injection from the $p^+$ collector layer 69 also stops. Subsequently, the electrons and the positive holes accumulated in the $n^-$ layer 61 cease to exist by either passing through to the collector electrode 70 and the emitter electrode 68, respectively, or by mutual recombination.

Moreover, according to Embodiment 6, it is shown that the $p^+$ collector layer 69 is formed on the second main surface of the $n^-$ layer 61; however, as shown in FIG. 18, similarly to Embodiment 1, between the $n^-$ layer 61 and the $p^+$ collector layer 69, an $n^+$ buffer layer that is a third semiconductor layer of the first conductivity type may be formed. The $n^+$ buffer layer is formed by ion implantation and a heat treatment such as annealing.

In addition, according to Embodiment 6, it is shown that the p base regions 62 and the $n^+$ emitter regions 63 are formed contiguously bordering on the lateral sides of the L-shaped emitter trenches 64. However, it is not necessary to form on both the sides with the p base regions 62 and the $n^+$ emitter regions 63, particularly; they may be formed at least on the lateral side of each of the L-shaped emitter trenches 64 from which bottom portions 64d extend.

Furthermore, according to Embodiment 6, at the inner topside under which the bottom portions 64d of the L-shaped emitter trenches 64 extend, the gate insulation film 65 and the gate electrode 66 are provided. However, an arrangement may be further carried out so that identical gate insulation films and gate electrodes each are provided at both the outer top-sides under which the bottom portions 64d of the L-shaped emitter trenches 64 do not extend.

Embodiment 7

Figure 70:
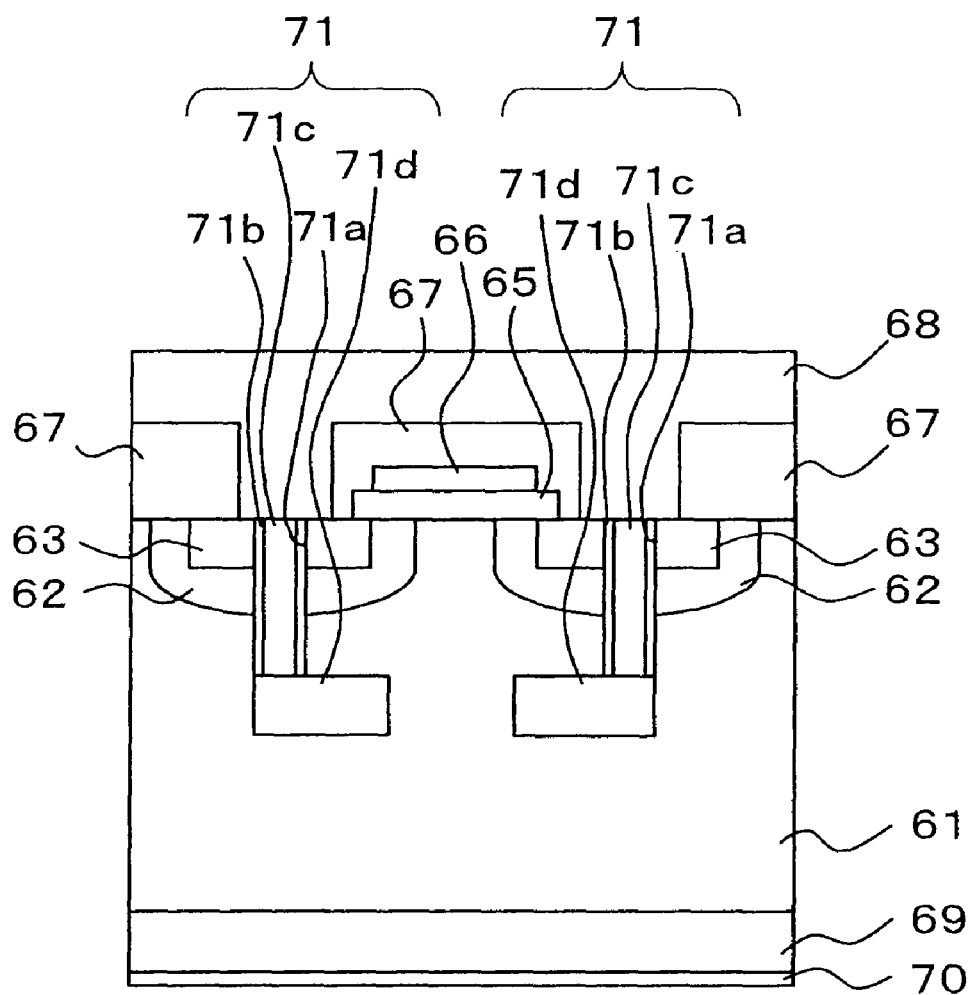
FIG. 70 is a cross-sectional view outlining a structure of a planar IGBT that is a power semiconductor device in Embodiment 7 of the present invention.

According to Embodiment 6, it has been explained that the L-shaped emitter trenches 64, equivalent to the structure of the L-shaped trench gates 3 described in Embodiment 1, are applied to the planar IGBT. However, as shown in FIG. 70, an arrangement may also be made so that the L-shaped emitter trenches 64 are replaced by L-shaped emitter trenches 71 that are equivalent to the L-shaped trench gates 21 described in Embodiment 2. In this case, the structure of the L-shaped emitter trenches 71 constructed of trenches 71a, trench insulation films 71b, trench electrodes 71c, and bottom portions 71d, corresponds to that of the L-shaped trench gates 21 described in Embodiment 2 that are constructed of the trenches 21a, the gate insulation films 21b, the gate electrodes 21c, and the bottom portions 21d, respectively. According to Embodiment 7, it is possible to obtain the equivalent operations and effects to the Embodiment 6. In addition, in comparison to Embodiment 6, there exists an effect of further simplifying a manufacturing process. In implementing a method of manufacturing, the method can be obtained by combining the methods of manufacturing explained in Embodiment 2 and Embodiment 6. Moreover, among those reference numerals and symbols shown in FIG. 70 in Embodiment 7, the same reference numerals and symbols designate the same items as or items corresponding to those shown in FIG. 64 in Embodiment 6.

Embodiment 8

Figure 71:
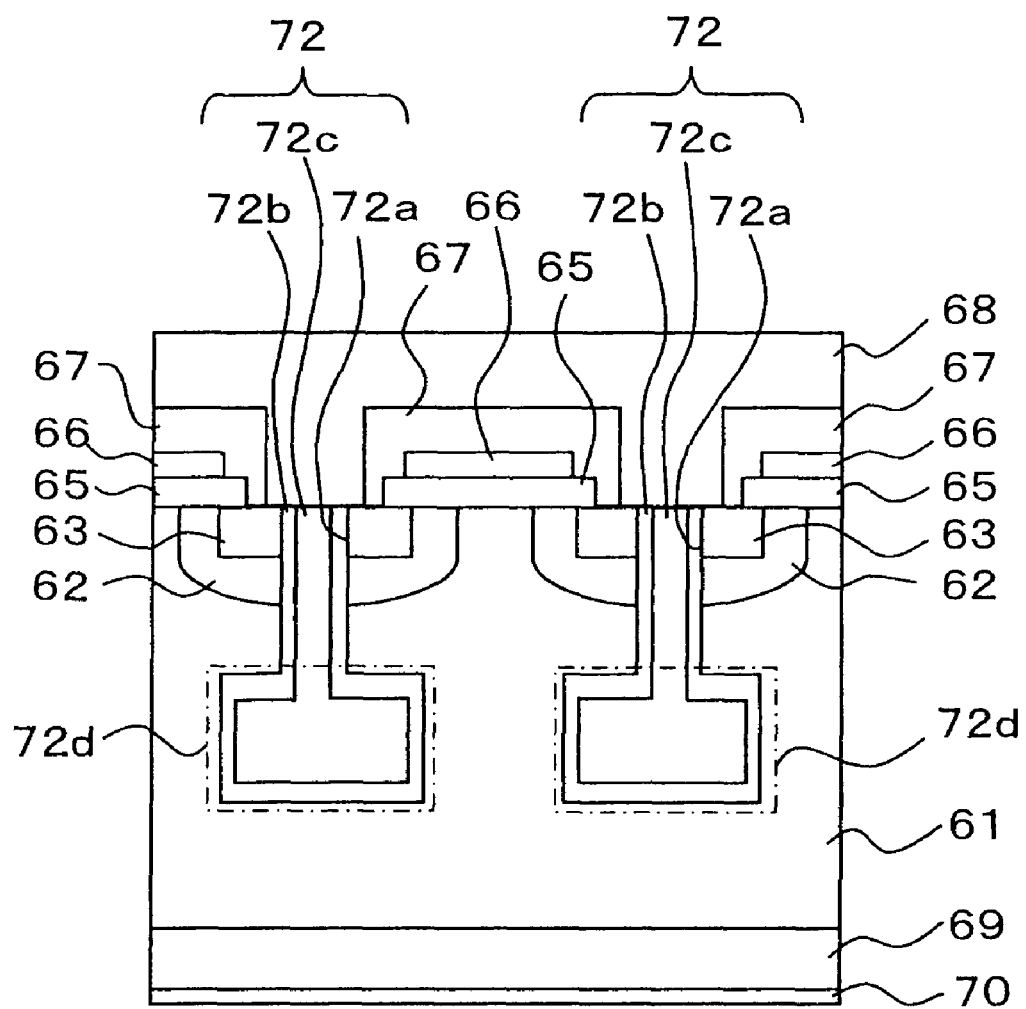
FIG. 71 is a cross-sectional view outlining a structure of a planar IGBT that is a power semiconductor device in Embodiment 8 of the present invention.

According to Embodiment 6, it has been explained that the L-shaped emitter trenches 64, equivalent to the structure of the L-shaped trench gates 3 described in Embodiment 1, are applied to the planar IGBT. However, as shown in FIG. 71, an arrangement may also be made so that the L-shaped emitter trenches 64 are replaced by T-shaped emitter trenches 72 that are equivalent to the T-shaped trench gates 31 described in Embodiment 3. In this case, the structure of the T-shaped emitter trenches 72 constructed of trenches 72a, trench insulation films 72b, and trench electrodes 72c, corresponds to that of the T-shaped trench gates 31 described in Embodiment 3 that are constructed of the trenches 31a, the gate insulation films 31b, and the gate electrodes 31c, respectively. In addition, in Embodiment 8, the p base regions 62 and the $n^+$ emitter regions 63 each are provided contiguously bordering on both the sides of the T-shaped emitter trenches 72. In addition, gate insulation (oxide) films 65 and gate electrodes 66 are provided in the top side of the $n^-$ layer 61, the p base regions 62, and part of the $n^+$ emitter regions 63 on both the sides of the T-shaped emitter trenches 72. According to Embodiment 8, it is possible to obtain the equivalent operations and effects to the Embodiment 6. In implementing a method of manufacturing, the method can be obtained by combining the methods of manufacturing explained in Embodiment 3 and Embodiment 6. Moreover, among those reference numerals and symbols shown in FIG. 71 in Embodiment 8, the same reference numerals and symbols designate the same items as or items corresponding to those shown in FIG. 64. in Embodiment 6.

Embodiment 9

Figure 72:
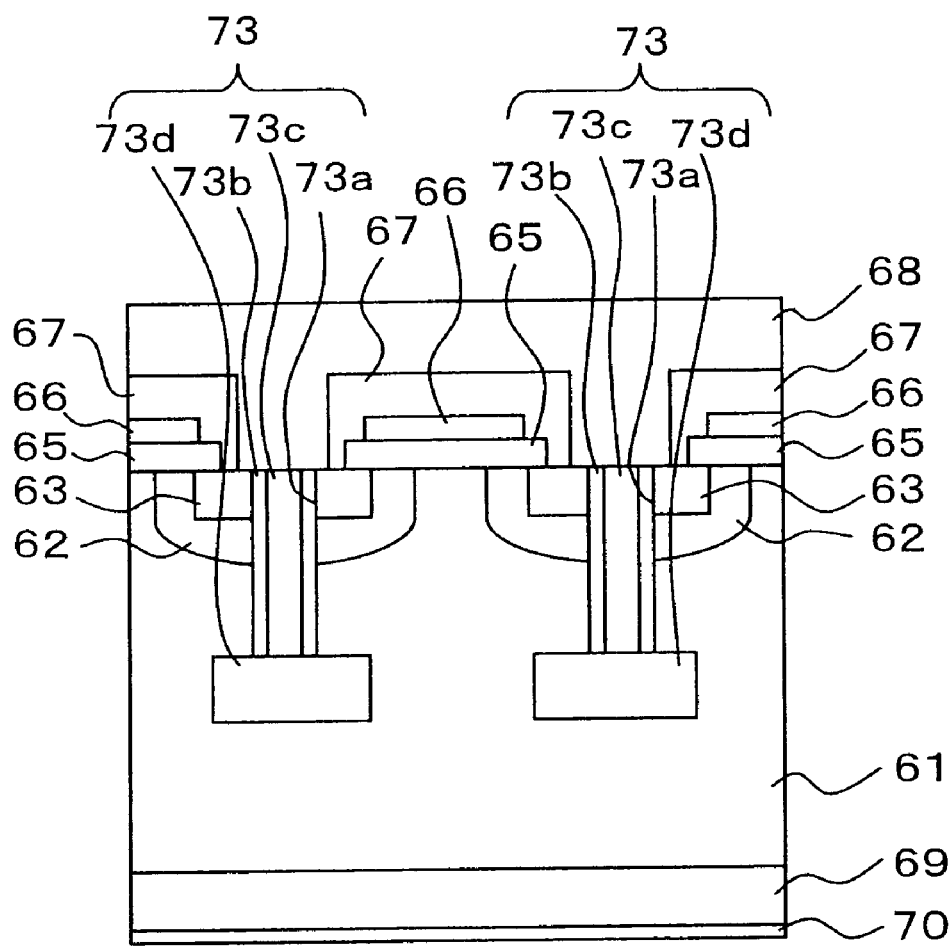
FIG. 72 is a cross-sectional view outlining a structure of a planar IGBT that is a power semiconductor device in Embodiment 9 of the present invention.
Figure 73:
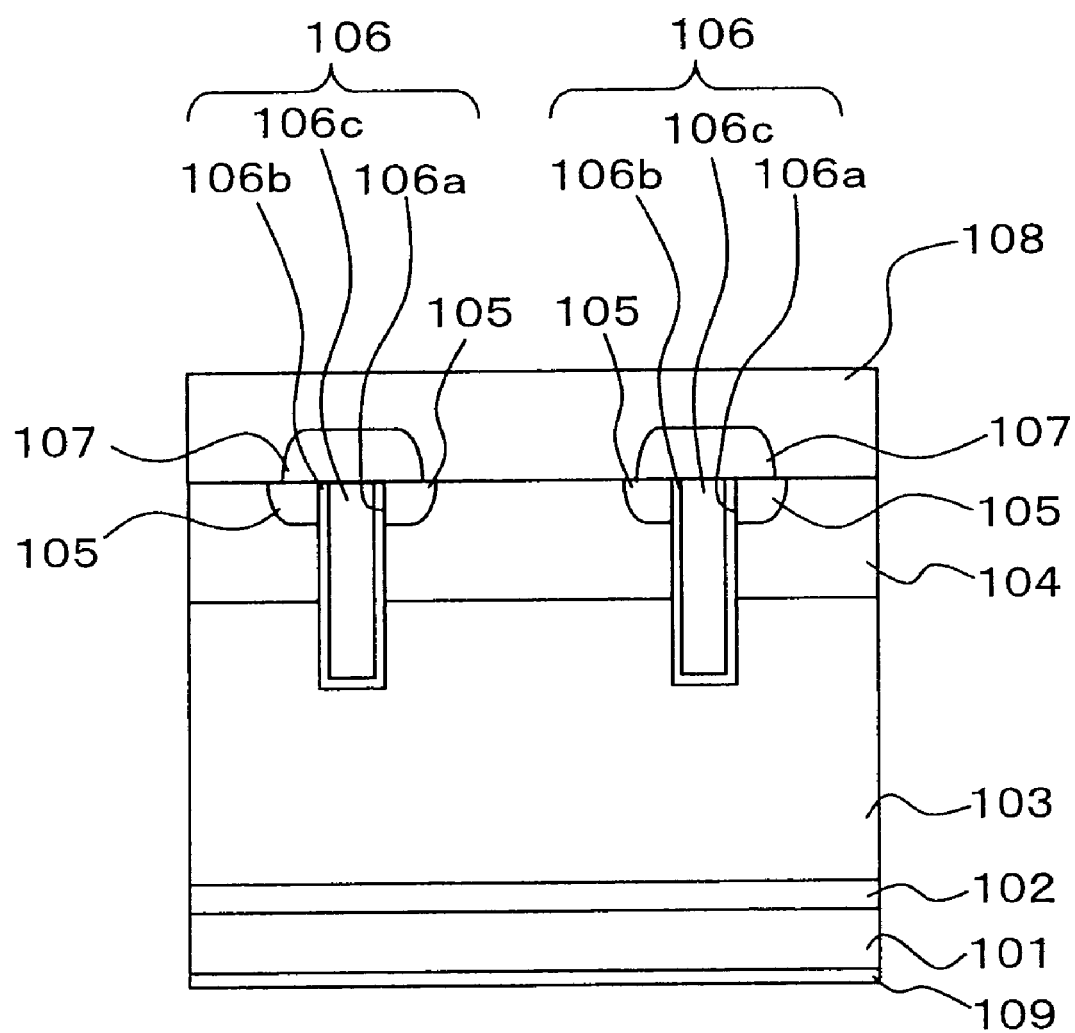
FIG. 73 is a vertically cross-sectional view outlining a structure of a trench-gate IGBT that is a conventional power semiconductor device.

According to Embodiment 8, it has been explained that the T-shaped emitter trenches 72, equivalent to the structure of the T-shaped trench gates 31 described in Embodiment 3, are applied to the planar IGBT. However, as shown in FIG. 72, an arrangement may also be made so that the L-shaped emitter trenches 64 are replaced by T-shaped emitter trenches 73 that are equivalent to the T-shaped trench gates 41 described in Embodiment 4. In this case, the structure of the T-shaped emitter trenches 73 constructed of trenches 73a, trench insulation films 73b, trench electrodes 73c, and bottom portions 73d, corresponds to that of the T-shaped trench gates 41 described in Embodiment 4 that are constructed of the trenches 41a, the gate insulation films 41b, the gate electrodes 41c, and the bottom portions 41d, respectively. In addition, in Embodiment 9, similarly to Embodiment 8, the p base regions 62 and the $n^+$ emitter regions 63 each are provided contiguously bordering on both the sides of the T-shaped emitter trenches 73. In addition, gate insulation (oxide) films 65 and gate electrodes 66 are provided in the top side of the $n^-$ layer 61, the p base regions 62, and part of the $n^+$ emitter regions 63 on both the sides of the T-shaped emitter trenches 73. According to Embodiment 9, it is possible to obtain the equivalent operations and effects to the Embodiment 6. In addition, in comparison to Embodiment 8, there exists an effect of further simplifying a manufacturing process. In implementing a method of manufacturing, the method can be obtained by combining the methods of manufacturing explained in Embodiment 2, Embodiment 3, and Embodiment 6. Moreover, among those reference numerals and symbols shown in FIG. 72 in Embodiment 9, the same reference numerals and symbols designate the same items as or items corresponding to those shown in FIG. 64 in Embodiment 6.

Furthermore, according to Embodiment 6 through Embodiment 9, emitter trenches are constructed having trenches, trench insulation films, and trench electrodes. However, the emitter trenches may be made of a dielectric material such as an oxide. In comparison to conventional power devices, it is possible to obtain an effect by reducing the on-state voltage and power loss of the planar IGBTs. There exists an additional effect of further simplifying a manufacturing process.

While the present invention has been shown and described in detail, the foregoing description is in all aspects illustrative and not restrictive. It is therefore understood that numerous modifications and variations can be realized without departing from the scope of the invention.

What is claimed is:

1. A method of manufacturing a power semiconductor device, the method comprising the steps of:
   on one side of a silicon substrate, being a base first semiconductor layer of a first conductivity type, selectively forming first trenches;
   forming first insulation films lining the inner surfaces of the first trenches;
   forming first conductors filling the first-insulation-film-lined first trenches;
   forming second insulation films on the first insulation films and the first conductors;
   forming a formed first semiconductor layer of the first conductivity type added onto said base first semiconductor layer of the first conductivity type and the second insulation films;
   forming second trenches, from the top side of the formed first semiconductor layer of the first conductivity type, perpendicularly with respect to said one side, with outer-side surfaces of the second trenches approximately coinciding with outer-side surfaces of predetermined adjacent pairs of the first trenches, and reaching through to locations on the second insulation films;
   forming third insulation films lining the inner surfaces of the second trenches;
   removing the second insulation films and the third insulation films where they are located on the underside of the second trenches;
   forming second conductors filling the second-insulation-film-lined and third-insulation-film-lined second trenches;
   forming a second semiconductor layer of a second conductivity type on the top side of the formed first semiconductor layer of the first conductivity type;
   selectively forming first semiconductor regions, of the first conductivity type, in the top side of the second semiconductor layer of the second conductivity type, at least located along orientations where the first trenches extend out with respect to the second trenches, and contiguously bordering on the second trenches;
   forming a first main electrode on the second semiconductor layer of the second conductivity type, electrically connected to the first semiconductor regions of the first conductivity type;
   forming a third semiconductor layer of the second conductivity type on the side of said base first semiconductor layer of the first conductivity type opposite said one side thereof; and
   forming a second main electrode on the third semiconductor layer of the second conductivity type.

* * * * *